United States Patent
Hatakeyama

(10) Patent No.: US 9,316,909 B2
(45) Date of Patent: *Apr. 19, 2016

(54) PATTERNING PROCESS

(75) Inventor: Jun Hatakeyama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 297 days.

This patent is subject to a terminal disclaimer.

(21) Appl. No.: 13/179,171

(22) Filed: Jul. 8, 2011

(65) Prior Publication Data

US 2012/0009529 A1    Jan. 12, 2012

(30) Foreign Application Priority Data

Jul. 8, 2010   (JP) .................... 2010-155682

(51) Int. Cl.
*G03F 7/32*   (2006.01)
*G03F 7/039*   (2006.01)
*G03F 7/20*   (2006.01)

(52) U.S. Cl.
CPC ............ *G03F 7/0397* (2013.01); *G03F 7/2041* (2013.01); *G03F 7/325* (2013.01)

(58) Field of Classification Search
USPC .................................................. 430/325, 330
See application file for complete search history.

(56) References Cited

U.S. PATENT DOCUMENTS

| 6,448,420 | B1 | 9/2002 | Kinsho et al. | |
|---|---|---|---|---|
| 7,122,291 | B2* | 10/2006 | Padmanaban et al. | 430/270.1 |
| 7,514,197 | B2 | 4/2009 | Ochiai et al. | |
| 7,514,204 | B2 | 4/2009 | Hatakeyama et al. | |
| 7,537,880 | B2 | 5/2009 | Harada et al. | |
| 7,598,016 | B2 | 10/2009 | Kobayashi et al. | |
| 7,622,242 | B2 | 11/2009 | Hatakeyama et al. | |
| 7,642,034 | B2 | 1/2010 | Hatakeyama et al. | |
| 7,670,750 | B2 | 3/2010 | Harada et al. | |
| 7,759,047 | B2 | 7/2010 | Hatakeyama et al. | |
| 7,771,913 | B2 | 8/2010 | Kaneko et al. | |
| 8,216,774 | B2* | 7/2012 | Hatakeyama | 430/323 |
| 2002/0064726 | A1* | 5/2002 | Mitsumoto | 430/156 |
| 2007/0003867 | A1 | 1/2007 | Hatakeyama et al. | |
| 2008/0090172 | A1 | 4/2008 | Hatakeyama et al. | |
| 2008/0318171 | A1 | 12/2008 | Tsubaki | |
| 2009/0011365 | A1 | 1/2009 | Kobayashi et al. | |
| 2009/0042147 | A1 | 2/2009 | Tsubaki | |
| 2009/0239746 | A1* | 9/2009 | Aihara | 503/200 |
| 2009/0280434 | A1 | 11/2009 | Harada et al. | |
| 2009/0297979 | A1* | 12/2009 | Hatakeyama et al. | 430/270.1 |
| 2010/0040972 | A1 | 2/2010 | Tarutani et al. | |
| 2010/0203457 | A1* | 8/2010 | Hatakeyama | 430/326 |
| 2010/0330507 | A1 | 12/2010 | Tsubaki et al. | |

FOREIGN PATENT DOCUMENTS

| JP | 3790649 | B2 | 6/2006 |
|---|---|---|---|
| JP | 2007-025634 | A | 2/2007 |
| JP | 2007-297590 | A | 11/2007 |
| JP | 2008-003569 | A | 1/2008 |
| JP | 2008-081716 | A | 4/2008 |
| JP | 2008-107443 | A | 5/2008 |
| JP | 2008-111089 | A | 5/2008 |
| JP | 2008-111103 | A | 5/2008 |
| JP | 2008-122932 | A | 5/2008 |
| JP | 2008-239918 | A | 10/2008 |
| JP | 2008-281974 | A | 11/2008 |
| JP | 2008-281975 | A | 11/2008 |
| JP | 2008-281980 | A | 11/2008 |
| JP | 2008-309878 | A | 12/2008 |
| JP | 2008-309879 | A | 12/2008 |
| JP | 2009-025707 | A | 2/2009 |
| JP | 2009-025723 | A | 2/2009 |
| JP | 2009-031767 | A | 2/2009 |
| JP | 2009-053657 | A | 3/2009 |
| JP | 2009-098638 | A | 5/2009 |
| JP | 2009-276363 | A | 11/2009 |
| JP | 4445860 | B2 | 4/2010 |

OTHER PUBLICATIONS

Nakamura, Hiroko et al., "Contact Hole Formation by Multiple Exposure Technique in Ultra-low k1 Lithography", Proc. of SPIE, 2004, p. 255-263, vol. 5377.

Nakao, Shuji et al., "0.12mm Hole Pattern Formation by KrF Lithography for Giga Bit DRAM", IEDM Tech. Digest, 1996, p. 61-64.

Owe-Yang, D.C. et al., "Double exposure for the contact layer of the 65-nm node", Proc. of SPIE, 2004, p. 171-180, vol. 5753.

Truffert, V. et al., "Ultimate contact hole resolution using immersion lithography with line/space imaging", Proc. of SPIE, 2009, vol. 7274.

* cited by examiner

*Primary Examiner* — Daborah Chacko Davis

(74) *Attorney, Agent, or Firm* — Westerman, Hattori, Daniels & Adrian, LLP

(57) ABSTRACT

A pattern is formed by applying a resist composition comprising a (meth)acrylate copolymer comprising both recurring units having an acid labile group-substituted carboxyl group and recurring units having a lactone ring, an acid generator, and an organic solvent onto a substrate, prebaking the composition to form a resist film, exposing the resist film to high-energy radiation, baking, and developing the exposed film with a developer. The developer comprises at least 40 wt % of an organic solvent selected from methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

12 Claims, 11 Drawing Sheets

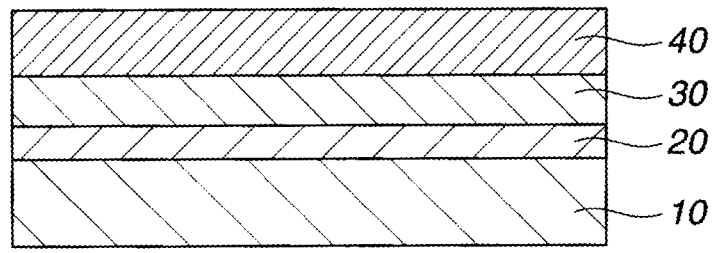
FIG.1A PHOTORESIST COATING
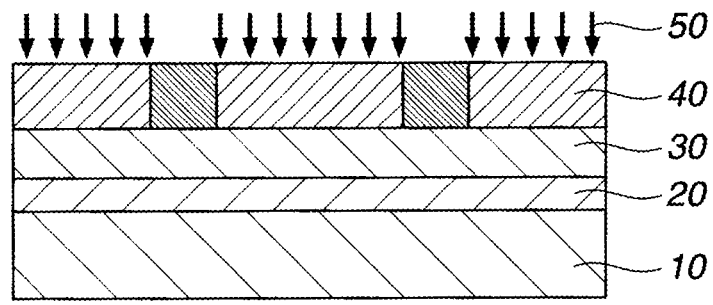
FIG.1B PHOTORESIST EXPOSURE
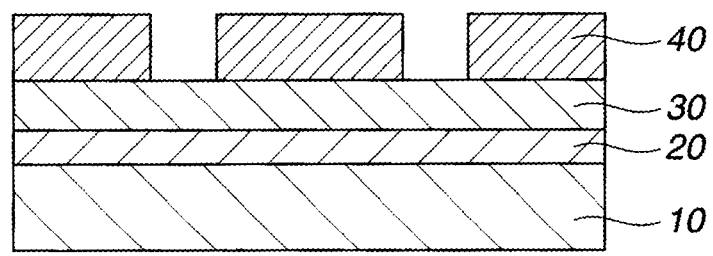
FIG.1C ORGANIC SOLVENT DEVELOPMENT

PATTERNING PROCESS

CROSS-REFERENCE TO RELATED APPLICATION

This non-provisional application claims priority under 35 U.S.C. §119(a) on Patent Application No. 2010-155682 filed in Japan on Jul. 8, 2010, the entire contents of which are hereby incorporated by reference.

TECHNICAL FIELD

This invention relates to a pattern forming process involving exposure of resist film, deprotection reaction with the aid of acid and heat, and development with an organic solvent to form a negative tone pattern in which the unexposed region is dissolved and the exposed region is not dissolved.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 µm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the development of $F_2$ lithography was stopped and instead, the ArF immersion lithography was introduced.

In the ArF immersion lithography, the space between the projection lens and the wafer is filled with water having a refractive index of 1.44. The partial fill system is compliant with high-speed scanning and when combined with a lens having a NA of 1.3, enables mass production of 45-nm node devices.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized edge roughness of resist film, defect-free MoSi laminate mask, reduced aberration of reflection mirror, and the like.

Another candidate for the 32-nm node lithography is high refractive index liquid immersion lithography. The development of this technology was stopped because LUAG, a high refractive index lens candidate had a low transmittance and the refractive index of liquid did not reach the goal of 1.8.

The process that now draws attention under the above-discussed circumstances is a double patterning process involving a first set of exposure and development to form a first pattern and a second set of exposure and development to form a pattern between the first pattern features. A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

As compared with the line pattern, the hole pattern is difficult to reduce the feature size. In order for the prior art method to form fine holes, an attempt is made to form fine holes by under-exposure of a positive resist film combined with a hole pattern mask. This, however, results in the exposure margin being extremely narrowed. It is then proposed to form holes of greater size, followed by thermal flow or RELACS® method to shrink the holes as developed. However, there is a problem that control accuracy becomes lower as the pattern size after development and the size after shrinkage differ greater and the quantity of shrinkage is greater. With the hole shrinking method, the hole size can be shrunk, but the pitch cannot be narrowed.

It is then proposed in Proc. SPIE, Vol. 5377, p. 255 (2004) that a pattern of X-direction lines is formed in a positive resist film using dipole illumination, the resist pattern is cured, another resist material is coated thereon, and a pattern of Y-direction lines is formed in the other resist film using dipole illumination, leaving a grid line pattern, spaces of which provide a hole pattern. Although a hole pattern can be formed at a wide margin by combining X and Y lines and using dipole illumination featuring a high contrast, it is difficult to etch vertically staged line patterns at a high dimensional accuracy. It is proposed in IEEE IEDM Tech. Digest 61 (1996) to form a hole pattern by exposure of a negative resist film through a Levenson phase shift mask of X-direction lines combined with a Levenson phase shift mask of Y-direction lines. However, the crosslinking negative resist film has the drawback that the resolving power is low as compared with the positive resist film, because the maximum resolution of ultrafine holes is determined by the bridge margin.

A hole pattern resulting from a combination of two exposures of X- and Y-direction lines and subsequent image reversal into a negative pattern can be formed using a high-contrast line pattern of light. Thus holes having a narrow pitch and fine size can be opened as compared with the prior art. However, two exposures must be performed while exchanging the mask. Problems arise including reduced throughputs and misregistration between two exposures.

Proc. SPIE Vol. 7274, p. 72740N (2009) reports three methods for forming hole patterns via image reversal. The three methods are: method (1) involving subjecting a positive resist composition to two double-dipole exposures of X and Y lines to form a dot pattern, depositing a $SiO_2$ film thereon by LPCVD, and effecting $O_2$—RIE for reversal of dots into holes; method (2) involving forming a dot pattern by the same steps as in (1), but using a resist composition designed to turn alkali-soluble and solvent-insoluble upon heating, coating a phenol-base overcoat film thereon, effecting alkaline development for image reversal to form a hole pattern; and method (3) involving double dipole exposure of a positive resist composition and organic solvent development for image reversal to form holes. These methods have the problem associated with two exposures.

Recently a highlight is put on the organic solvent development again. It would be desirable if a very fine hole pattern, which is not achievable with the positive tone, is resolvable through negative tone exposure. To this end, a positive resist composition featuring a high resolution is subjected to organic solvent development to form a negative pattern. An attempt to double a resolution by combining two developments, alkali development and organic solvent development is under study.

As the ArF resist composition for negative tone development with organic solvent, positive ArF resist compositions of the prior art design may be used. Pattern forming processes are described in JP-A 2008-281974, 2008-281975, 2008-281980, 2009-53657, 2009-25707, and 2009-25723. These patent documents disclose resist compositions for organic solvent development comprising a copolymer of hydroxyadamantane methacrylate, a copolymer of norbornane lactone methacrylate, a copolymer of methacrylate having acidic groups including carboxyl, sulfo, phenol, thiol and other groups substituted by two or more acid labile groups, and a copolymer of methacrylate having a cyclic acid-stable group ester, and pattern forming processes using the same.

Further, JP-A 2008-309878 discloses a process for forming a pattern through organic solvent development in which a protective film is applied onto a resist film. JP-A 2008-309879 discloses a topcoatless process for forming a pattern through organic solvent development in which an additive is added to a resist composition so that the additive may segregate at the resist film surface after spin coating to provide the surface with improved water repellency.

In JP-A 2008-281974 cited above, organic solvents are used as the developer for negative tone development. The solvents described therein are polar solvents such as ketone, ester, alcohol, amide, and ether solvents, and hydrocarbon solvents. The solvents specifically illustrated therein include ketone solvents such as 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, and propylene carbonate; ester solvents such as methyl acetate, butyl acetate, ethyl acetate, isopropyl acetate, amyl acetate, propylene glycol monomethyl ether acetate (PGMEA), ethylene glycol monoethyl ether acetate, diethylene glycol monobutyl ether acetate, diethylene glycol monoethyl ether acetate, ethyl 3-ethoxypropionate, 3-methoxybutyl acetate, 3-methyl-3-methoxybutyl acetate, methyl formate, ethyl formate, butyl formate, propyl formate, ethyl lactate, butyl lactate, and propyl lactate; alcohol solvents such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol; glycol solvents such as ethylene glycol, diethylene glycol, and triethylene glycol; glycol ether solvents such as ethylene glycol monomethyl ether, propylene glycol monomethyl ether, ethylene glycol, propylene glycol, diethylene glycol monomethyl ether, triethylene glycolmonoethyl ether, methoxymethyl butanol; ether solvents such as dioxane and tetrahydrofuran as well as the foregoing glycol ether solvents; amide solvents such as N-methyl-2-pyrrolidone, N,N-dimethylacetamide, N,N-dimethylformamide, hexamethylphosphoric triamide, 1,3-dimethyl-2-imidazolidinone; and hydrocarbon solvents, for example, aromatic hydrocarbon solvents such as toluene and xylene and aliphatic hydrocarbon solvents such as pentane, hexane, octane, and decane.

Although numerous organic solvents are exemplified, not all the solvents are useful in practice. Some solvents fail to form a pattern because space regions are not dissolved therein. Some solvents cause substantial film slimming. Some solvents are unacceptable from the standpoint of safety because of their low flash point.

The formation of negative tone patterns by organic solvent development is a traditional technique. Negative tone patterns are formed from resist compositions comprising cyclized rubber, using alkenes such as xylene as the developer, and from early chemically amplified resist compositions based on poly-t-butoxycarbonyloxystyrene, using anisole as the developer. In JP 4445860, a negative tone pattern is formed by EB image writing on calix-arene and developing with n-butyl acetate or ethyl lactate.

CITATION LIST

Patent Document 1: JP-A 2008-281974
Patent Document 2: JP-A 2008-281975
Patent Document 3: JP-A 2008-281980
Patent Document 4: JP-A 2009-053657
Patent Document 5: JP-A 2009-025707
Patent Document 6: JP-A 2009-025723
Patent Document 7: JP-A 2008-309878
Patent Document 8: JP-A 2008-309879
Patent Document 9: JP 4445860
Non-Patent Document 1: Proc. SPIE Vol. 5377, p. 255 (2004)
Non-Patent Document 2: IEEE IEDM Tech. Digest 61 (1996)
Non-Patent Document 3: Proc. SPIE Vol. 7274, p. 72740N (2009)

DISCLOSURE OF INVENTION

An optimum developer featuring a high dissolution contrast and safety must be sought for before negative development can be performed with an organic solvent.

An object of the invention is to provide a pattern forming process capable of negative tone development with organic solvent by combining an appropriate resist composition with an optimum developer.

While many organic solvents are known as the developer, butyl acetate is preferred for dissolution contrast. However, since butyl acetate has a low flash point of 28° C., an explosion-proof means must be installed in order to utilize butyl acetate safely on a coater/developer system, increasing the cost of the overall system. There exists a demand for an organic solvent developer having a flash point of at least 40° C. and providing a dissolution contrast equal to or more than that of butyl acetate.

Amyl acetate of a greater carbon count than butyl acetate is advantageous for safety because of its flash point of 45° C., but the dissolution rate of unexposed regions is reduced. Amyl formate having the same carbon count as butyl acetate offers an equivalent dissolution contrast, but is more ignitable than butyl acetate because of its flash point of 25° C. Those ester solvents having a less carbon count than butyl acetate have a lower flash point and their dissolving power is so high that the resist pattern after development may be reduced in film retention in the exposed region.

Since hydroxy-substituted forms of ethylene glycol and propylene glycol such as propylene glycol monomethyl ether, propylene glycol monomethyl ether acetate, and ethylene glycol monomethyl ether, ethyl lactate, and cyclohexanone have a sufficiently high dissolving power to be used alone as the resist solvent, no resist pattern is left after development. Since alcohol solvents have so low a dissolving power relative to a resist film that they may be used as the solvent for topcoat compositions, the unexposed region is not dissolved during development, that is, the pattern space is left undissolved. It would be desirable to have a developer having a flash point of at least 40° C. and providing a high dissolution contrast.

The inventor has found that a negative tone pattern can be formed safely by combining a resist composition comprising a (meth)acrylate copolymer comprising both recurring units having an acid labile group-substituted carboxyl group and recurring units having a lactone ring, with a developer comprising at least 40% by weight of one or more solvents selected from among methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate. The formed pattern is characterized by a high dissolution contrast. Thus a fine size hole pattern can be advantageously formed.

In one aspect, the invention provides a pattern forming process comprising the steps of applying a resist composition comprising a (meth)acrylate copolymer comprising both recurring units having an acid labile group-substituted carboxyl group and recurring units having a lactone ring, an acid generator, and an organic solvent onto a substrate, heat treating the composition to form a resist film, exposing the resist film to high-energy radiation, heat treating, and developing the exposed film with a developer. The developer comprises at least 40% by weight of a solvent selected from the group consisting of methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, 2-phenylethyl acetate, and mixtures thereof.

The developer may further comprise up to 60% by weight of a solvent selected from the group consisting of 2-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, and mixtures thereof.

In a preferred embodiment, the step of exposing the resist film to high-energy radiation includes ArF immersion lithography of 193 nm wavelength or EUV lithography of 13.5 nm wavelength.

In a preferred embodiment, the developing step is to form a pattern of negative tone wherein an exposed region of film is not dissolved and an unexposed region of film is dissolved. In another preferred embodiment, the developing step is to form a trench pattern.

In a preferred embodiment, the exposure step is carried out by ArF immersion lithography of 193 nm wavelength using a halftone phase shift mask bearing a lattice-like shifter pattern, whereby a pattern of holes is formed at the intersections between gratings of the lattice-like shifter pattern after development. In a further preferred embodiment, the halftone phase shift mask bearing a lattice-like shifter pattern has a transmittance of 3 to 15%. In a further preferred embodiment, the phase shift mask used is a phase shift mask including a lattice-like first shifter having a line width equal to or less than a half pitch and a second shifter arrayed on the first shifter and consisting of lines whose on-wafer size is 2 to 30 nm thicker than the line width of the first shifter, whereby a pattern of holes is formed only where the thick shifter is arrayed. In a further preferred embodiment, the phase shift mask used is a phase shift mask including a lattice-like first shifter having a line width equal to or less than a half pitch and a second shifter arrayed on the first shifter and consisting of dots whose on-wafer size is 2 to 100 nm thicker than the line width of the first shifter, whereby a pattern of holes is formed only where the thick dot pattern is arrayed.

ADVANTAGEOUS EFFECTS OF INVENTION

Using the developer as specified herein, a process capable of forming a negative tone pattern in a safe manner is established. The developer of the invention offers a high dissolution contrast with respect to a resist composition based on a copolymer of (meth)acrylate having an acid labile group capable of controlling acid diffusion and (meth)acrylate having lactone as the adhesive group. By effecting exposure through a lattice-like mask pattern and development with the developer, a fine size hole pattern can be formed.

BRIEF DESCRIPTION OF DRAWINGS

FIG. 1 schematically illustrates in cross-sectional views the pattern forming process of the invention, FIG. 1A shows a photoresist film formed on a substrate, FIG. 1B shows the photoresist film being exposed, and FIG. 1C shows the photoresist film being developed with organic solvent.

DESCRIPTION OF EMBODIMENTS

Figure 2:
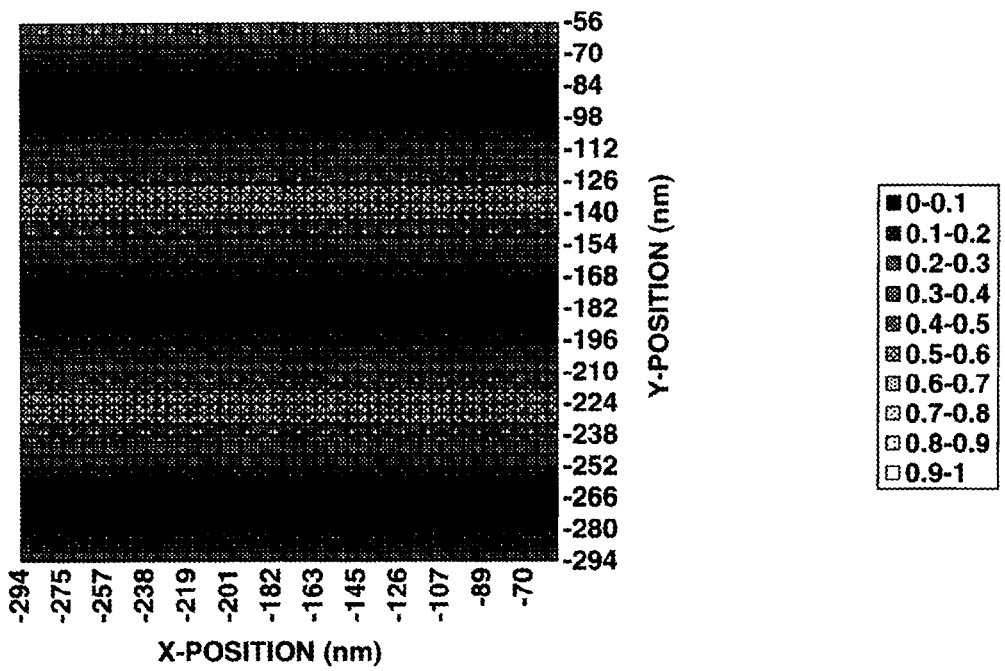
FIG. 2 is an optical image of X-direction lines having a pitch of 90 nm and a line size of 45 nm printed under conditions: ArF excimer laser of wavelength 193 nm, NA 1.3 lens, dipole illumination, 6% halftone phase shift mask, and s-polarization.

The terms "a" and "an" herein do not denote a limitation of quantity, but rather denote the presence of at least one of the referenced item.

"Optional" or "optionally" means that the subsequently described event or circumstance may or may not occur, and that the description includes instances where the event occurs and instances where it does not.

As used herein, the notation ($C_n$-$C_m$) means a group containing from n to m carbon atoms per group.

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure baking
PGMEA: propylene glycol monomethyl ether acetate The invention is directed to a process for forming a negative tone pattern. Specifically the process includes the steps of applying a resist composition based on a copolymer of (meth)acrylate having an acid labile group and (meth)acrylate having lactone as the adhesive group, onto a substrate, prebaking the composition to remove the unnecessary solvent and form a resist film, exposing the resist film to high-energy radiation, PEB, and developing the exposed film with an organic solvent developer. The developer contains at least 40% by weight of one or more solvents selected from among methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

In general, aromatic organic solvents have a high dissolving power as compared with alicyclic organic solvents. For example, methyl benzoate has the same carbon count as hexyl acetate and cyclohexyl acetate and contains one ester group, but offers an outstandingly high dissolving power. In general, aromatic organic solvents have a higher dissolving power than aliphatic solvents. The invention provides a pattern forming process characterized by use of a developer capable of meeting both the requirements of dissolving power and flash point, the developer comprising an organic solvent having one benzene ring and one ester group, specifically one or more solvents selected from among methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

When a negative pattern is formed by organic solvent development, the profile may be reversely tapered, which cause thin lines to collapse after development. Use of aromatic organic solvents advantageously prevents the profile from being reversely tapered, avoiding pattern collapse. Methyl benzoate is fully safe from the standpoint of ignition because of a flash point of 82° C. It does not evaporate off during development because of a boiling point of 199° C.

The process of the invention uses a photoresist composition based on a copolymer of (meth)acrylate having an acid labile group and (meth)acrylate having lactone as the adhesive group. The lactone-containing adhesive group used in the base polymer may have either a monocyclic structure or a bridged cyclic structure, with the latter being preferred from the standpoint of controlled acid diffusion.

The copolymer of (meth)acrylate having an acid labile group and (meth)acrylate having bridged cyclic lactone as the adhesive group may be a copolymer comprising recurring units (a) and (b) as represented by the general formula (1).

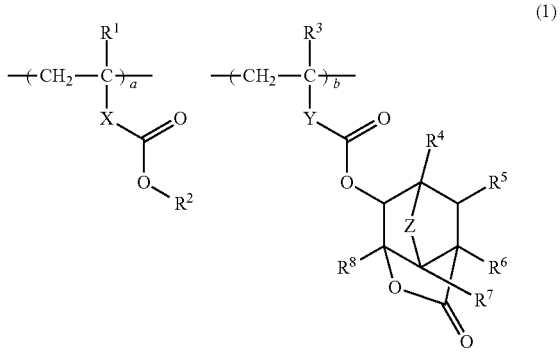

Herein $R^1$ and $R^3$ are hydrogen or methyl while they may be the same or different. $R^2$ is an acid labile group. X and Y are a single bond or —C(=O)—O—$R^9$— wherein $R^9$ is a straight, branched or cyclic $C_1$-$C_{10}$ alkylene group which may contain an ether, ester, lactone or hydroxyl group, or a naphthylene group. $R^4$, $R^6$, $R^7$, and $R^8$ are hydrogen, a straight, branched or cyclic $C_1$-$C_6$ alkyl group, trifluoromethyl group, or cyano group. $R^5$ is hydrogen, a straight, branched or cyclic $C_1$-$C_6$ alkyl group, carboxyl group, fluorine atom-substituted or unsubstituted $C_1$-$C_{12}$ alkoxycarbonyl group, or cyano group. Z is a methylene group, oxygen atom or sulfur atom. The subscripts a and b are numbers in the range: $0<a<1.0$, $0<b<1.0$, and $0<a+b\leq1.0$.

The recurring units (a) may be derived from monomers Ma having the following formula.

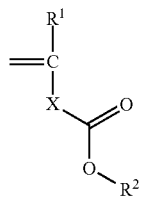

Herein $R^1$ is hydrogen or methyl, $R^2$ is an acid labile group, and X is a single bond or —C(=O)—O—$R^9$— wherein $R^9$ is a straight, branched or cyclic $C_1$-$C_{10}$ alkylene group which may contain an ether, ester, lactone or hydroxyl group, or a naphthylene group.

Examples of the monomer Ma wherein X is a different group are given below. Herein $R^1$ and $R^2$ are as defined above.

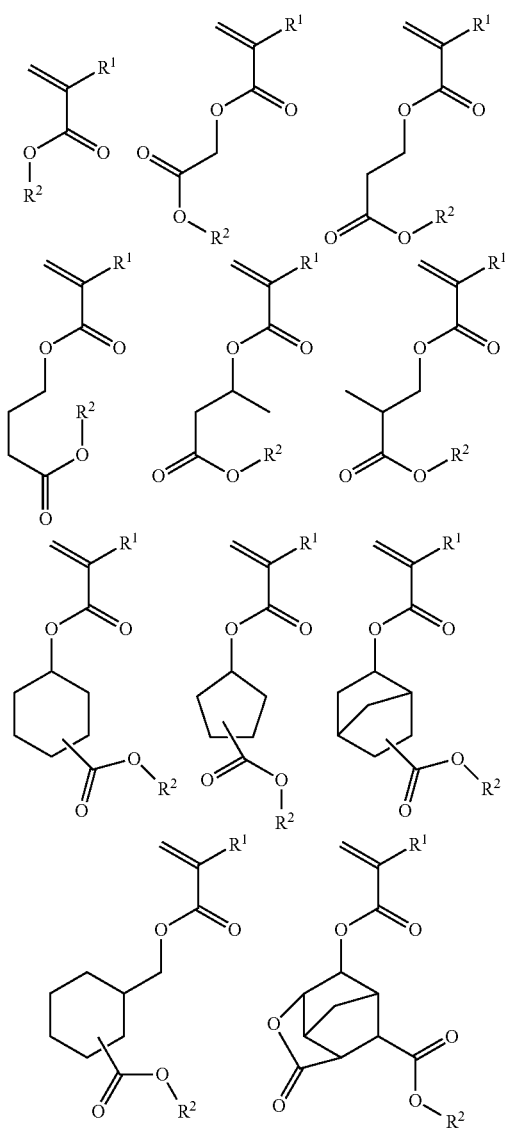
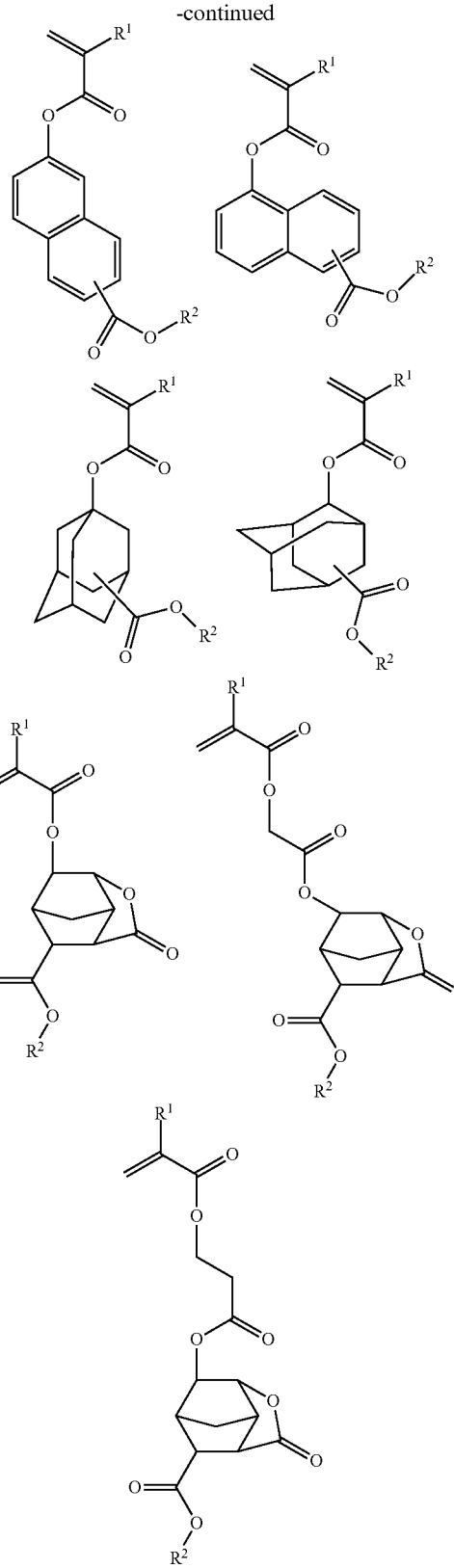

The acid labile groups represented by $R^2$ in formula (1) may be selected from a variety of such groups, typically well-known acid labile groups, specifically groups of the following formulae (AL-10) and (AL-11), tertiary alkyl groups of the following formula (AL-12), and oxoalkyl groups of 4 to 20 carbon atoms, but not limited thereto.

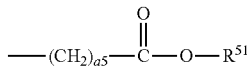
(AL-10)

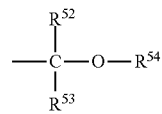
(AL-11)

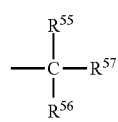
(AL-12)

In formulae (AL-10) and (AL-11), $R^{51}$ and $R^{54}$ each are a monovalent hydrocarbon group, typically straight, branched or cyclic alkyl group, of 1 to 40 carbon atoms, more specifically 1 to 20 carbon atoms, which may contain a heteroatom such as oxygen, sulfur, nitrogen or fluorine. The subscript "a5" is an integer of 0 to 10, and especially 1 to 5. $R^{52}$ and $R^{53}$ each are hydrogen or a monovalent hydrocarbon group, typically straight, branched or cyclic alkyl group, of 1 to 20 carbon atoms which may contain a heteroatom such as oxygen, sulfur, nitrogen or fluorine. Alternatively, a pair of $R^{52}$ and $R^{53}$, $R^{52}$ and $R^{54}$, or $R^{53}$ and $R^{54}$ may bond together to form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically straight, branched or cyclic alkyl group, of 1 to 20 carbon atoms which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$ may bond together to form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

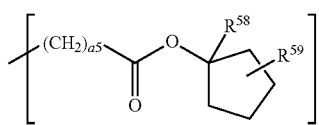
(AL-10)-1

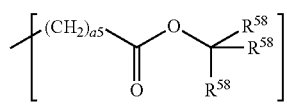
(AL-10)-2

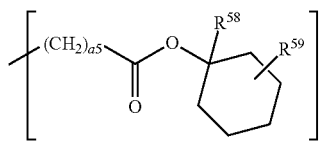
(AL-10)-3

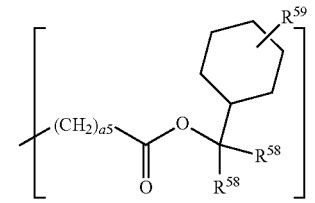
(AL-10)-4

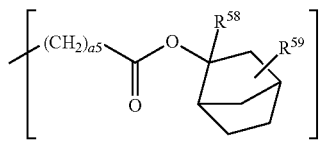
(AL-10)-5

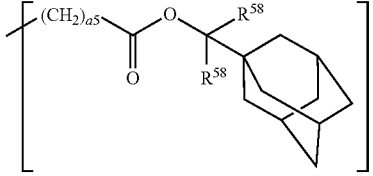
(AL-10)-6

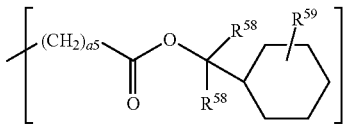
(AL-10)-7

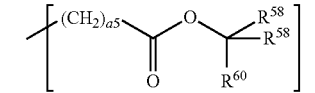
(AL-10)-8

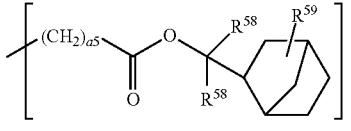
(AL-10)-9

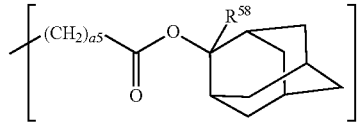
(AL-10)-10

In formulae (AL-10)-1 to (AL-10)-10, $R^{58}$ is each independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_7$-$C_{20}$ aralkyl group; and "a5" is an integer of 0 to 10.

Illustrative examples of the acetal group of formula (AL-11) include those of the following formulae (AL-11)-1 to (AL-11)-44.

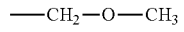
(AL-11)-1

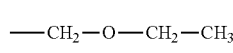
(AL-11)-2

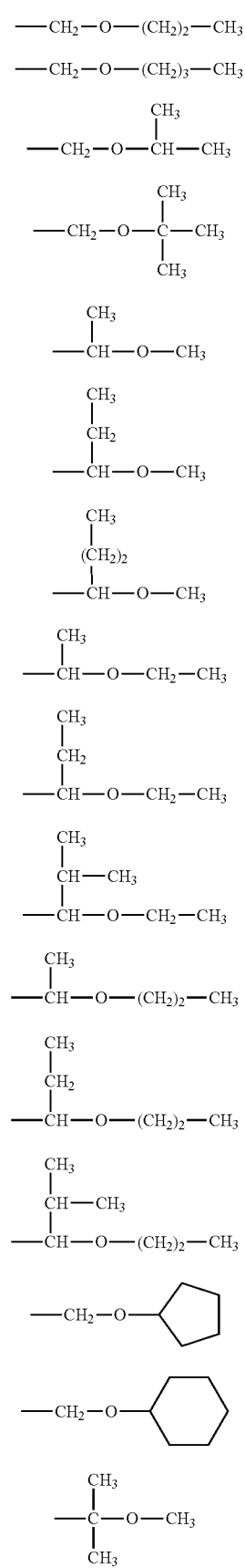
(AL-11)-3
(AL-11)-4
(AL-11)-5
(AL-11)-6
(AL-11)-7
(AL-11)-8
(AL-11)-9
(AL-11)-10
(AL-11)-11
(AL-11)-12
(AL-11)-13
(AL-11)-14
(AL-11)-15
(AL-11)-16
(AL-11)-17
(AL-11)-18
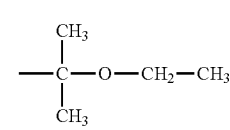
(AL-11)-19
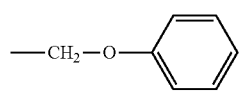
(AL-11)-20
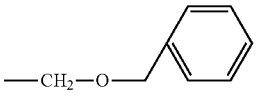
(AL-11)-21
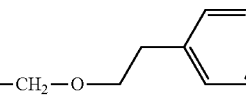
(AL-11)-22
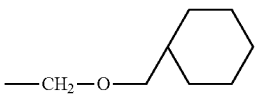
(AL-11)-23
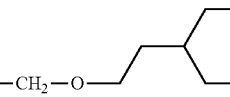
(AL-11)-24
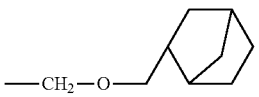
(AL-11)-25
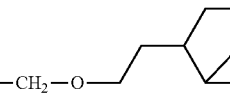
(AL-11)-26
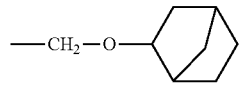
(AL-11)-27
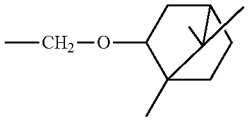
(AL-11)-28
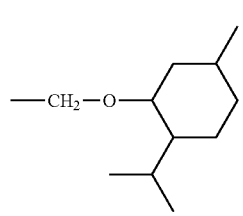
(AL-11)-29
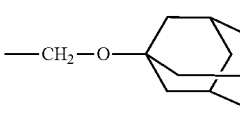
(AL-11)-30
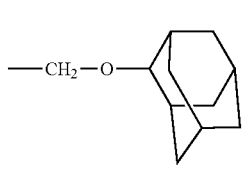
(AL-11)-31

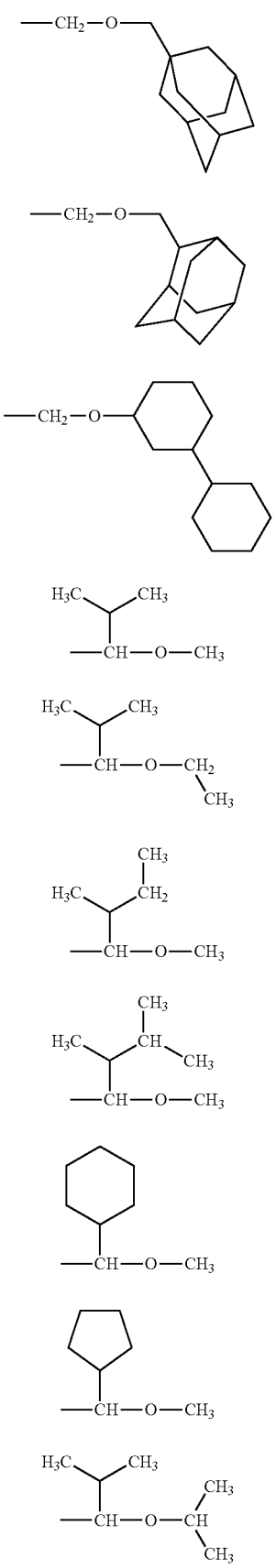

(AL-11)-32

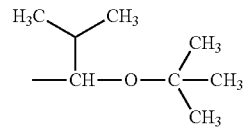
(AL-11)-42

(AL-11)-33

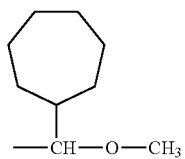
(AL-11)-43

(AL-11)-34

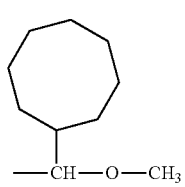
(AL-11)-44

(AL-11)-35

(AL-11)-36

(AL-11)-37

(AL-11)-38

(AL-11)-39

(AL-11)-40

(AL-11)-41

Other examples of acid labile groups include those of the following formula (AL-11a) or (AL-11b) while the polymer may be crosslinked within the molecule or between molecules with these acid labile groups.

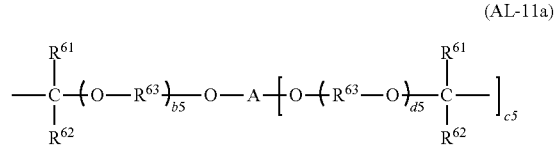
(AL-11a)

(AL-11b)

Herein $R^{61}$ and $R^{62}$ each are hydrogen or a straight, branched or cyclic $C_1$-$C_8$ alkyl group, or $R^{61}$ and $R^{62}$ may bond together to form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some of the hydrogen atoms attached to carbon atoms may be substituted by hydroxyl, carboxyl, carbonyl radicals or fluorine atoms. "B" is —CO—O—, —NHCO—O— or —NH-CONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some of the hydrogen atoms attached to carbon atoms may be substituted by hydroxyl, carboxyl, acyl radicals or halogen atoms. The subscript c5 is preferably an integer of 1 to 3.

The crosslinking acetal groups of formulae (AL-11a) and (AL-11b) are exemplified by the following formulae (AL-11-45 through (AL-11-52.

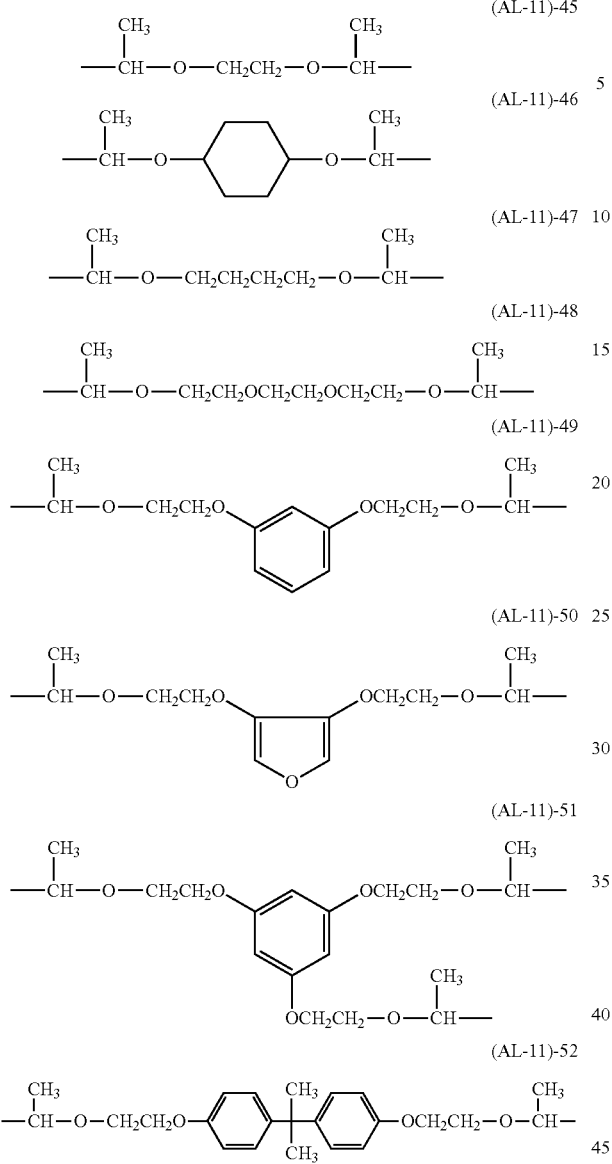
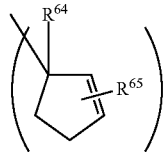
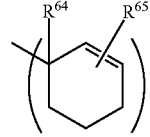
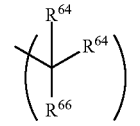
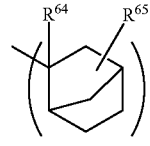
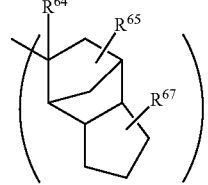
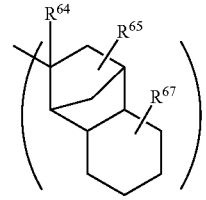
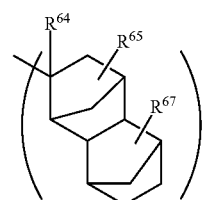
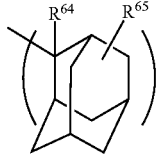
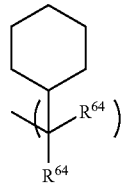
Illustrative examples of the tertiary alkyl of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.
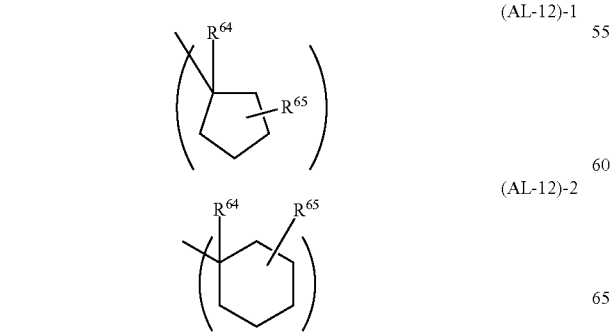

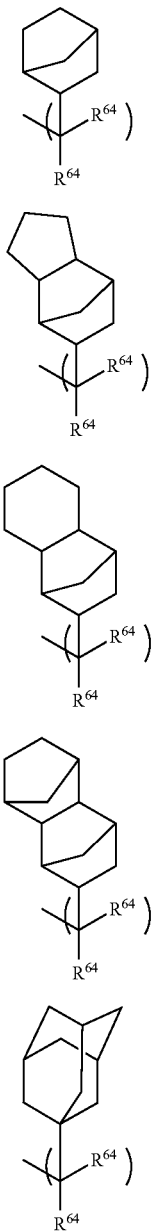

(AL-12)-12

(AL-12)-13

(AL-12)-14

(AL-12)-15

(AL-12)-16

Herein $R^{64}$ is each independently a straight, branched or cyclic $C_1$-$C_8$ alkyl group, $C_6$-$C_{20}$ aryl group or $C_7$-$C_{20}$ aralkyl group, or two $R^{64}$ groups may bond together to form a ring with the carbon atom to which they are attached, the ring being of 3 to 20 carbon atoms, specifically 4 to 16 carbon atoms, typically aliphatic ring; $R^{65}$ and $R^{67}$ each are hydrogen or a straight, branched or cyclic $C_1$-$C_{20}$ alkyl group; and $R^{66}$ is a $C_6$-$C_{20}$ aryl group or $C_7$-$C_{20}$ aralkyl group.

With acid labile groups containing $R^{68}$ representative of a di- or poly-valent alkylene or arylene group as shown by formulae (AL-12)-17 and (AL-12)-18, the polymer may be crosslinked within the molecule or between molecules. In formulae (AL-12)-17 and (AL-12)-18, $R^{64}$ is as defined above, $R^{68}$ is a straight, branched or cyclic $C_1$-$C_{20}$ alkylene group or arylene group, which may contain a heteroatom such as oxygen, sulfur or nitrogen, and b6 is an integer of 1 to 3.

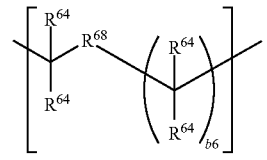

(AL-12)-17

(AL-12)-18

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

 (AL-13)-1

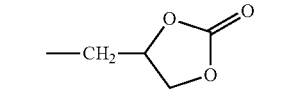 (AL-13)-2

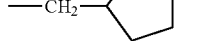 (AL-13)-3

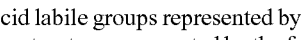 (AL-13)-4

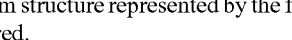 (AL-13)-5

 (AL-13)-6

(AL-13)-7

Of the acid labile groups represented by $R^2$, groups having an exo-form structure represented by the formula (AL-12)-19 are preferred.

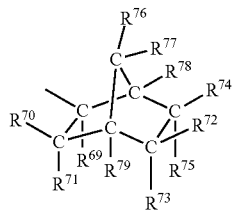

(AL-12)-19

Herein, $R^{69}$ is a straight, branched or cyclic $C_1$-$C_8$ alkyl group or an optionally substituted $C_6$-$C_{20}$ aryl group; $R^{70}$ to $R^{75}$, $R^{78}$ and $R^{79}$ are each independently hydrogen or a monovalent hydrocarbon group, typically alkyl, of 1 to 15 carbon atoms which may contain a heteroatom; and $R^{76}$ and $R^{77}$ are hydrogen. Alternatively, a pair of $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$, or $R^{77}$ and $R^{78}$ may bond together to form a ring, specifically aliphatic ring, with the carbon atom(s) to which they are attached, and in this case, each R is a divalent hydrocarbon group, typically alkylene, of 1 to 15 carbon atoms which may contain a heteroatom. Also, a pair of $R^{70}$ and $R^{79}$, $R^{76}$ and $R^{79}$, or $R^{72}$ and $R^{74}$ which are attached to vicinal carbon atoms may bond together directly to form a double bond. The formula also represents an enantiomer.

The ester form monomers from which recurring units having an exo-form structure represented by the formula (AL-12)-19 are derived are described in U.S. Pat. No. 6,448,420 (JP-A 2000-327633), with such recurring units being illustrated below. Herein $R^1$ is as defined above.

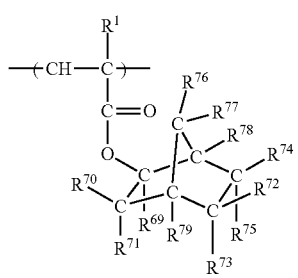

Illustrative non-limiting examples of suitable monomers are given below.

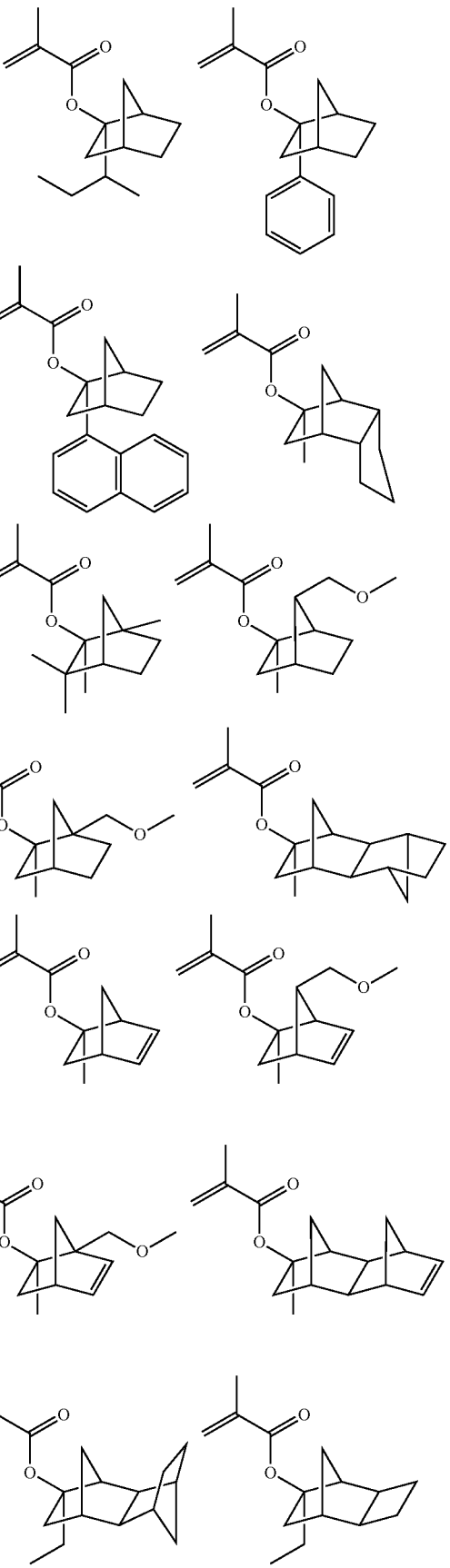

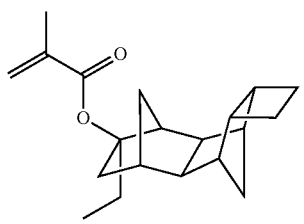

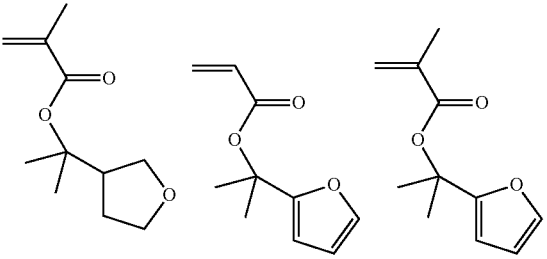

Also included in the acid labile groups represented by $R^2$ are acid labile groups having furandiyl, tetrahydrofurandiyl or oxanorbornanediyl as represented by the following formula (AL-12)-20.

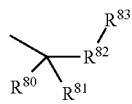
(AL-12)-20

Herein, $R^{80}$ and $R^{81}$ are each independently a monovalent hydrocarbon group, typically a straight, branched or cyclic $C_1$-$C_{10}$ alkyl. $R^{80}$ and $R^{81}$ may bond together to form an aliphatic hydrocarbon ring of 3 to 20 carbon atoms with the carbon atom to which they are attached. $R^{82}$ is a divalent group selected from furandiyl, tetrahydrofurandiyl and oxanorbornanediyl. $R^{83}$ is hydrogen or a monovalent hydrocarbon group, typically a straight, branched or cyclic $C_1$-$C_{10}$ alkyl, which may contain a heteroatom.

Examples of the monomers from which the recurring units substituted with acid labile groups having furandiyl, tetrahydrofurandiyl and oxanorbornanediyl as represented by the formula:

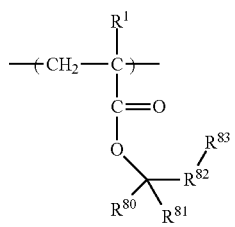

(wherein $R^1$ and $R^{80}$ to $R^{83}$ are as defined above) are derived are shown below. Note that Me is methyl, and Ac is acetyl.

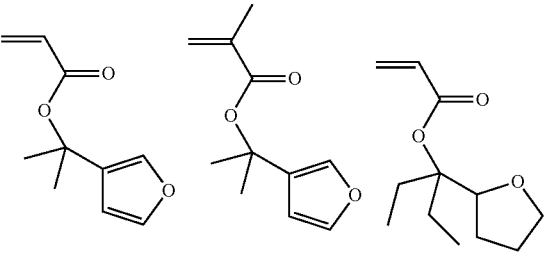

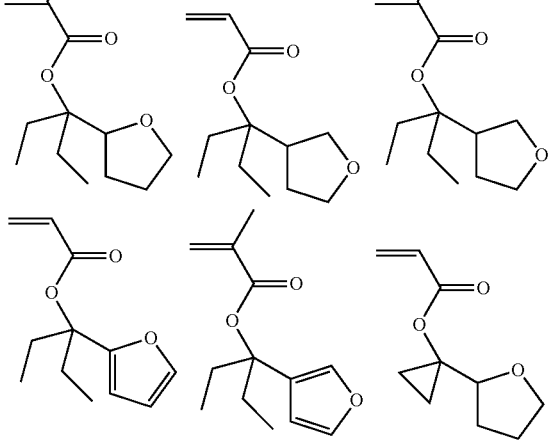

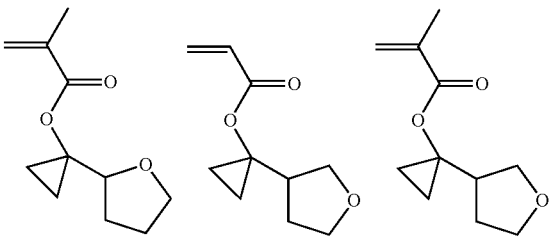

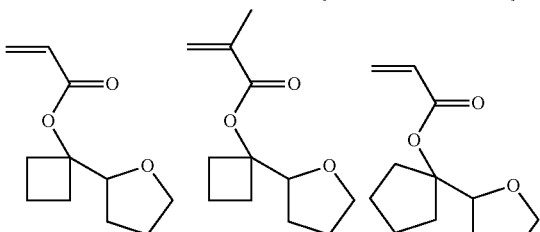

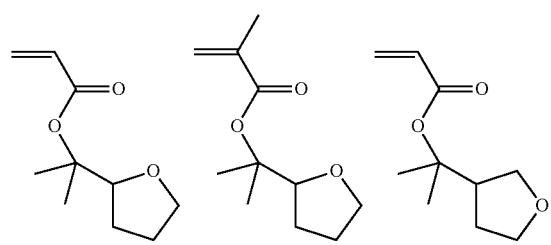

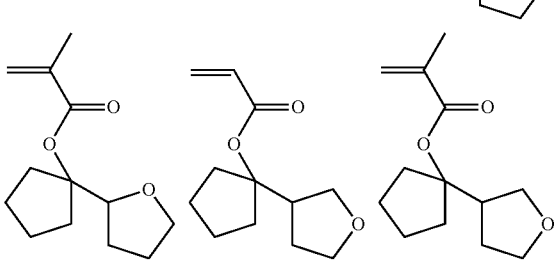

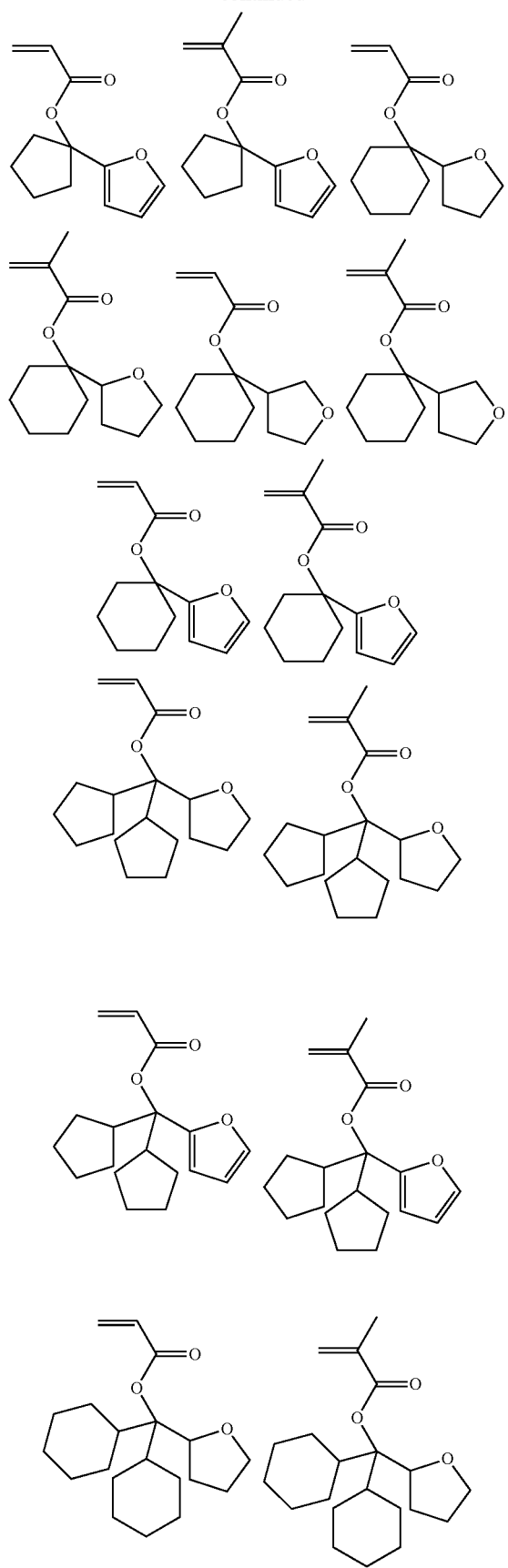
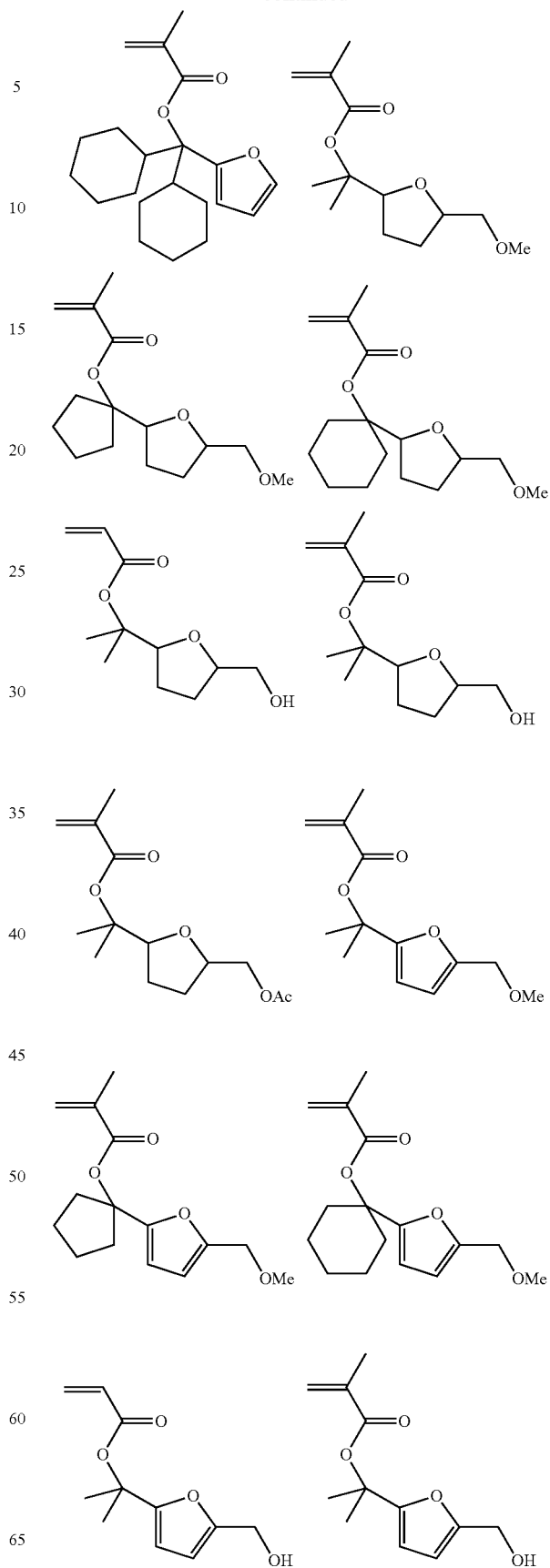

-continued

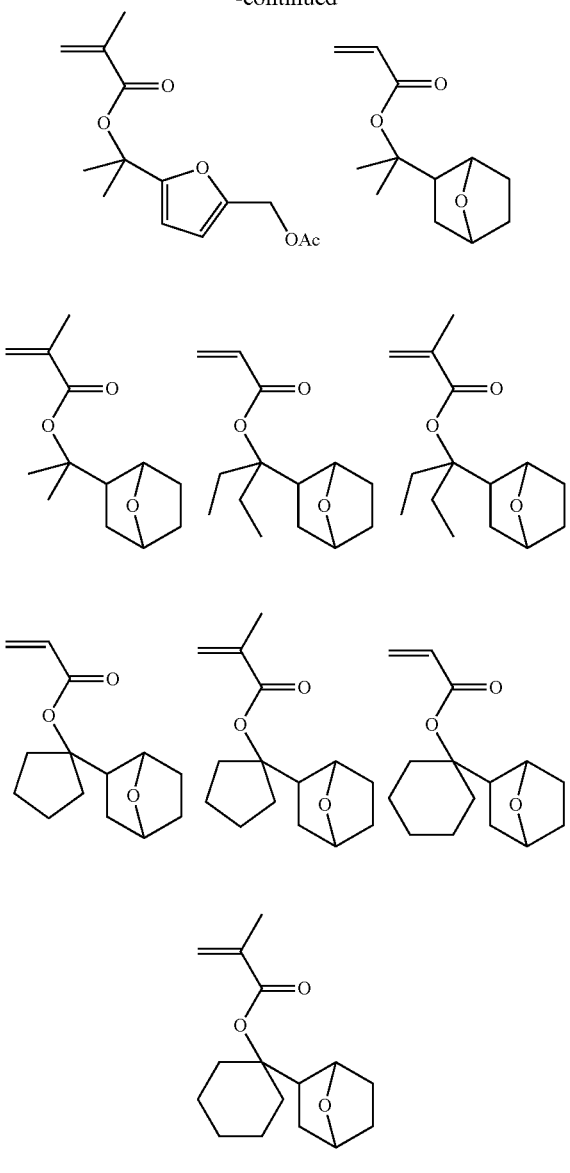

Of the foregoing acid labile groups, tertiary ester groups of formula (AL-12) are preferably used for a high dissolution contrast upon organic solvent development. Of the tertiary ester groups, those acid labile groups of formulae (AL-12)-1 to (AL-12)-16, and (AL-12)-19 are most preferred.

The recurring units (b) may be derived from monomers which are exemplified below. Herein $R^3$ is as defined above.

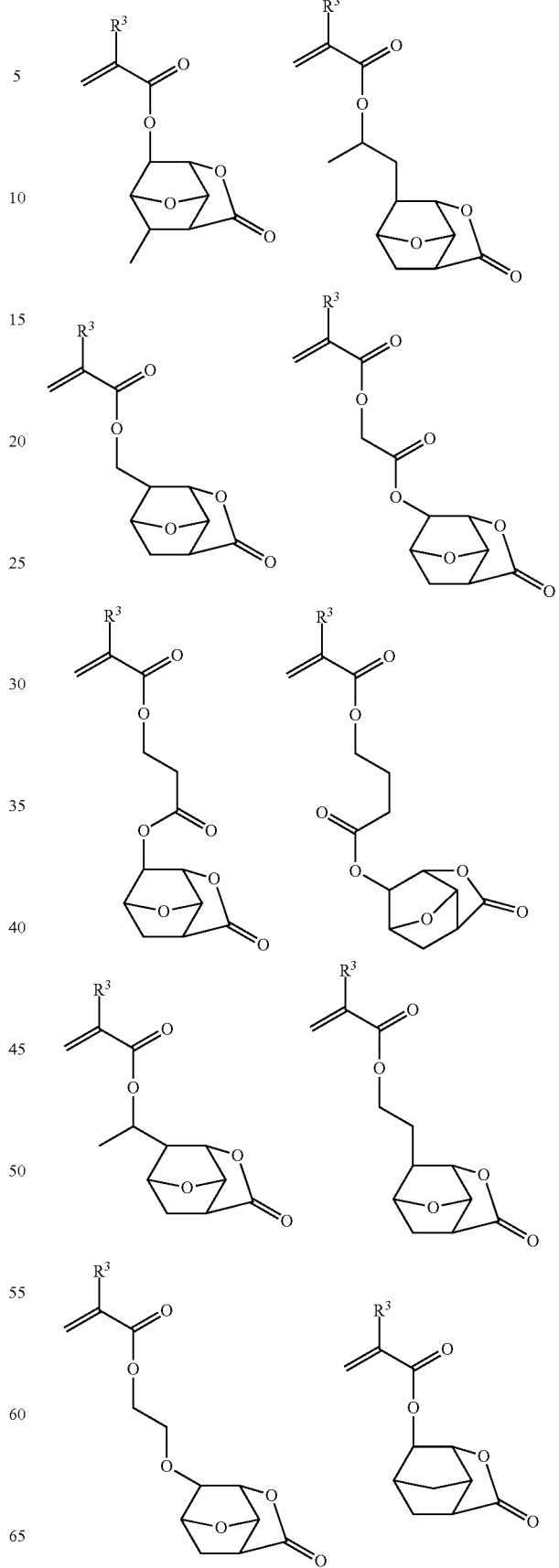

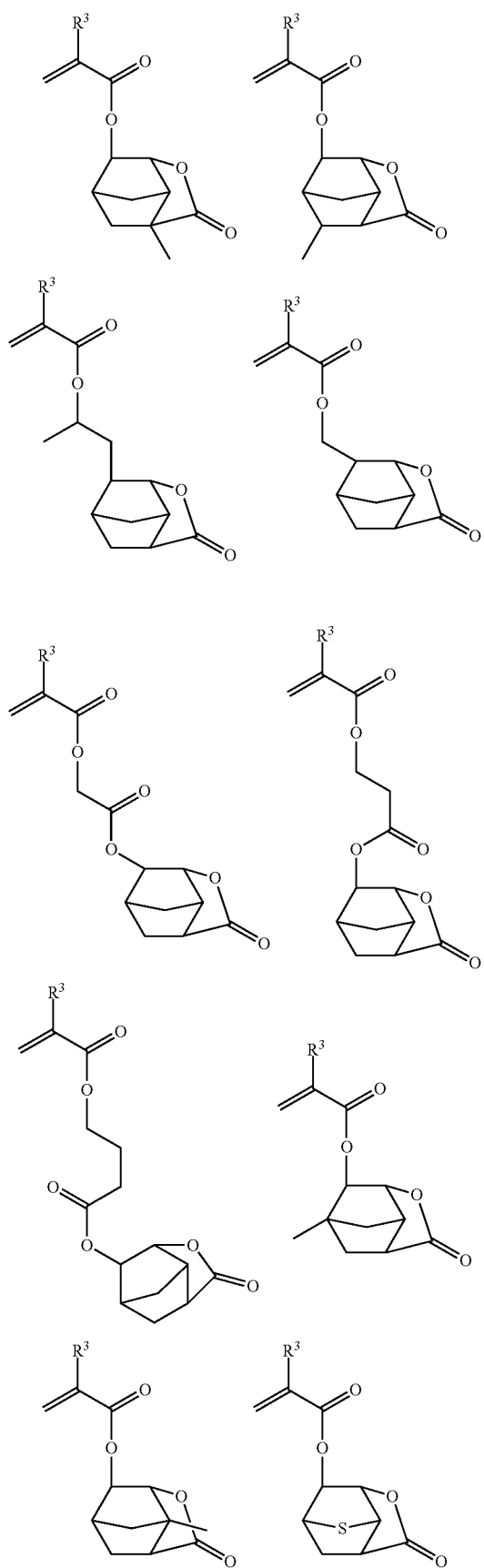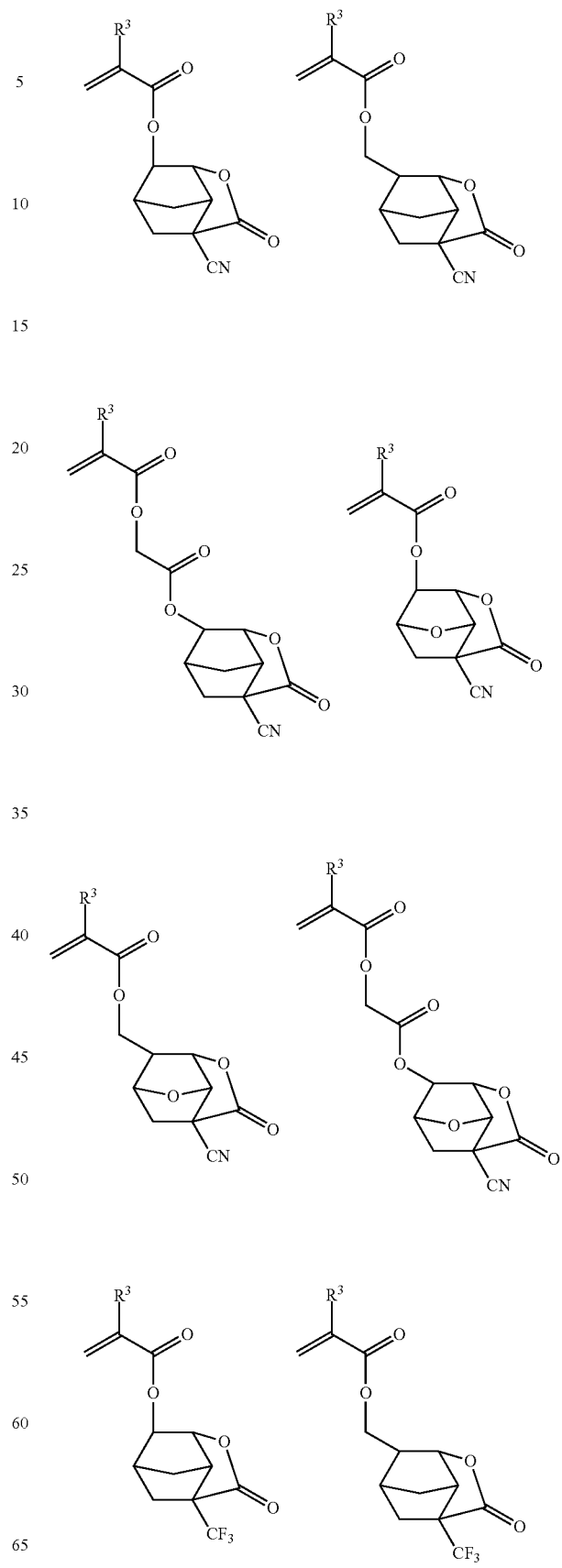

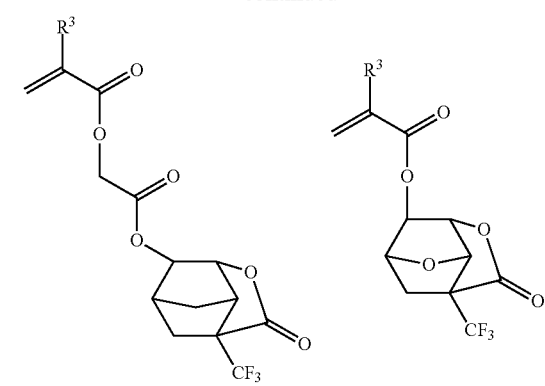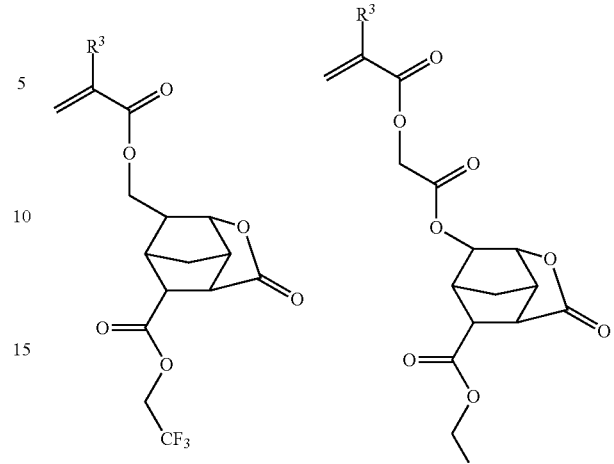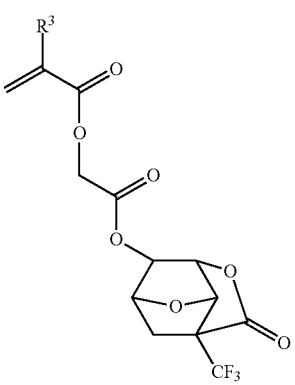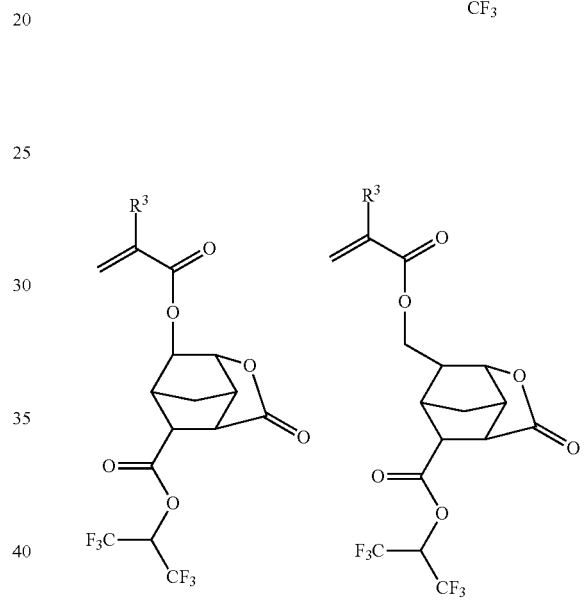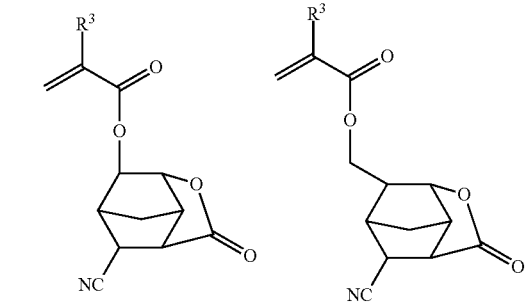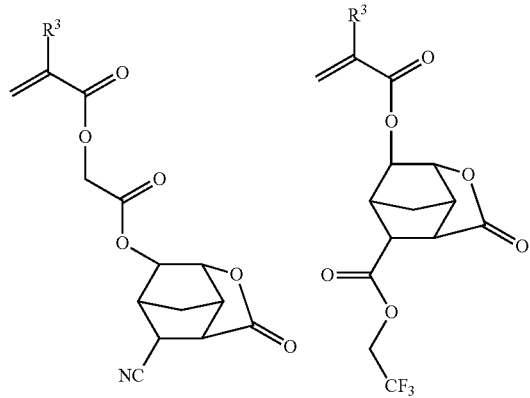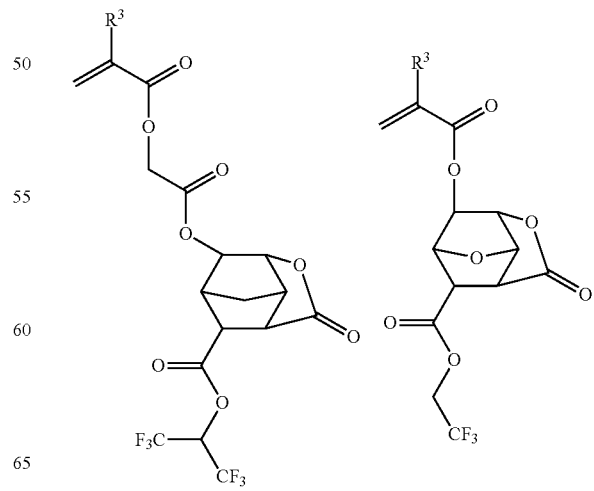

-continued
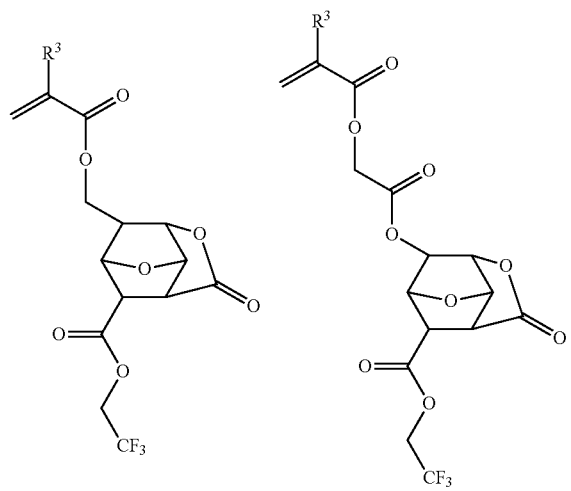
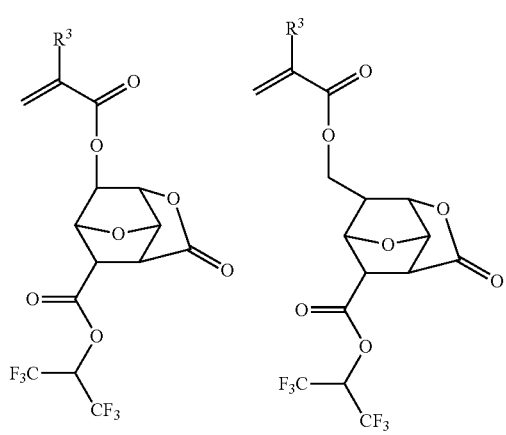
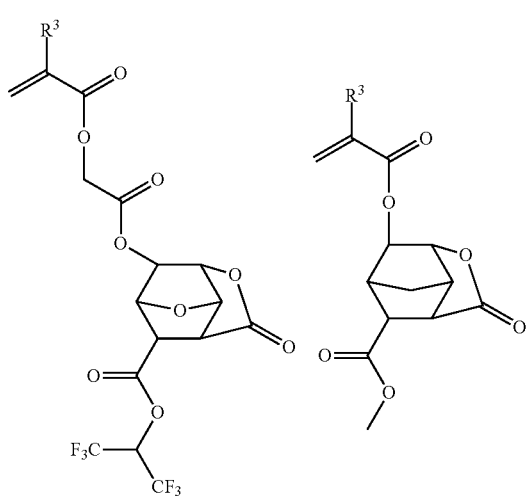
-continued
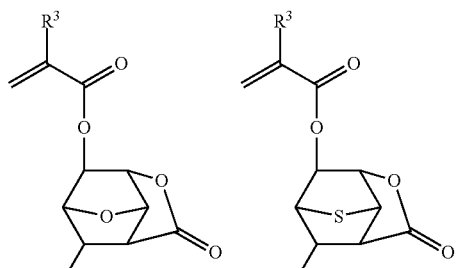
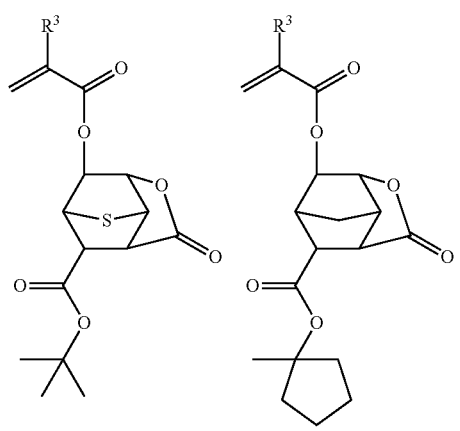
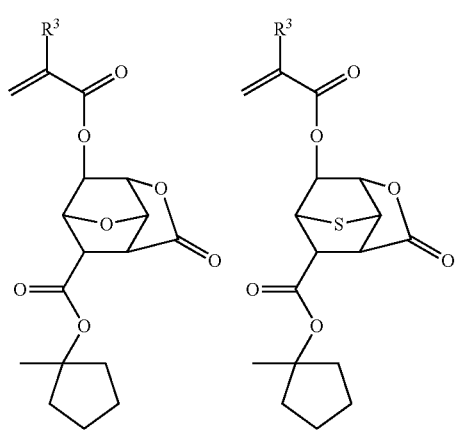

-continued
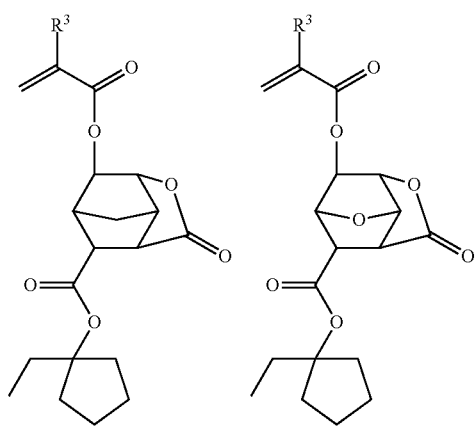
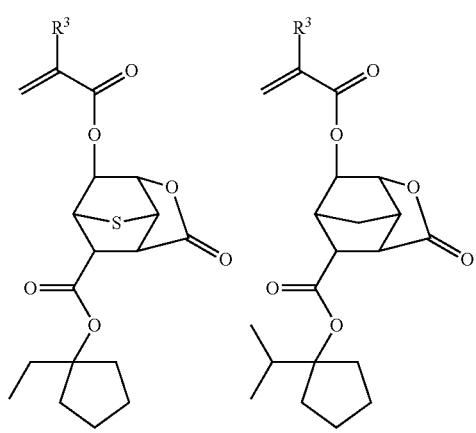
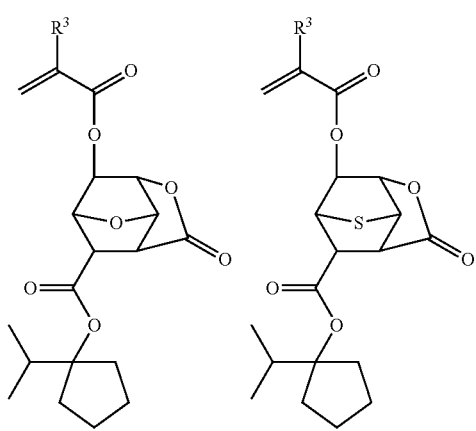
-continued
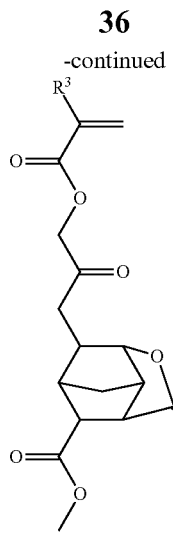
Lactone-containing methacrylates other than the foregoing are given below.
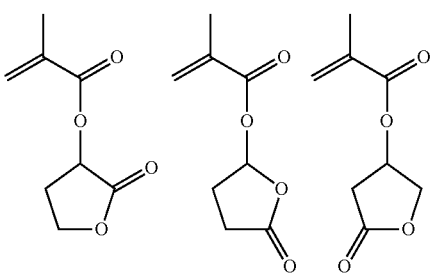
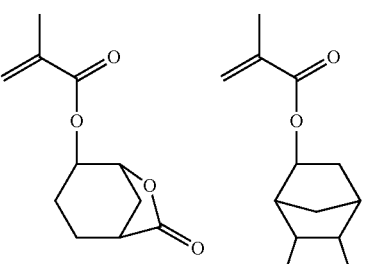
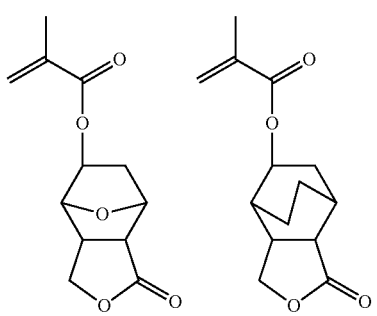

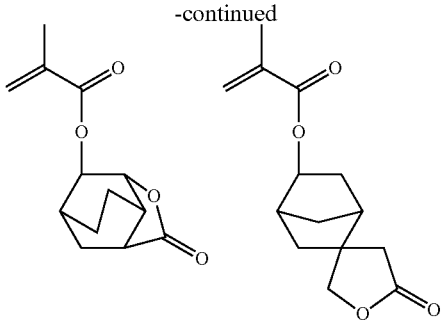

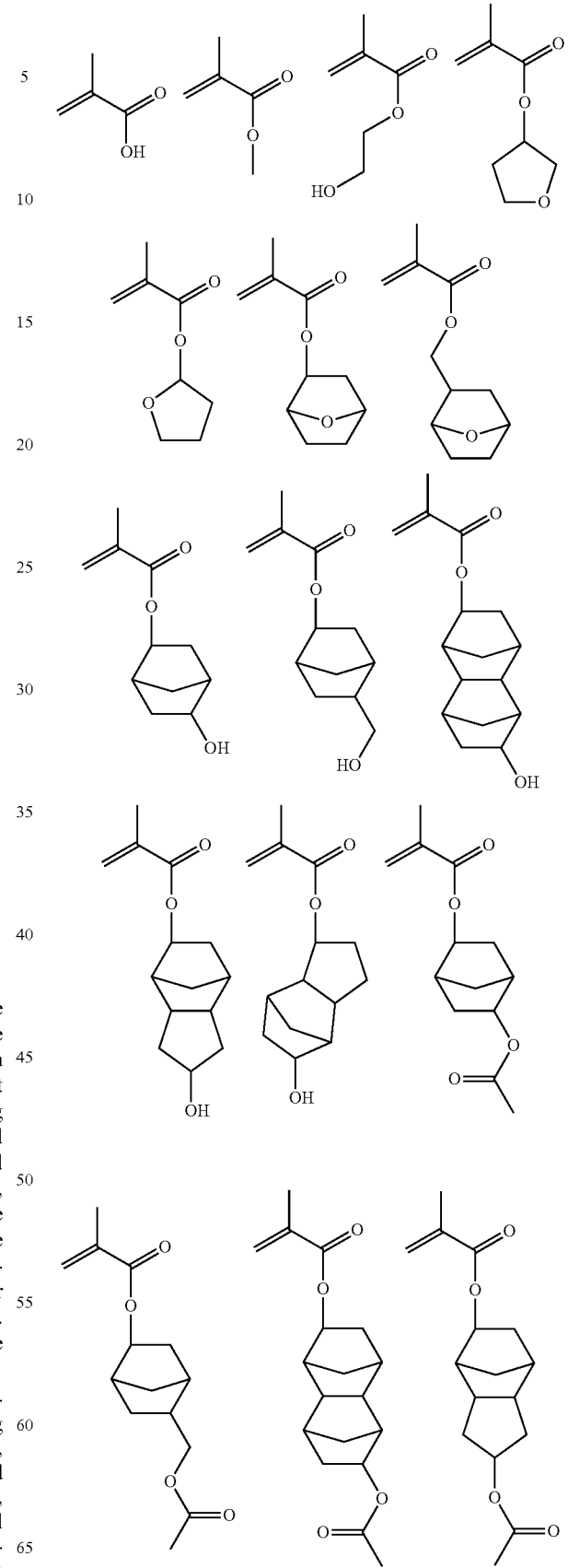

Of the adhesive groups, those groups having lactone are most preferably used. A base polymer having an adhesive group in the form of lactone is characterized by not only a high dissolution contrast when a solution containing at least 40% by weight of one or more solvents selected from among methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate is used as the developer, but also controlled acid diffusion. Of the lactone structures, the lactone groups of bridged cyclic structure represented by recurring units (b) in formula (1) are effective for dissolution contrast improvement and acid diffusion control. Inter alia, those units (b) in formula (1) wherein Y is a single bond are most preferred for acid diffusion control.

While the polymer used as the base in the resist composition essentially comprises recurring units (a) and recurring units (b) having lactone as the adhesive group in formula (1), it may have copolymerized therein recurring units (c) derived from monomers having adhesive groups such as hydroxy, cyano, carbonyl, ester, ether groups, lactone rings, carboxyl groups or carboxylic anhydride groups. Examples of monomers from which recurring units (c) are derived are given below.

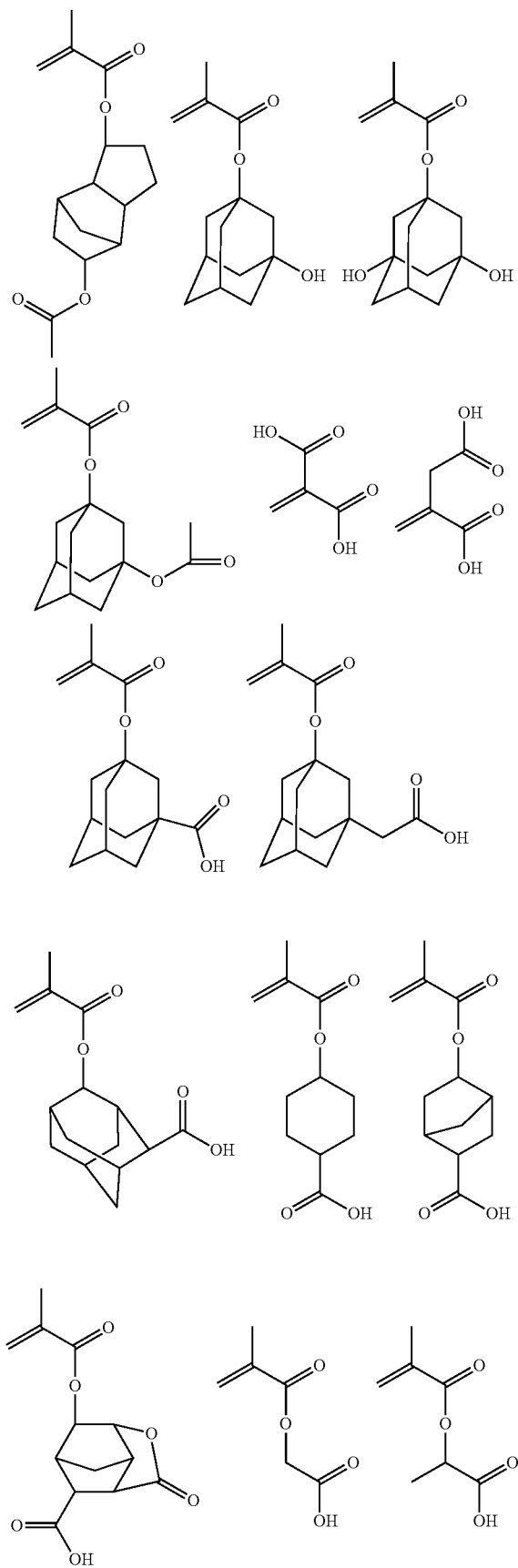
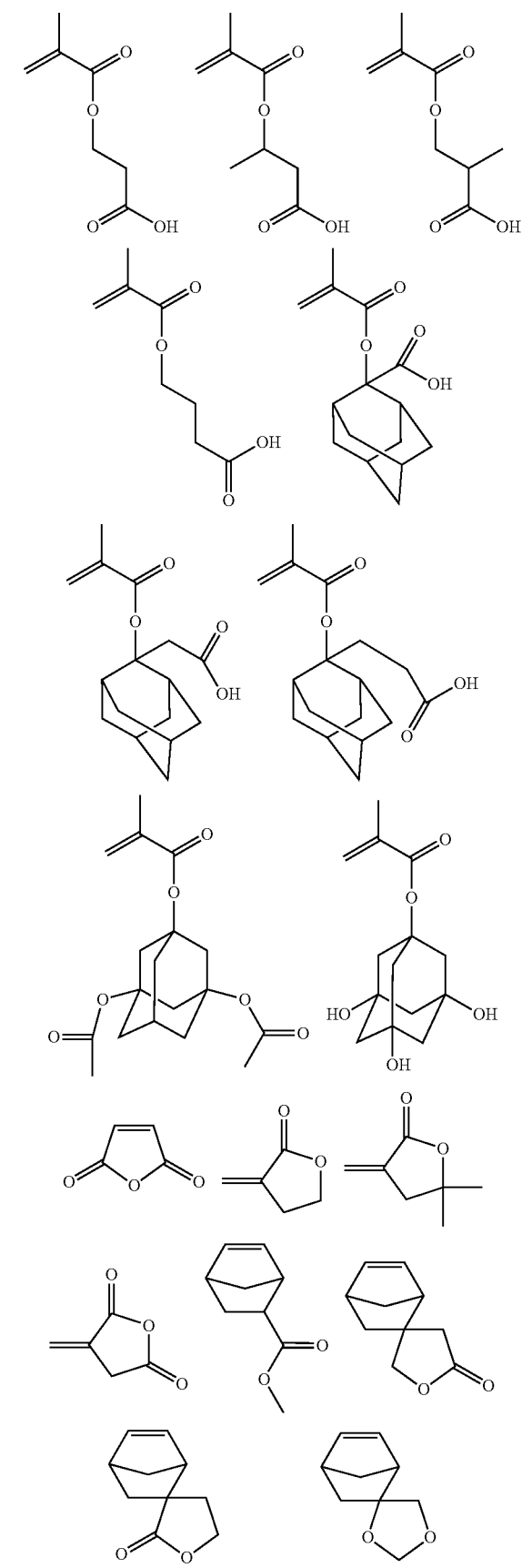

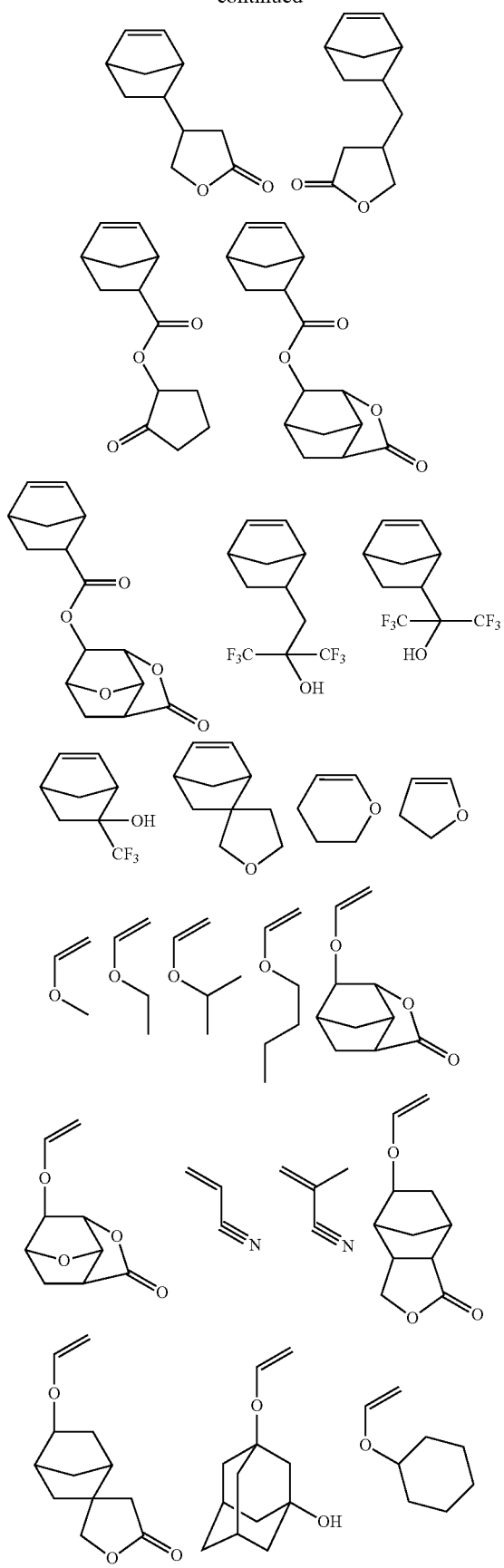
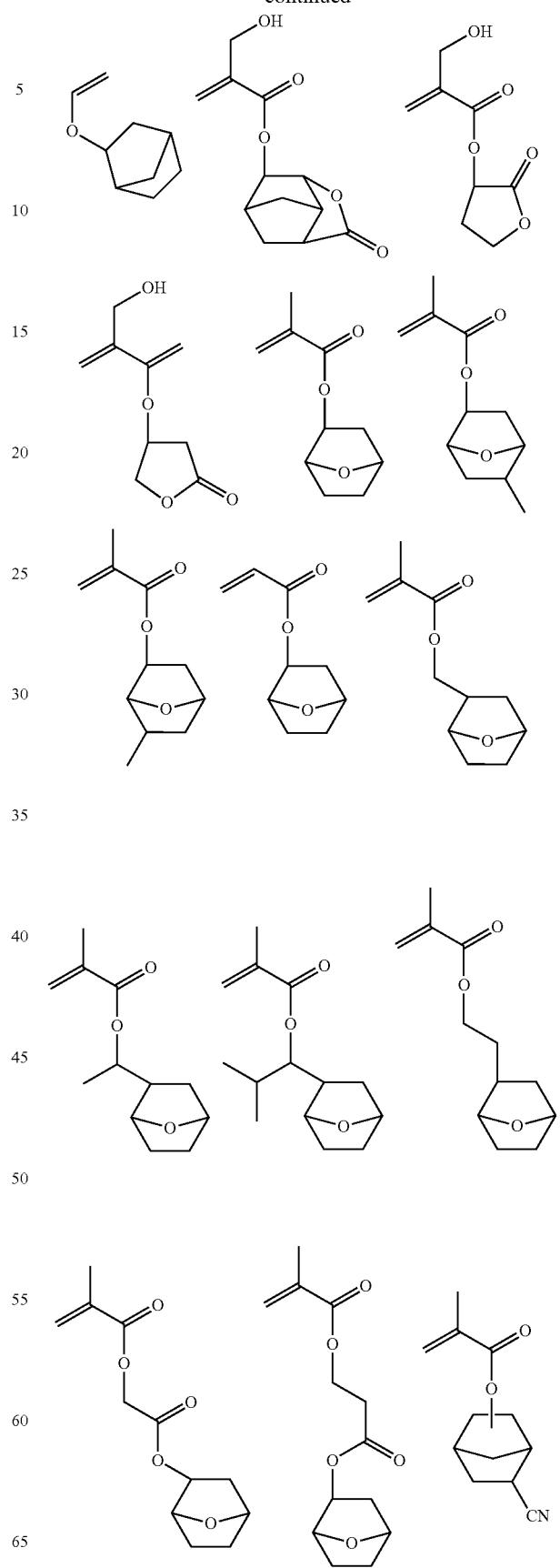

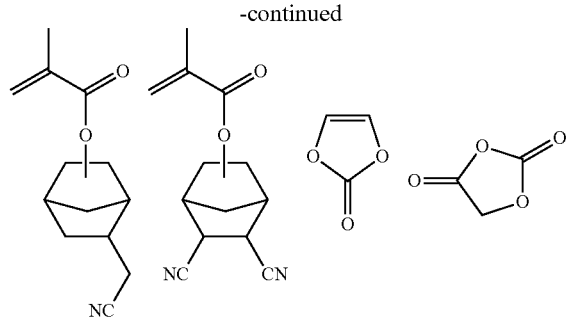
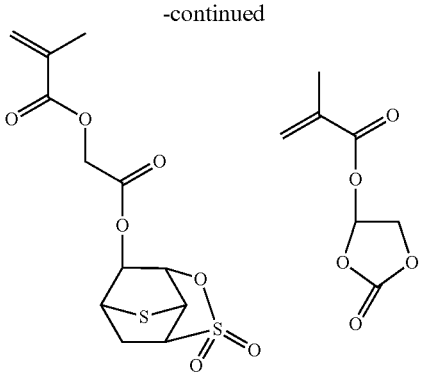
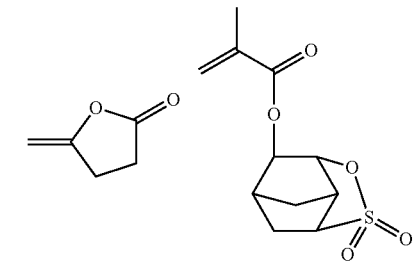
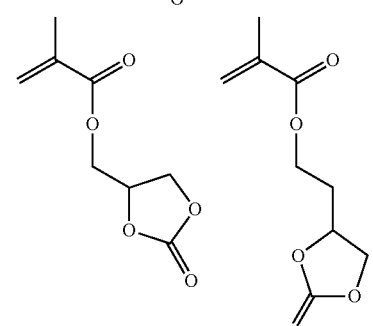
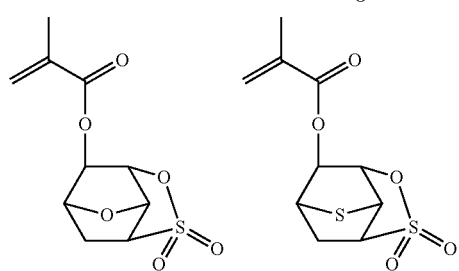
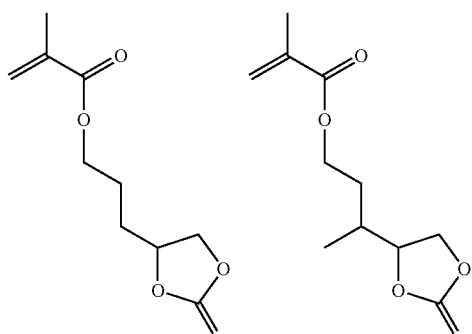
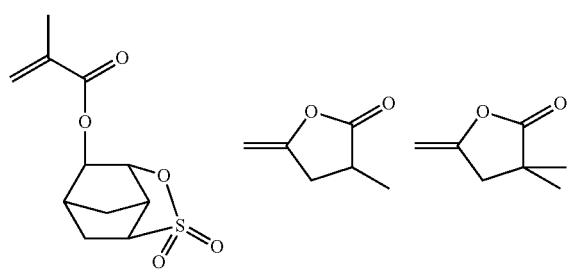
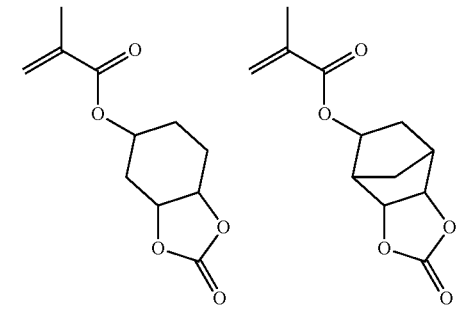
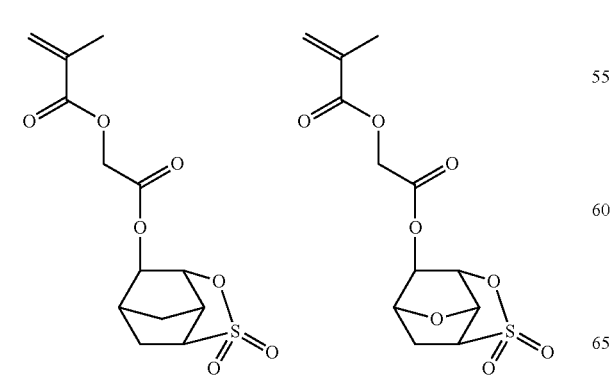
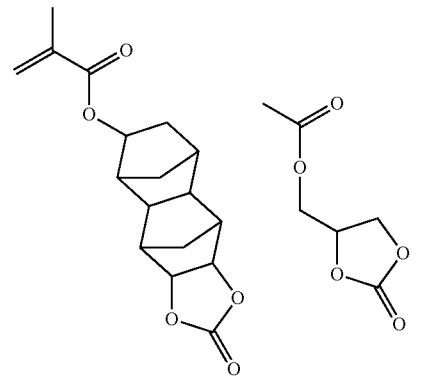

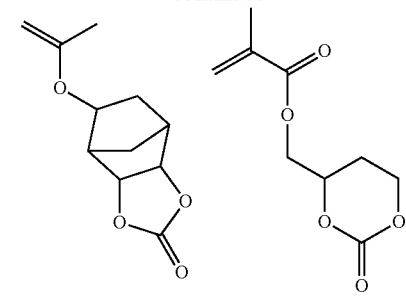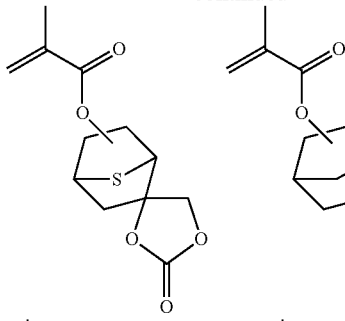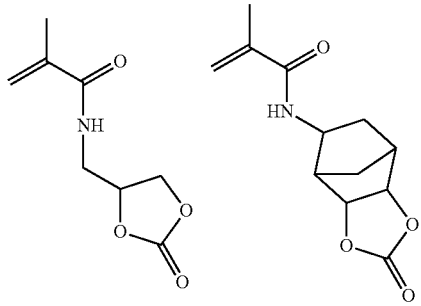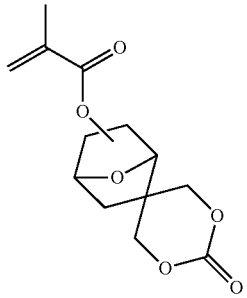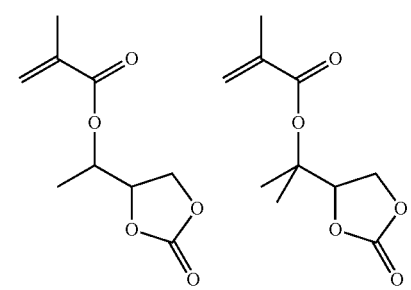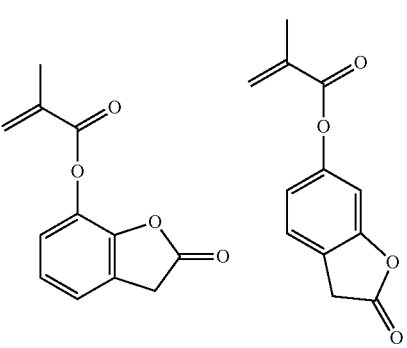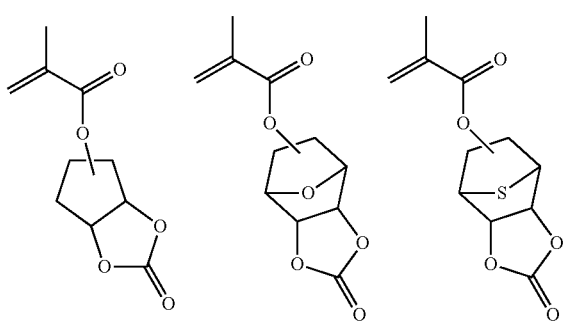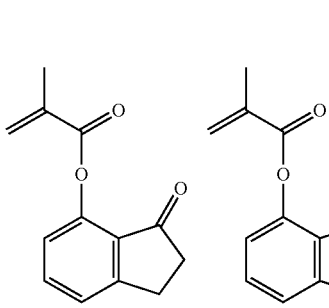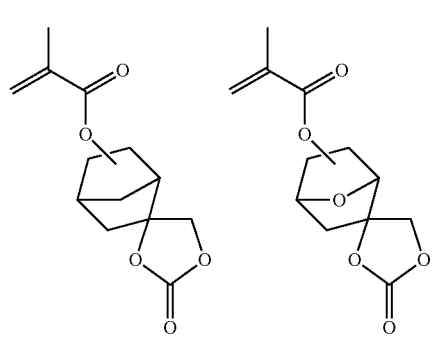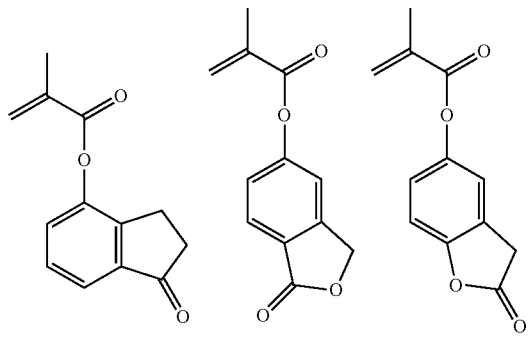

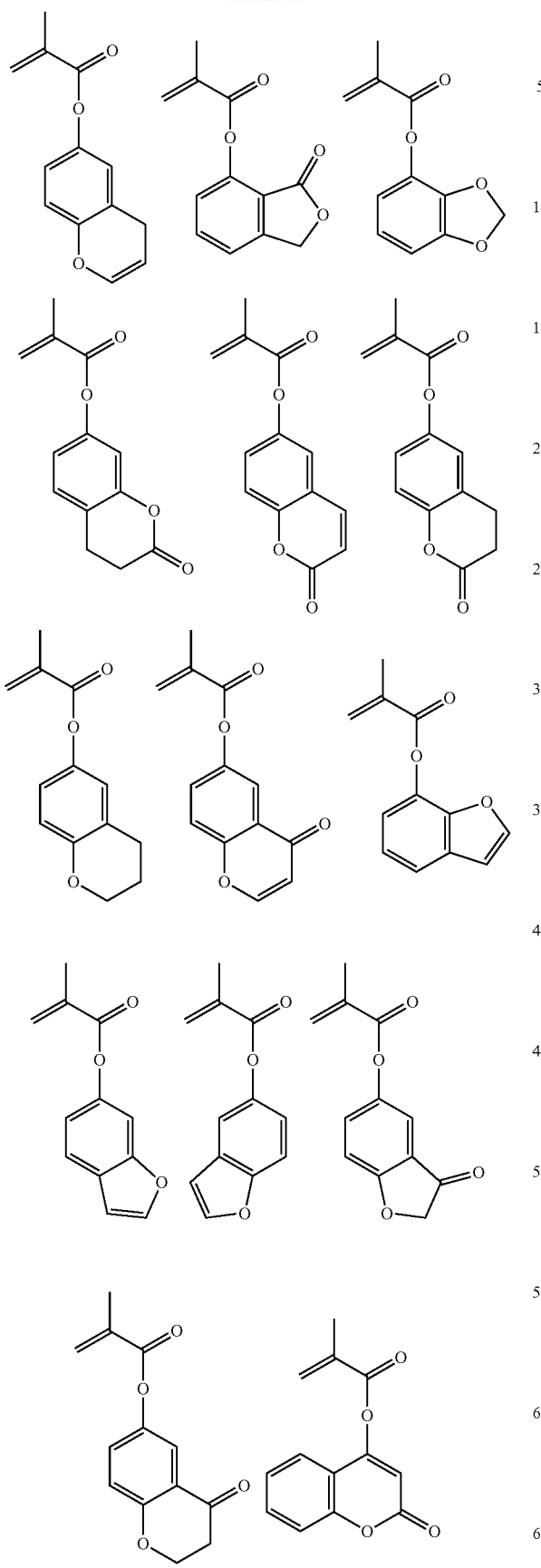
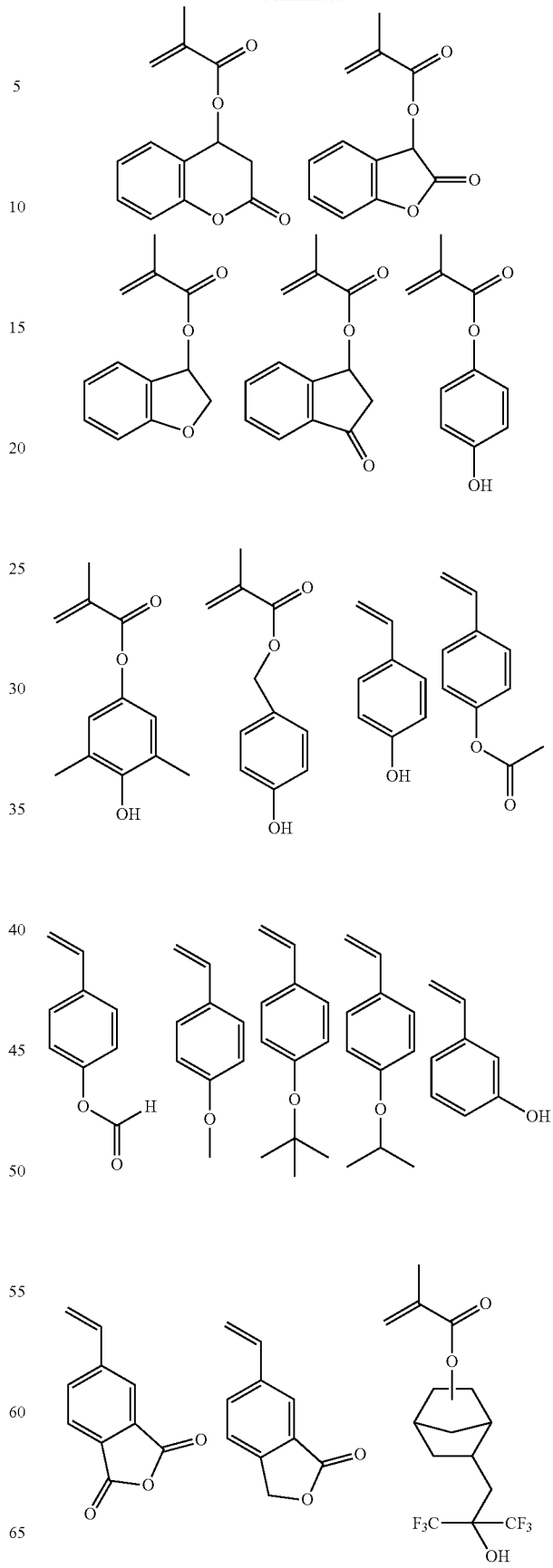

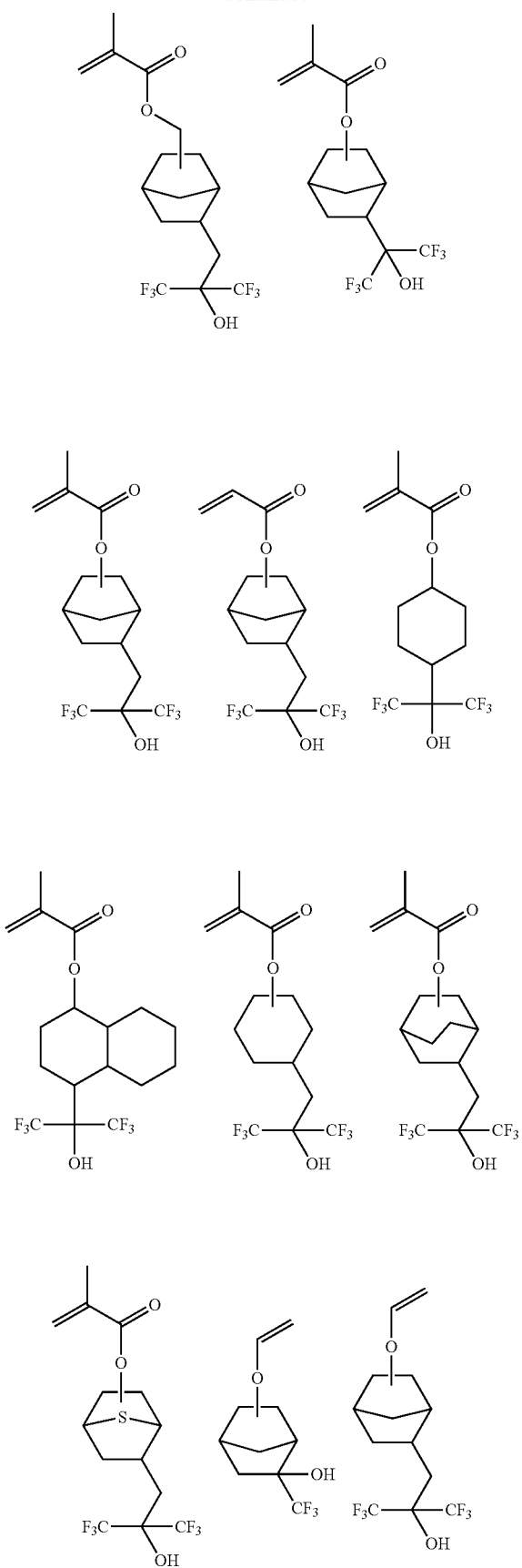
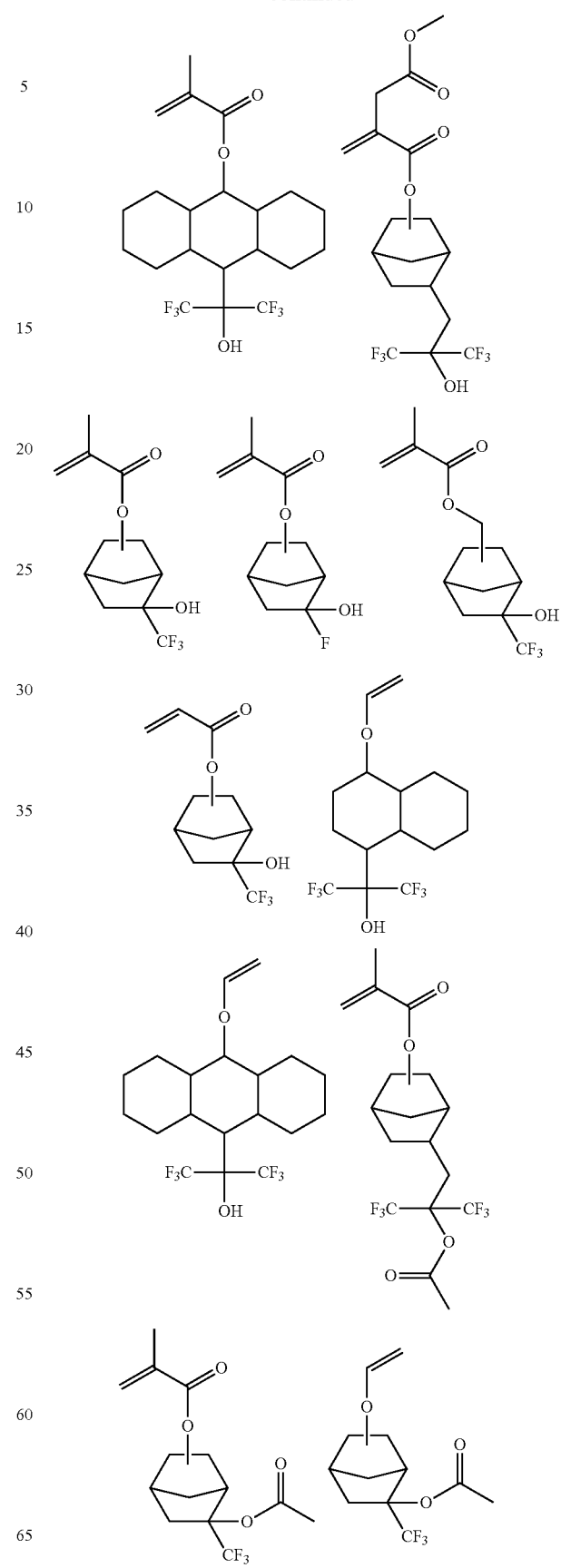

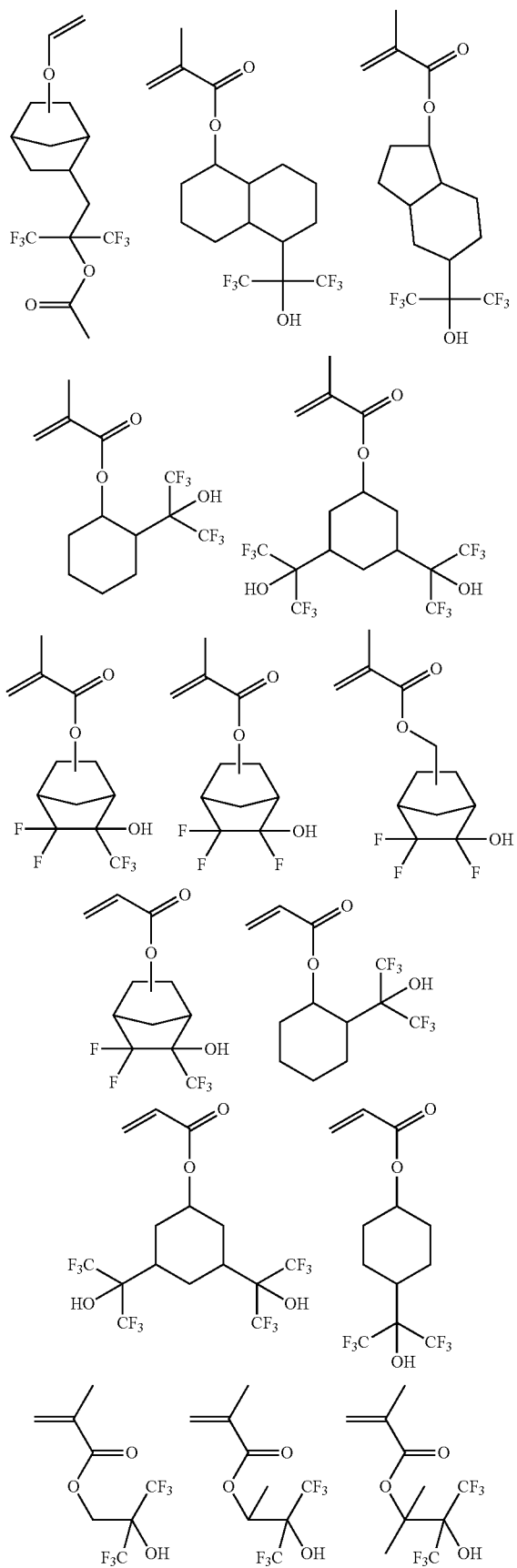
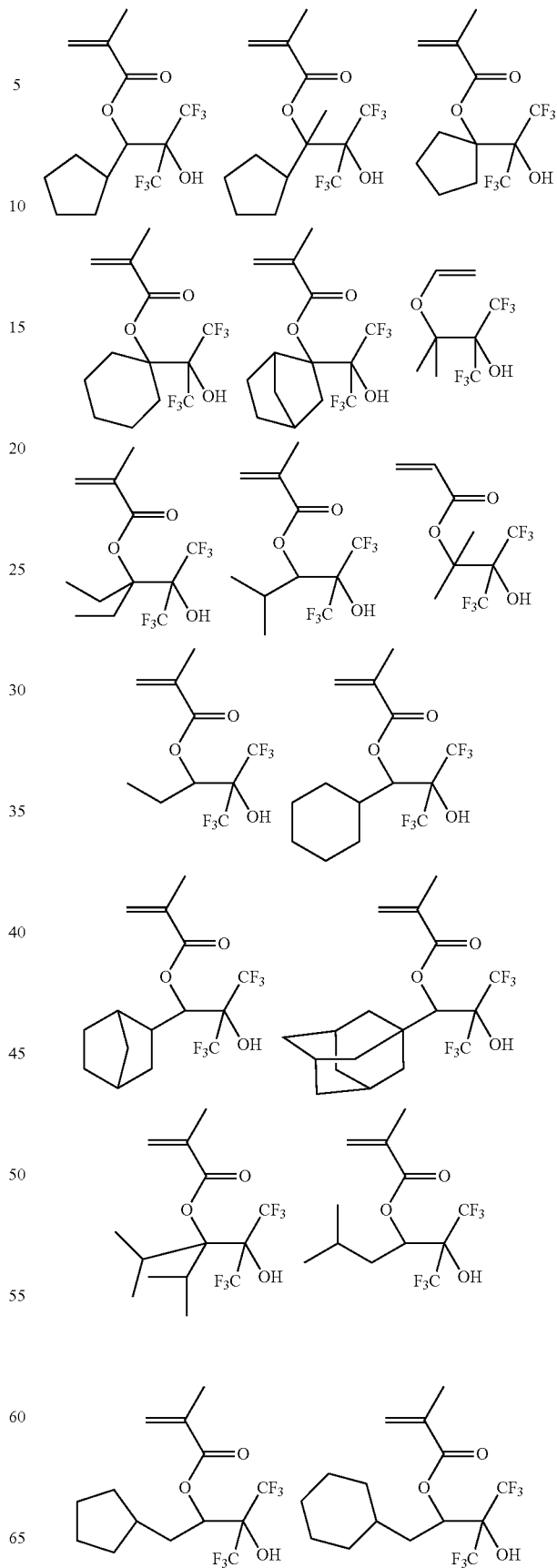

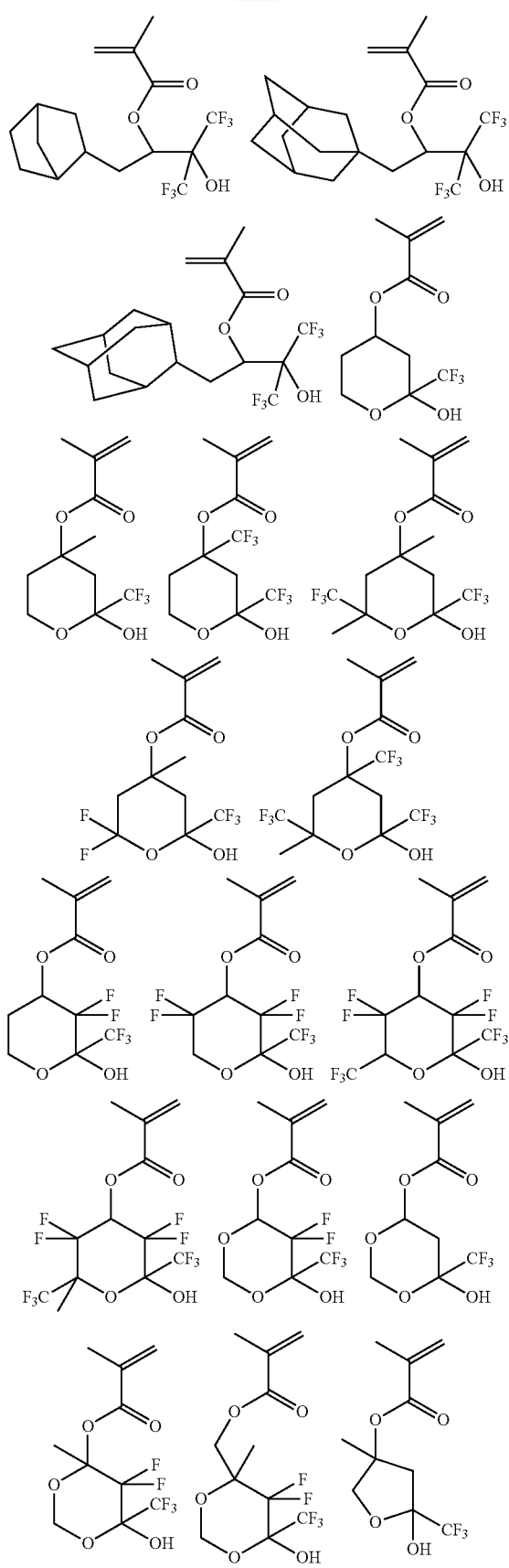
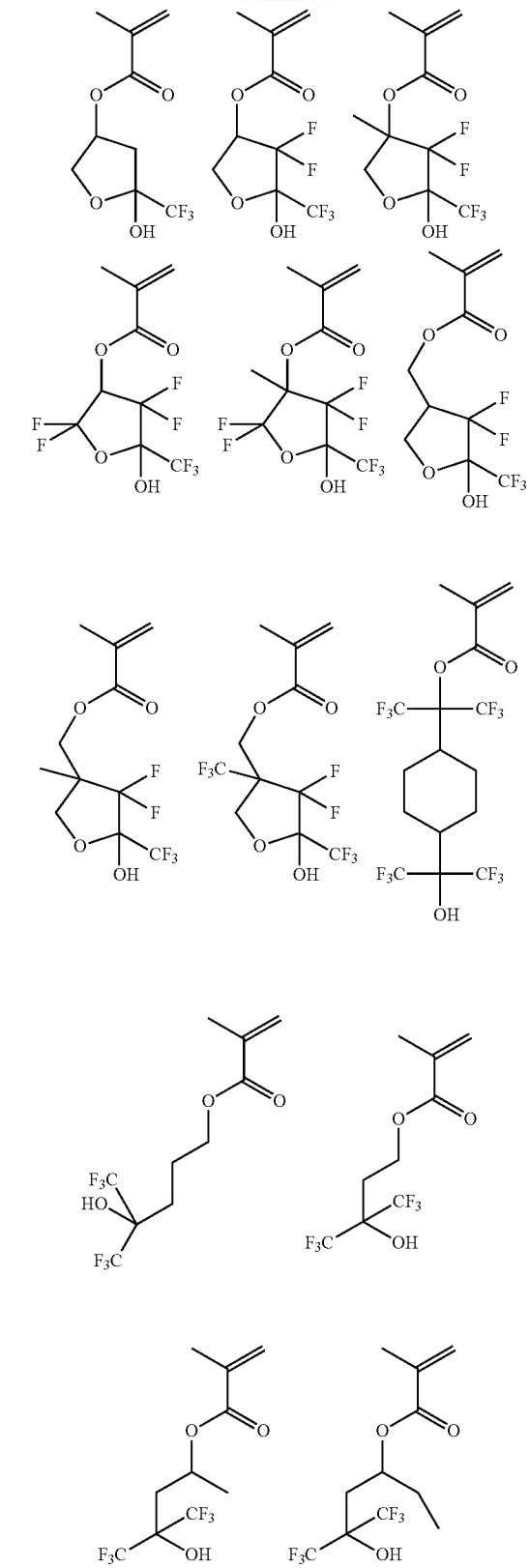
In a preferred embodiment, the copolymer has further copolymerized therein units selected from sulfonium salts (d1) to (d3) represented by the general formulae below.

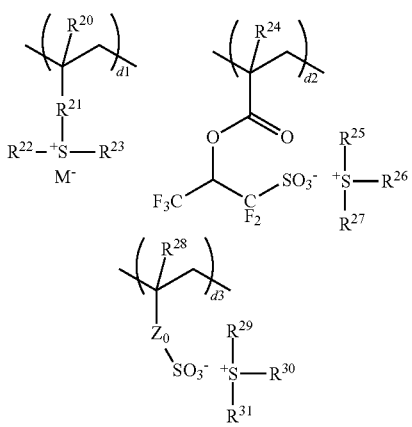

Herein $R^{20}$, $R^{24}$, and $R^{28}$ each are hydrogen or methyl. $R^{21}$ is a single bond, phenylene, —O—$R^{33}$—, or —C(=O)—Y—$R^{33}$— wherein Y is oxygen or NH, and $R^{33}$ is a straight, branched or cyclic $C_1$-$C_6$ alkylene group, alkenylene or phenylene group, which may contain a carbonyl (—CO—), ester (—COO—), ether (—O—) or hydroxyl radical. $R^{22}$, $R^{23}$, $R^{25}$, $R^{26}$, $R^{27}$, $R^{29}$, $R^{30}$, and $R^{31}$, are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group. $Z_0$ is a single bond, methylene, ethylene, phenylene, fluorophenylene, —O—$R^{32}$—, or —C(=O)—$Z_1$—$R^{32}$—, wherein $Z_1$ is oxygen or NH, and $R^{32}$ is a straight, branched or cyclic $C_1$-$C_6$ alkylene group, alkenylene or phenylene group, which may contain a carbonyl, ester, ether or hydroxyl radical. M is a non-nucleophilic counter ion.

The subscripts a, b, c, d1, d2 and d3 indicative of proportions of corresponding recurring units are in the range: $0<a<1.0$, $0<b<1.0$, $0<a+b\leq1.0$, especially $0.1\leq a+b\leq1.0$, $0\leq c<1.0$, $0\leq d1<0.2$, $0\leq d2<0.2$, and $0\leq d3<0.2$; preferably $0.1\leq a\leq0.9$, $0.1\leq b\leq0.9$, $0.2\leq a+b\leq1.0$, $0\leq c\leq0.9$, $0\leq d1\leq0.15$, $0\leq d2\leq0.15$, and $0\leq d3\leq0.15$; and more preferably $0.15\leq a\leq0.8$, $0.15\leq b\leq0.8$, $0.25\leq a+b\leq1.0$, $0\leq c\leq0.8$, $0\leq d1\leq0.12$, $0\leq d2\leq0.12$, and $0\leq d3\leq0.12$, provided that a+b+c+d1+d2+d3=1.

It is noted that the meaning of a+b=1, for example, is that in a polymer comprising recurring units (a) and (b), the sum of recurring units (a) and (b) is 100 mol % based on the total amount of entire recurring units. The meaning of a+b<1 is that the sum of recurring units (a) and (b) is less than 100 mol % based on the total amount of entire recurring units, indicating the inclusion of other recurring units, for example, units (c).

The polymer serving as the base resin in the resist composition used in the pattern forming process of the invention should preferably have a weight average molecular weight (Mw) in the range of 1,000 to 500,000, and more preferably 2,000 to 30,000, as measured by GPC using polystyrene standards. With too low a Mw, film slimming is likely to occur upon organic solvent development. A polymer with too high a Mw may lose solubility in organic solvent and have a likelihood of footing after pattern formation.

If a polymer has a wide molecular weight distribution or dispersity (Mw/Mn), which indicates the presence of lower and higher molecular weight polymer fractions, there is a possibility that following exposure, foreign matter is left on the pattern or the pattern profile is exacerbated. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is acceptable to use a blend of two or more polymers which differ in compositional ratio, molecular weight or dispersity as well as a blend of an inventive polymer and another polymer free of an acid labile group-substituted hydroxyl group.

A blend of a polymer comprising recurring units having a hydroxyl group substituted with an acid labile group with a polymer comprising recurring units having a carboxyl group substituted with an acid labile group is acceptable. Also acceptable is a blend of a polymer comprising both recurring units having a hydroxyl group substituted with an acid labile group and recurring units having a carboxyl group substituted with an acid labile group with a polymer comprising recurring units having a hydroxyl group substituted with an acid labile group, or a polymer comprising recurring units having a carboxyl group substituted with an acid labile group.

The polymer as used herein may be synthesized by any desired method, for example, by dissolving unsaturated bond-containing monomers corresponding to the respective units (a), (b), (c), (d1), (d2), and (d3) in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisiso-butyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomers may be kept as such, or the acid labile group may be once eliminated with an acid catalyst and thereafter protected or partially protected.

As described previously, the pattern forming process of the invention comprises the steps of coating the positive resist composition defined above onto a substrate, prebaking the resist composition to form a resist film, exposing a selected region of the resist film to high-energy radiation, post-exposure baking, and developing the exposed resist film with an organic solvent developer so that the unexposed region of film is dissolved and the exposed region of film is left, thereby forming a negative tone pattern such as a hole or trench pattern.

The resist composition used in the pattern forming process of the invention may further comprise an organic solvent, a compound capable of generating an acid in response to high-energy radiation (known as "acid generator"), and optionally, a dissolution regulator, basic compound, surfactant, acetylene alcohol, and other components.

The resist composition used herein may include an acid generator in order for the composition to function as a chemically amplified positive resist composition. Typical of the acid generator used herein is a photoacid generator (PAG) capable of generating an acid in response to actinic light or radiation. The PAG may preferably be compounded in an amount of 0.5 to 30 parts and more preferably 1 to 20 parts by weight per 100 parts by weight of the base resin. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The PAGs may be used alone or in admixture of two or more.

Exemplary acid generators are described in U.S. Pat. No. 7,537,880 (JP-A 2008-111103, paragraphs [0122] to [0142]). Where an acid generator for generating an α-position fluorinated sulfonic acid, imidic acid or methidic acid is combined with a sulfonium or iodonium salt for generating an α-position non-fluorinated sulfonic acid or carboxylic acid, an ion exchange occurs between the α-position fluorinated sulfonic acid, imidic acid or methidic acid generated by the former upon light exposure and the sulfonium or iodonium salt for generating an α-position non-fluorinated sulfonic acid or carboxylic acid. That is, the sulfonium or iodonium salt for generating an α-position non-fluorinated sulfonic acid or carboxylic acid serves as a quencher. Since the sulfonium or iodonium salt has a high molecular weight and is less diffusive as compared with ordinary amine quenchers, and as a result, the diffusion of acid after ion exchange is considerably suppressed.

Where the polymer has a polymerizable acid generator unit selected from recurring units (d1), (d2) and (d3) copolymerized therein, the acid generator need not necessarily be added.

Examples of the organic solvent used herein are described in JP-A 2008-111103, paragraphs [0144] to [0145] (U.S. Pat. No. 7,537,880). Specifically, exemplary solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof. Exemplary basic compounds include primary, secondary and tertiary amine compounds, specifically amine compounds having a hydroxyl, ether, ester, lactone, cyano or sulfonate group, as described in JP-A 2008-111103, paragraphs [0146] to [0164], and compounds having a carbamate group, as described in JP 3790649. Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182].

Also a polymeric additive may be added for improving the water repellency on surface of a resist film as spin coated. This additive may be used in the topcoatless immersion lithography. These additives have a specific structure with a 1,1,1,3,3,3-hexafluoro-2-propanol residue and are described in JP-A 2007-297590, 2008-111103, 2008-122932, 2009-98638, and 2009-276363. The water repellency improver to be added to the resist should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB and avoiding any hole pattern opening failure after development. A water repellent polymer having an amino group copolymerized therein, suited for use in resist compositions is described in JP-A 2009-31767, a copolymer having a sulfonic acid amine salt copolymerized in JP-A 2008-107443, and a copolymer having a carboxylic acid amine salt copolymerized in JP-A 2008-239918. An appropriate amount of the water repellent agent is 0.1 to 20 parts, preferably 0.5 to 10 parts by weight per 100 parts by weight of the base resin.

Notably, an appropriate amount of the organic solvent is 100 to 10,000 parts, preferably 300 to 8,000 parts by weight, and an appropriate amount of the basic compound is 0.0001 to 30 parts, preferably 0.001 to 20 parts by weight, per 100 parts by weight of the base resin.

Process

Now referring to the drawings, the pattern forming process of the invention is illustrated in FIG. 1. First, the positive resist composition is coated on a substrate to form a resist film thereon. Specifically, a resist film 40 of a positive resist composition is formed on a processable substrate 20 disposed on a substrate 10 directly or via an intermediate intervening layer 30 as shown in FIG. 1A. The resist film preferably has a thickness of 10 to 1,000 nm and more preferably 20 to 500 nm. Prior to exposure, the resist film is heated or prebaked, preferably at a temperature of 60 to 180° C., especially 70 to 150° C. for a time of 10 to 300 seconds, especially 15 to 200 seconds.

The substrate 10 used herein is generally a silicon substrate. The processable substrate (or target film) 20 used herein includes $SiO_2$, SiN, SiON, SiOC, p-Si, α-Si, TiN, WSi, BPSG, SOG, Cr, CrO, CrON, MoSi, low dielectric film, and etch stopper film. The intermediate intervening layer 30 includes hard masks of $SiO_2$, SiN, SiON or p-Si, an undercoat in the form of carbon film, a silicon-containing intermediate film, and an organic antireflective coating.

Next comes exposure depicted at 50 in FIG. 1B. For the exposure, preference is given to high-energy radiation having a wavelength of 140 to 250 nm and EUV having a wavelength of 13.5 nm, and especially ArF excimer laser radiation of 193 nm. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. The immersion lithography involves prebaking a resist film and exposing the resist film to light through a projection lens, with water introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface.

The resist protective film used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. The protective film-forming composition used herein may be based on a polymer comprising recurring units derived from a monomer having a 1,1,1,3,3,3-hexafluoro-2-propanol residue. While the protective film must dissolve in the organic solvent developer, the polymer comprising recurring units derived from a monomer having a 1,1,1,3,3,3-hexafluoro-2-propanol residue dissolves in the aforementioned organic solvent developers. In particular, protective film-forming materials having 1,1,1,3,3,3-hexafluoro-2-propanol residues as described in JP-A 2007-025634, 2008-003569, 2008-081716, and 2008-111089 readily dissolve in organic solvent developers.

After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film.

Exposure is preferably performed in an exposure dose of about 1 to 200 mJ/cm$^2$, more preferably about 10 to 100 mJ/cm$^2$. This is followed by baking (PEB) on a hot plate at 60 to 150° C. for 1 to 5 minutes, preferably at 80 to 120° C. for 1 to 3 minutes.

Thereafter the exposed resist film is developed with a developer consisting of an organic solvent for 0.1 to 3 minutes, preferably 0.5 to 2 minutes by any conventional techniques such as dip, puddle and spray techniques. In this way, the unexposed region of resist film is dissolved away, leaving a negative resist pattern 40a on the substrate 10 as shown in FIG. 1C. The developer used herein contains at least 40% by weight, preferably at least 50% by weight, more preferably at least 60% by weight, even 100% by weight of a (first) solvent selected from among methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, 2-phenylethyl acetate, and mixtures of two or more of the foregoing. In addition to the first solvent, the developer may contain the balance, that is, up to 60% by weight of a second solvent selected from among ketones such as 2-heptanone, 2-hexanone, 3-hexanone, diisobutyl ketone, methylcyclohexanone, acetophenone, and methylacetophenone, and esters such as propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, and isoamyl lactate, and mixtures of two or more of the foregoing.

The first solvents, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate have a higher flash point than butyl acetate which is commonly used as the developer in the prior art, are thus safe enough, and provide a high dissolution contrast after development. That is, the first solvent provides a high gamma value (gradient of contrast curve) after development and causes less film slimming of the exposed region. Of the first solvents, methyl benzoate, phenyl acetate, methyl phenylacetate, and benzyl acetate are most preferred because of the highest contrast achievable in the pattern forming process.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-t-amyl ether, and di-n-hexyl ether. Suitable aromatic solvents include toluene, xylene, ethylbenzene, isopropylbenzene, t-butylbenzene, and mesitylene. The solvents may be used alone or in admixture.

Where a hole pattern is formed by negative tone development, exposure by double dipole illuminations of X- and Y-direction line patterns provides the highest contrast light. The contrast may be further increased by combining dipole illumination with s-polarized illumination.

FIG. 2 is an optical image of X-direction lines having a pitch of 90 nm and a line size of 45 nm printed under conditions: ArF excimer laser of wavelength 193 nm, NA 1.3 lens, dipole illumination, 6% halftone phase shift mask, and s-polarization.

Figure 3:
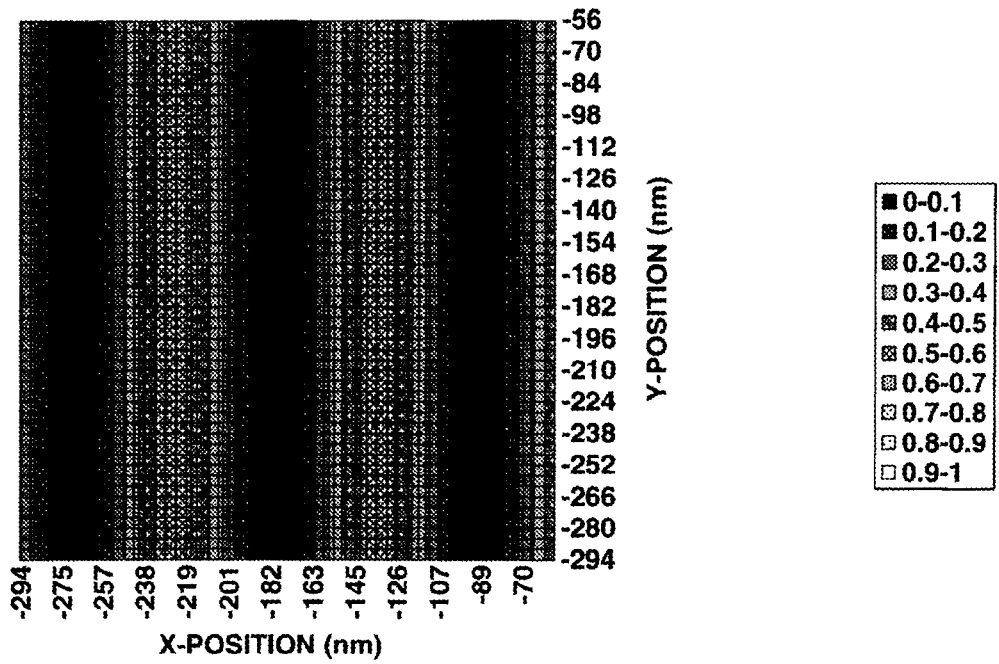
FIG. 3 is an optical image of Y-direction lines like FIG. 2.

FIG. 3 is an optical image of Y-direction lines having a pitch of 90 nm and a line size of 45 nm printed under conditions: ArF excimer laser of wavelength 193 nm, NA 1.3 lens, dipole illumination, 6% halftone phase shift mask, and s-polarization. A black area is a light shielded area while a white area is a high light intensity area. A definite contrast difference is recognized between white and black, indicating the presence of a fully light shielded area.

Figure 4:
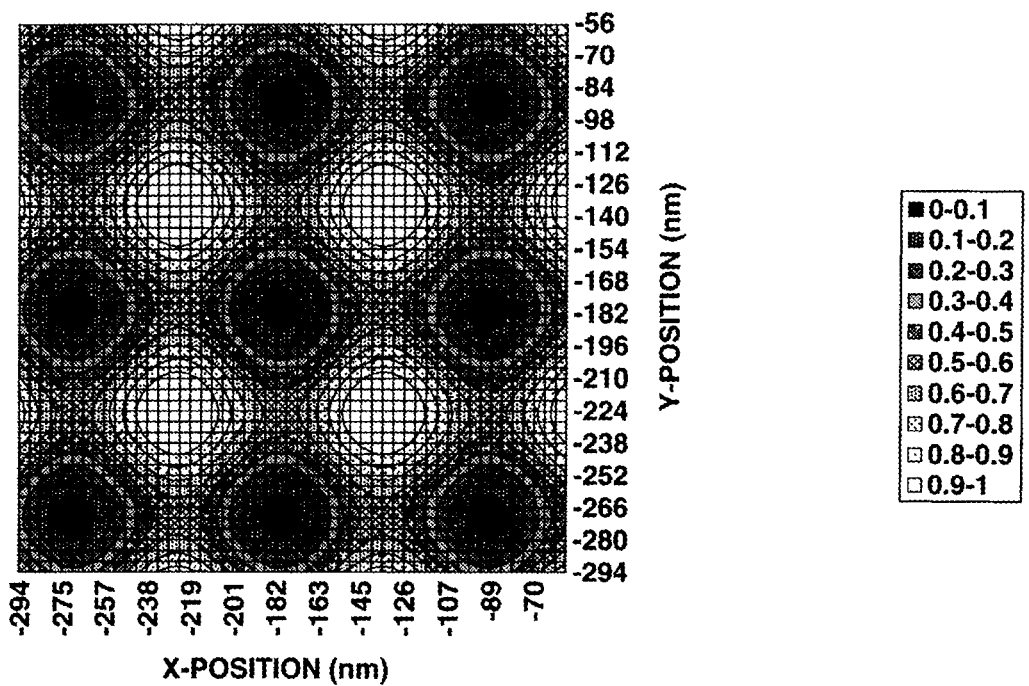
FIG. 4 shows a contrast image obtained by overlaying the optical image of X-direction lines in FIG. 2 with the optical image of Y-direction lines in FIG. 3.

FIG. 4 shows a contrast image obtained by overlaying the optical image of X-direction lines in FIG. 2 with that of Y-direction lines in FIG. 3. Against the expectation that a combination of X and Y lines may form a lattice-like image, weak light black areas draw circular shapes. As the pattern (circle) size becomes larger, the circular shape changes to a rhombic shape to merge with adjacent ones. As the circle size becomes smaller, circularity is improved, which is evidenced by the presence of a fully light shielded small circle.

Exposure by double dipole illuminations of X- and Y-direction lines combined with polarized illumination presents a method of forming light of the highest contrast. This method, however, has the drawback that the throughput is substantially reduced by double exposures and mask exchange therebetween. It is then proposed in Non-Patent Document 1 to carry out two exposures by dipole illuminations in X and Y directions using a mask having a lattice-like pattern. The throughput is somewhat improved with this method that dispenses with a mask exchange and involves only two consecutive exposures. However, there remain problems that two exposures using an expensive immersion scanner lead to a reduction of throughput and a cost increase, and the position of holes is shifted from the desired position due to a misalignment between two exposures.

When a lattice-like pattern-bearing mask is used and X-Y polarized illumination is combined with cross-pole illumination, a hole pattern can be formed via a single exposure. A substantial improvement in throughput is expectable. The problem of misalignment between two exposures is avoided.

Using such a mask and illumination, a hole pattern of the order of 40 nm can be formed at a practically acceptable cost.

Figure 5:
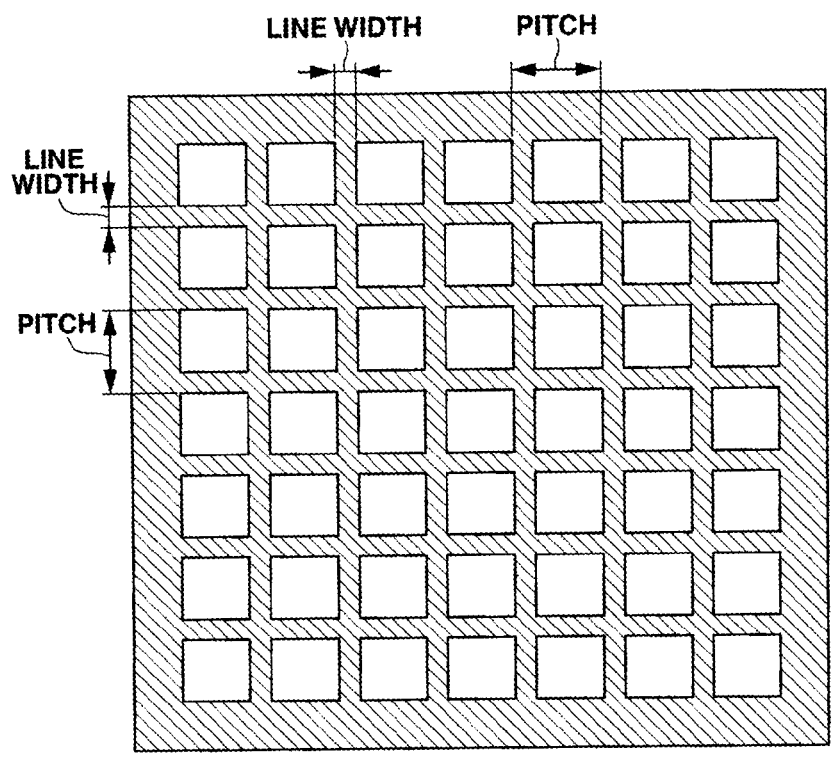
FIG. 5 illustrates a mask bearing a lattice-like pattern.
Figure 6:
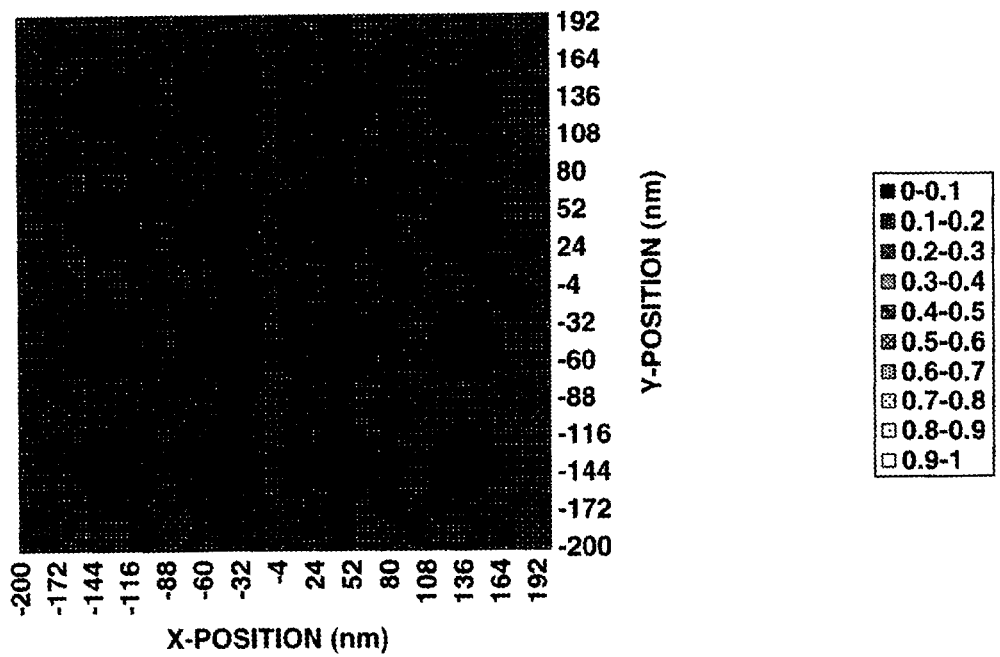
FIG. 6 is an optical image of a lattice-like line pattern having a pitch of 90 nm and a line width of 30 nm under conditions: NA 1.3 lens, cross-pole illumination, 6% halftone phase shift mask, and azimuthally polarized illumination.

On use of a mask having a lattice-like pattern as shown in FIG. 5 where light is fully shielded at intersections between gratings, black spots having a very high degree of light shielding appear as shown in FIG. 6. FIG. 6 is an optical image of a lattice-like line pattern having a pitch of 90 nm and a line width of 30 nm printed under conditions: NA 1.3 lens, cross-pole illumination, 6% halftone phase shift mask, and azimuthally polarized illumination. A fine hole pattern may be formed by performing exposure through a mask having such a pattern and organic solvent development entailing positive/negative reversal.

Figure 7:
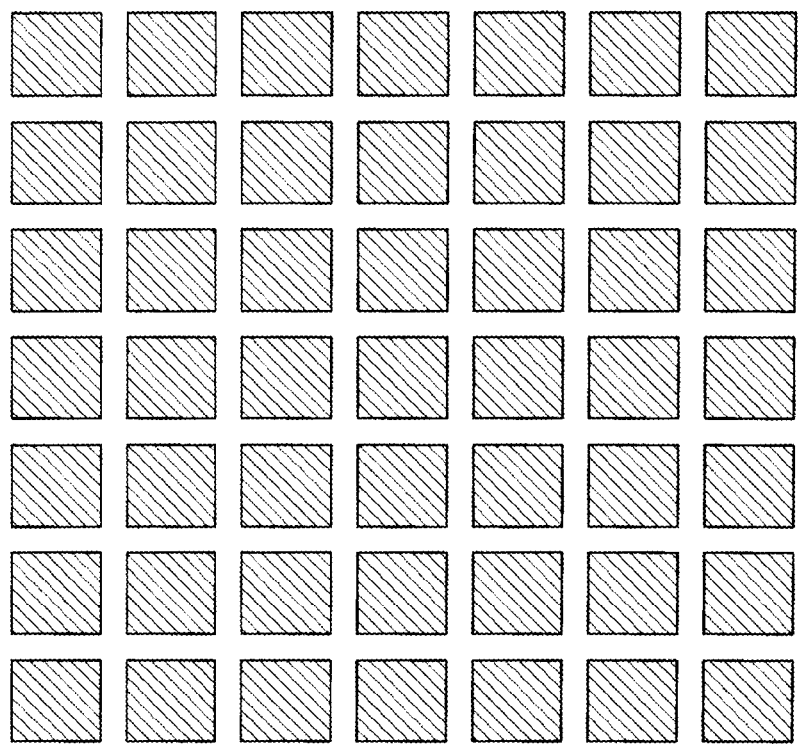
FIG. 7 illustrates a mask bearing a dot pattern of square dots having a pitch of 90 nm and a side width of 60 nm under conditions: NA 1.3 lens, cross-pole illumination, 6% halftone phase shift mask, and azimuthally polarized illumination.
Figure 8:
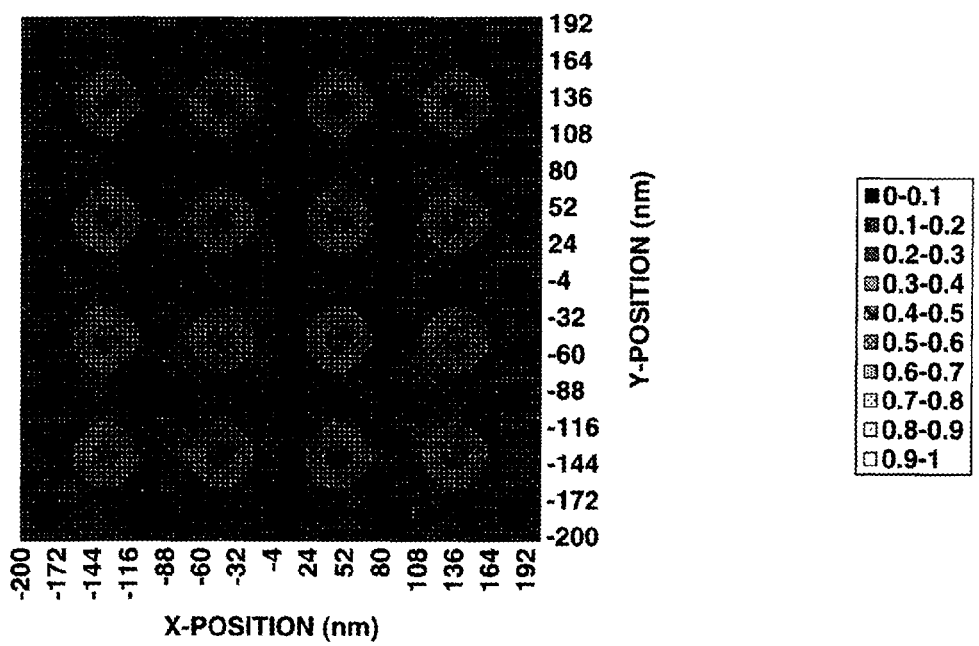
FIG. 8 is an optical image resulting from the mask of FIG. 7, showing its contrast.

On use of a mask bearing a dot pattern of square dots having a pitch of 90 nm and a side width of 60 nm as shown in FIG. 7, under conditions: NA 1.3 lens, cross-pole illumination, 6% halftone phase shift mask, and azimuthally polarized illumination, an optical image is obtained as shown in FIG. 8 that depicts the contrast thereof. The circle of fully light shielded spot in FIG. 8 has a smaller area than in FIG. 6, which indicates a low contrast as compared with the lattice-like pattern mask.

It is difficult to form a fine hole pattern that holes are randomly arrayed at varying pitch and position. The super-resolution technology using off-axis illumination (such as dipole or cross-pole illumination) in combination with a phase shift mask and polarization is successful in improving the contrast of dense patterns, but not so the contrast of isolated patterns.

When the super-resolution technology is applied to repeating dense patterns, the pattern density bias between dense and isolated patterns, known as proximity bias, becomes a problem. As the super-resolution technology used becomes stronger, the resolution of a dense pattern is more improved, but the resolution of an isolated pattern remains unchanged. Then the proximity bias is exaggerated. In particular, an increase of proximity bias in a hole pattern resulting from further miniaturization poses a serious problem. One common approach taken to suppress the proximity bias is by biasing the size of a mask pattern. Since the proximity bias varies with properties of a photoresist composition, specifically dissolution contrast and acid diffusion, the proximity bias of a mask varies with the type of photoresist composition. For a particular type of photoresist composition, a mask having a different proximity bias must be used. This adds to the burden of mask manufacturing. Then the pack and unpack (PAU) method is proposed in Proc. SPIE Vol. 5753, p 171 (2005), which involves strong super-resolution illumination of a first positive resist to resolve a dense hole pattern, coating the first positive resist pattern with a negative resist film material in alcohol solvent which does not dissolve the first positive resist pattern, exposure and development of an unnecessary hole portion to close the corresponding holes, thereby forming both a dense pattern and an isolated pattern. One problem of the PAU method is misalignment between first and second exposures, as the authors point out in the report. The hole pattern which is not closed by the second development experiences two developments and thus undergoes a size change, which is another problem.

Figure 9:
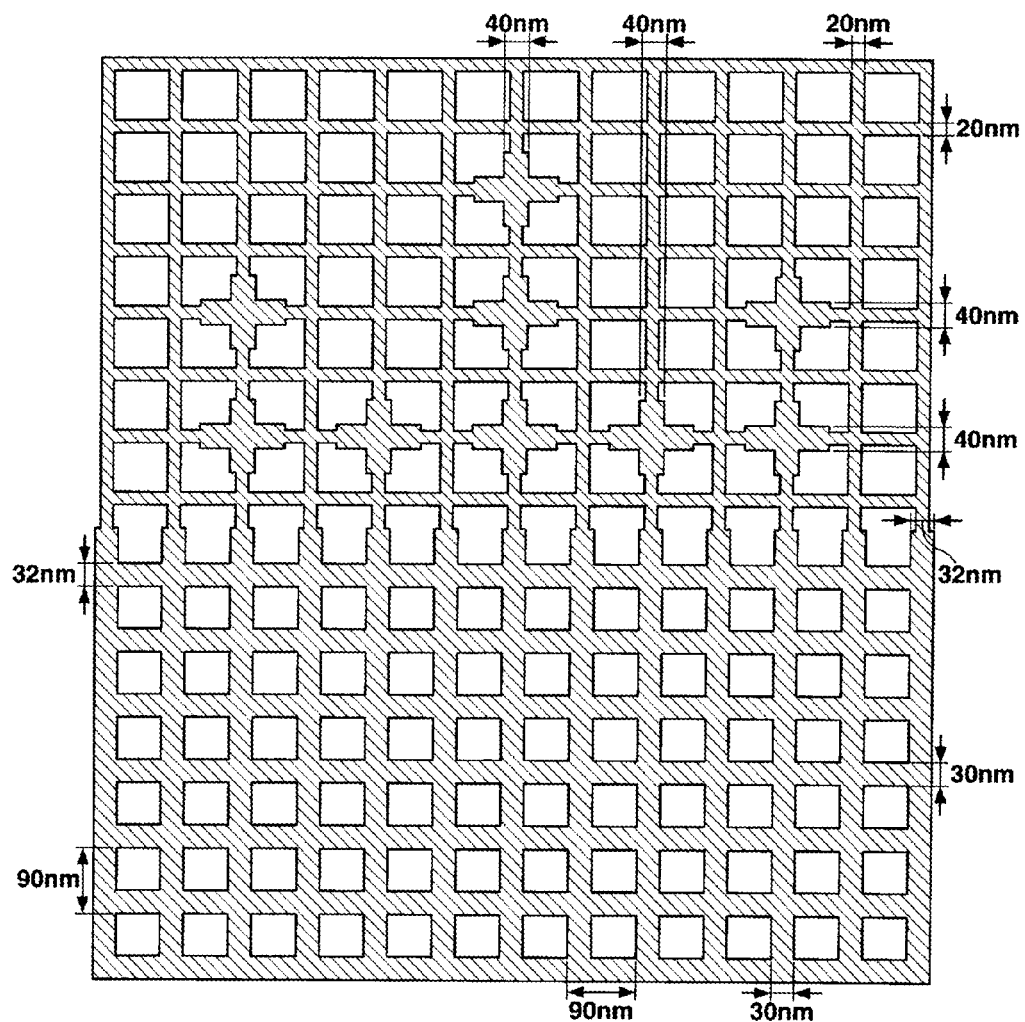
FIG. 9 illustrates a mask bearing a lattice-like pattern having a pitch of 90 nm and a line width of 20 nm on which thick crisscross or intersecting line segments are disposed where dots are to be formed.
Figure 10:
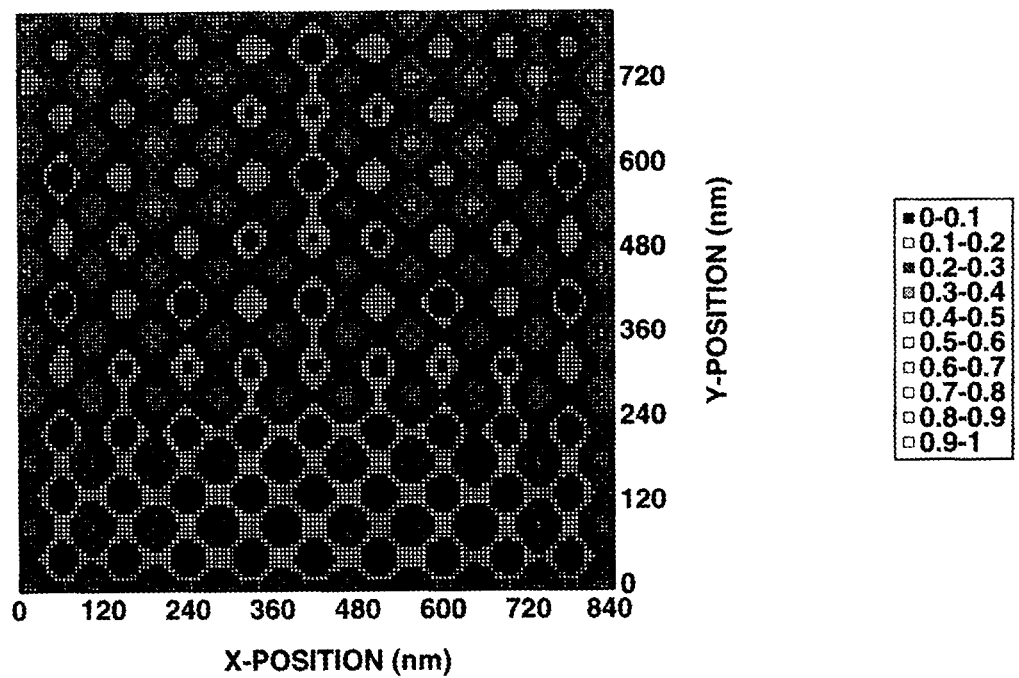
FIG. 10 is an optical image resulting from the mask of FIG. 9, showing its contrast.

To form a random pitch hole pattern by organic solvent development entailing positive/negative reversal, a mask is used in which a lattice-like pattern is arrayed over the entire surface and the width of gratings is thickened only where holes are to be formed. As shown in FIG. 9, on a lattice-like pattern having a pitch of 90 nm and a line width of 20 nm, thick crisscross or intersecting line segments are disposed where dots are to be formed. A black area corresponds to the halftone shifter portion. Line segments with a width of 30 nm are disposed in the dense pattern portion whereas thicker line segments (width 40 nm in FIG. 9) are disposed in more isolated pattern portions. Since the isolated pattern provides light with a lower intensity than the dense pattern, thicker line segments are used. Since the peripheral area of the dense pattern provides light with a relatively low intensity, line segments having a width of 32 nm are assigned to the peripheral area which width is slightly greater than that in the internal area of the dense pattern. FIG. 10 shows an optical image from the mask of FIG. 9, indicating the contrast thereof. Black or light shielded areas are where holes are formed via positive/negative reversal. Black spots are found at positions other than where holes are formed, but few are transferred in practice because they are of small size. Optimization such as reduction of the width of grating lines corresponding to unnecessary holes can inhibit transfer of unnecessary holes.

Figure 11:
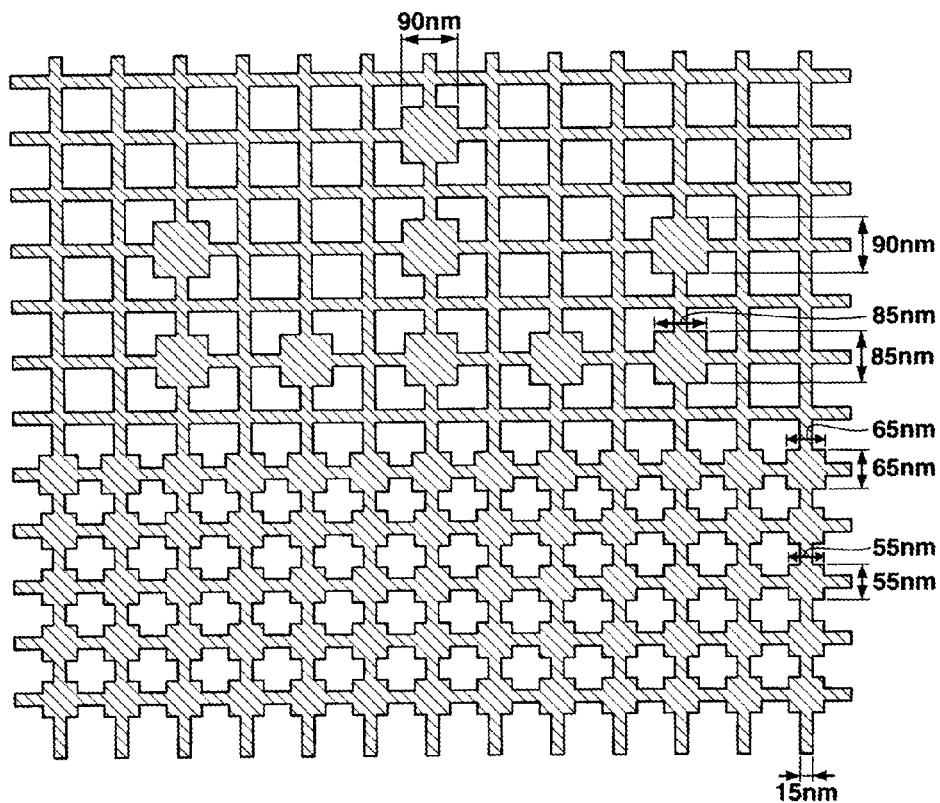
FIG. 11 illustrates a mask bearing a lattice-like pattern having a pitch of 90 nm and a line width of 15 nm on which thick dots are disposed where dots are to be formed.

Also useful is a mask in which a lattice-like pattern is arrayed over the entire surface and thick dots are disposed only where holes are to be formed. As shown in FIG. 11, on a lattice-like pattern having a pitch of 90 nm and a line width of 15 nm, thick dots are disposed where dots are to be formed. A black area corresponds to the halftone shifter portion. Square dots having one side with a size of 55 nm are disposed in the dense pattern portion whereas larger square dots (side size 90 nm in FIG. 11) are disposed in more isolated pattern portions. Although square dots are shown in the figure, the dots may have any shape including rectangular, rhombic, pentagonal, hexagonal, octagonal, and polygonal shapes and even circular shape.

Figure 12:
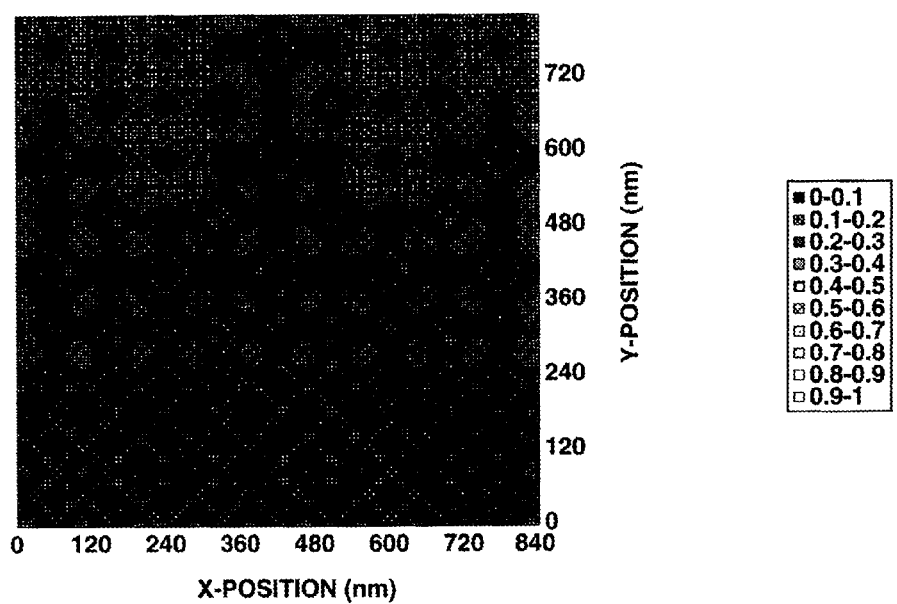
FIG. 12 is an optical image resulting from the mask of FIG. 11, showing its contrast.

FIG. 12 shows an optical image from the mask of FIG. 11, indicating the contrast thereof. The presence of black or light shielded spots substantially equivalent to those of FIG. 10 indicates that holes are formed via positive/negative reversal.

Figure 13:
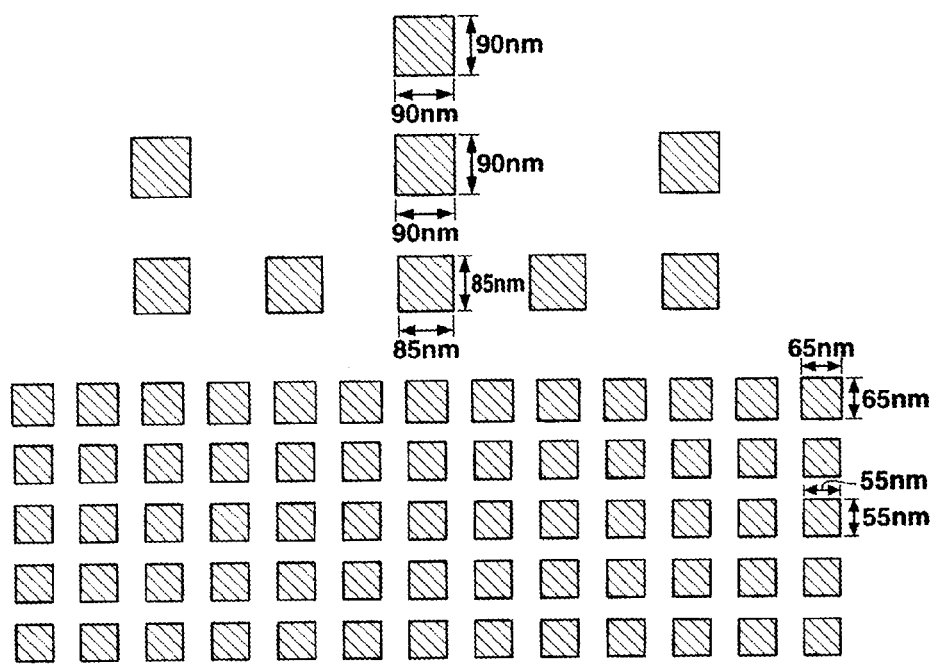
FIG. 13 illustrates a mask without a lattice-like pattern.
Figure 14:
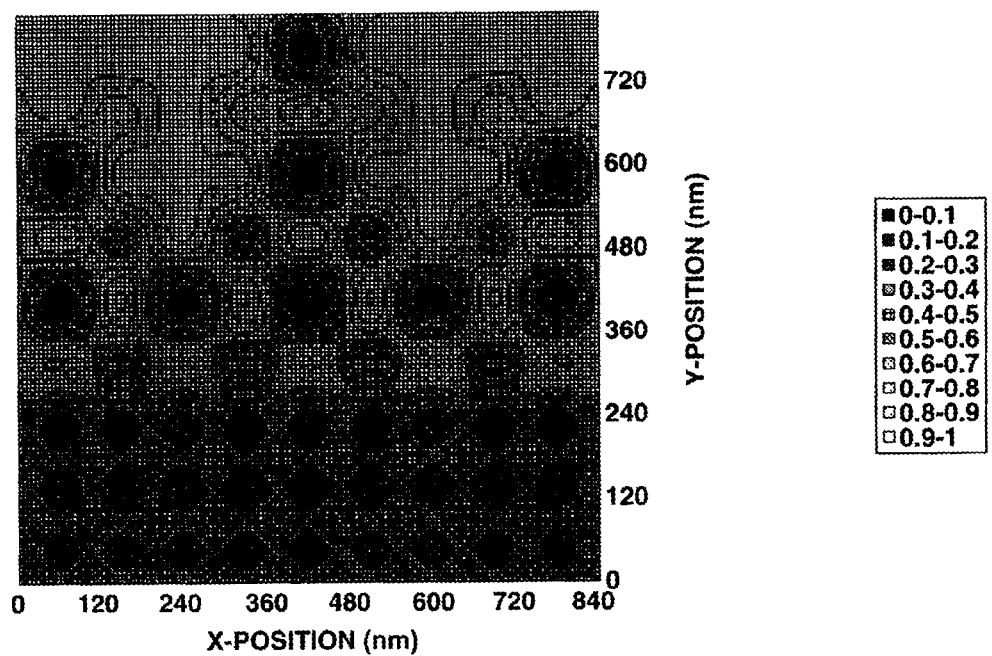
FIG. 14 is an optical image resulting from the mask of FIG. 13, showing its contrast.

On use of a mask having no lattice-like pattern arrayed as shown in FIG. 13, black or light shielded spots do not appear as shown in FIG. 14. In this case, holes are difficult to form, or even if holes are formed, a variation of mask size is largely reflected by a variation of hole size because the optical image has a low contrast.

EXAMPLE

Examples of the invention are given below by way of illustration and not by way of limitation. The abbreviation "pbw" is parts by weight. For all polymers, Mw and Mn are determined by GPC versus polystyrene standards. For pattern profile observation, a top-down scanning electron microscope (TDSEM) S-9380 (Hitachi Hitechnologies, Ltd.) was used.

Synthesis Example

Polymers for use in resist compositions were prepared by combining monomers, effecting copolymerization reaction in tetrahydrofuran medium, precipitating in methanol, repeatedly washing with hexane, isolation, and drying. The resulting polymers (Resist Polymers 1 to 16 and Comparative Resist Polymers 1 and 2) had the composition shown below. The composition of the polymer was analyzed by $^1$H-NMR, and the Mw and Mw/Mn determined by GPC.

Resist Polymer 1
Mw=8,900, Mw/Mn=1.79
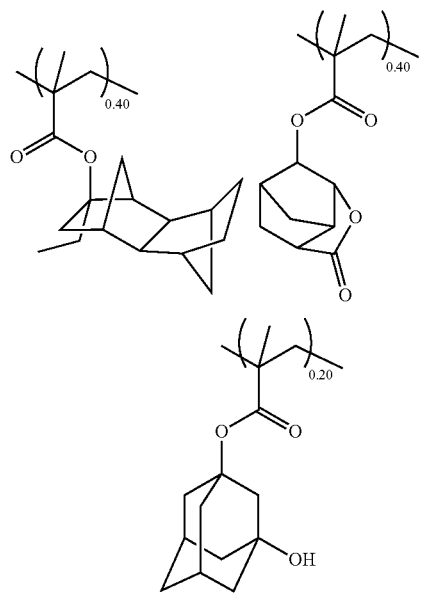
Resist Polymer 2
Mw=8,300, Mw/Mn=1.75
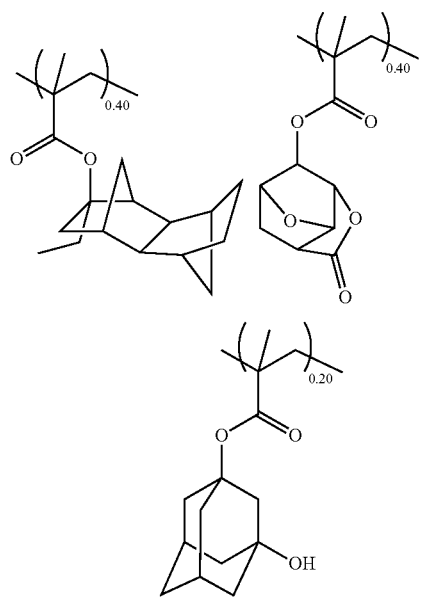
Resist Polymer 3
Mw=7,500, Mw/Mn=1.86
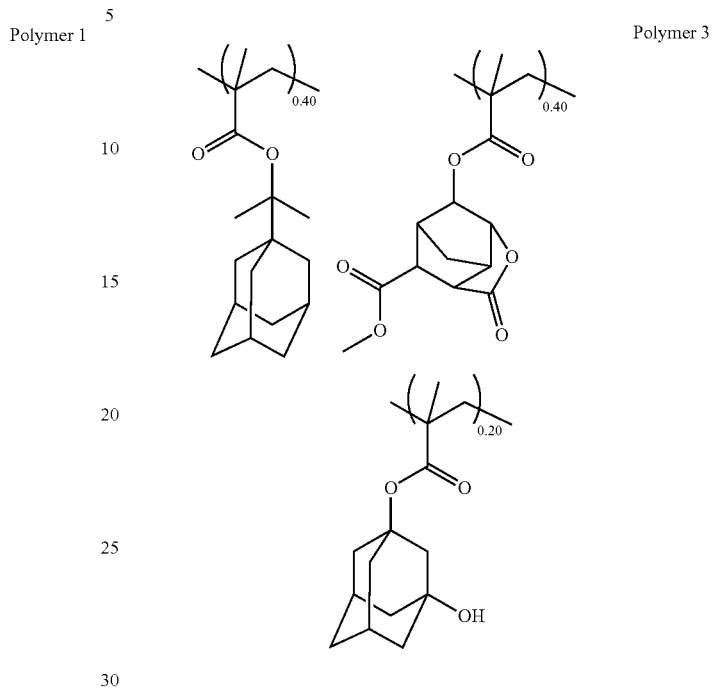
Resist Polymer 4
Mw=8,300, Mw/Mn=1.80
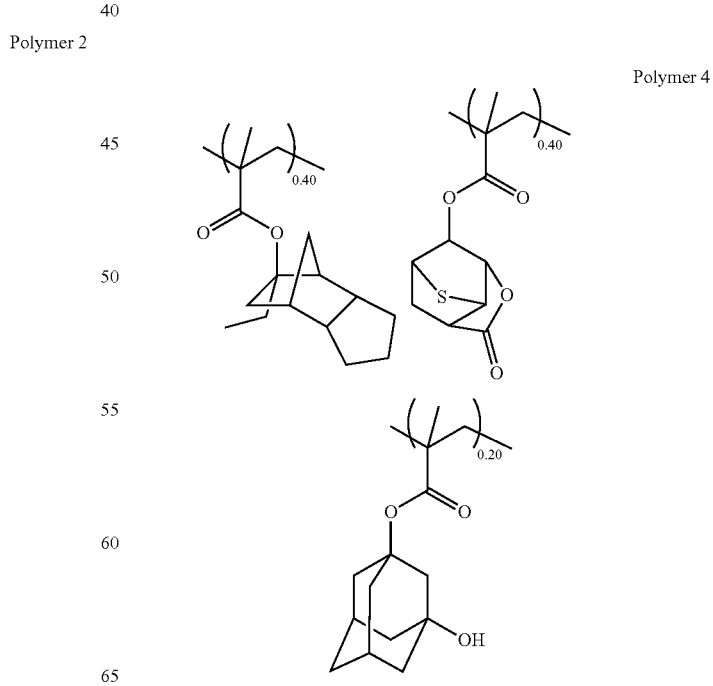

Resist Polymer 5
Mw=8,300, Mw/Mn=1.77
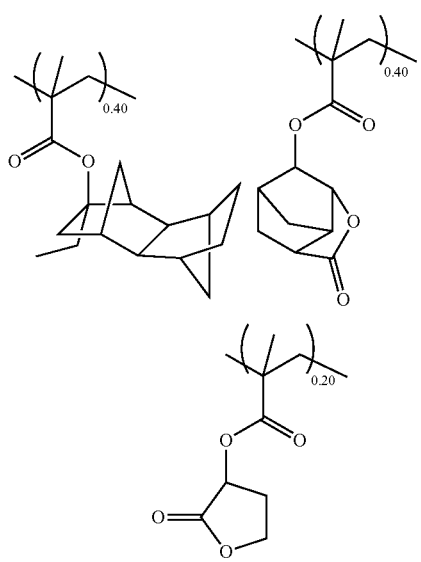
Polymer 5
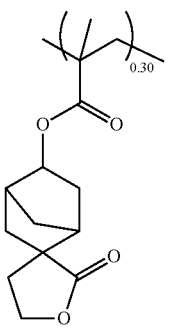
Resist Polymer 8
Mw=6,500, Mw/Mn=1.79
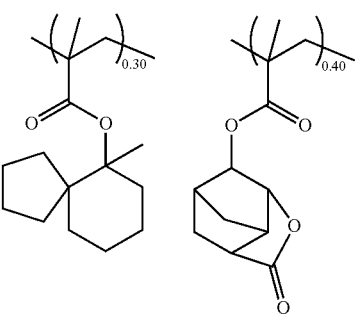
Polymer 8
Resist Polymer 6
Mw=7,500, Mw/Mn=1.79
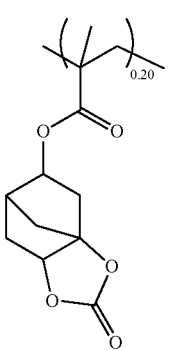
Polymer 6
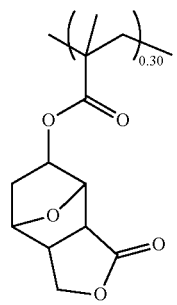
Resist Polymer 7
Mw=8,730, Mw/Mn=1.77
Resist Polymer 9
Mw=9,100, Mw/Mn=1.95
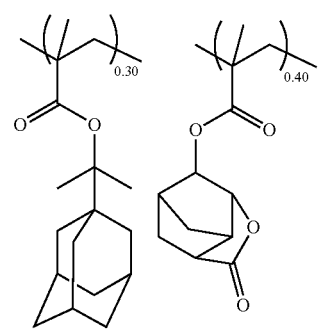
Polymer 7
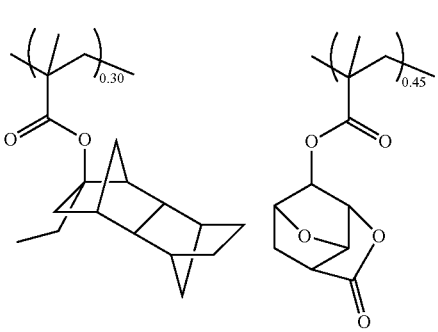
Polymer 9

-continued
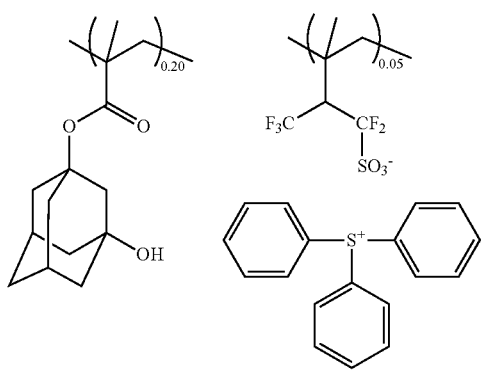
Resist Polymer 10
Mw=8,600, Mw/Mn=1.88
Polymer 10
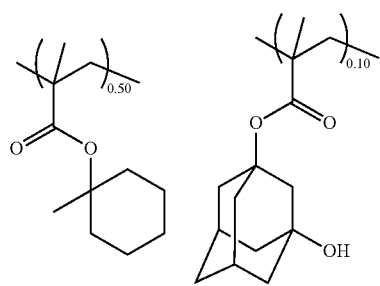
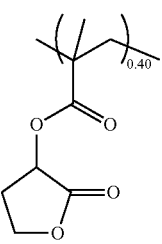
Resist Polymer 11
Mw=8,900, Mw/Mn=1.93
Polymer 11
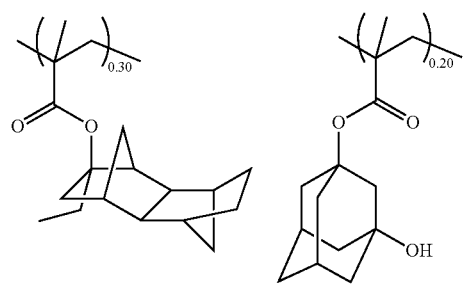
-continued
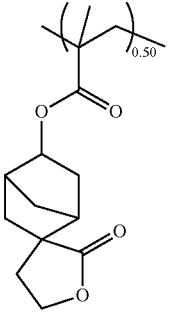
Resist Polymer 12
Mw=8,300, Mw/Mn=1.77
Polymer 12
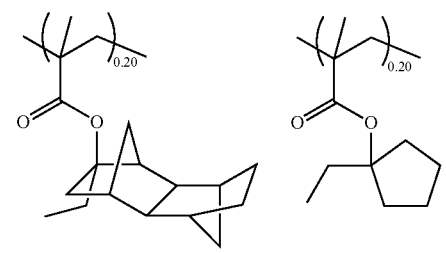
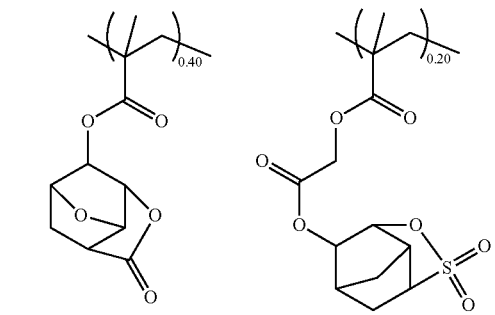
Resist Polymer 13
Mw=8,500, Mw/Mn=1.75
Polymer 13
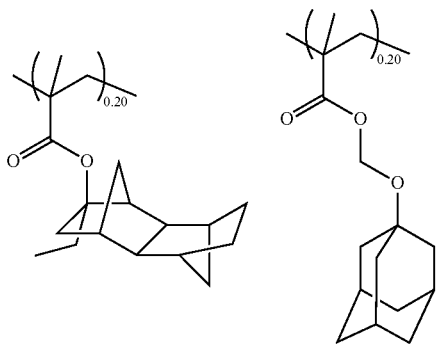

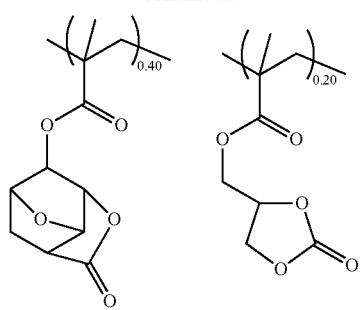
Resist Polymer 14
Mw=8,800, Mw/Mn=1.78
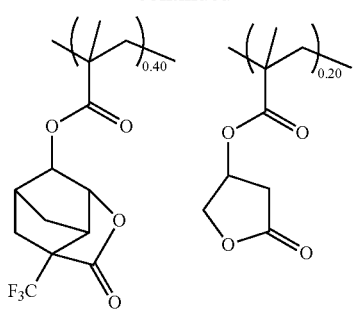
Resist Polymer 16
Mw=8,300, Mw/Mn=1.69
Polymer 14
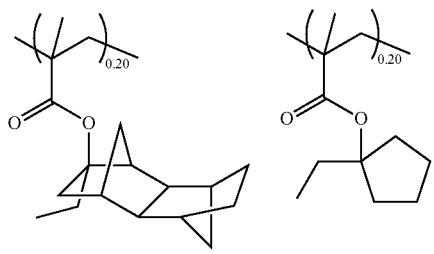
Polymer 16
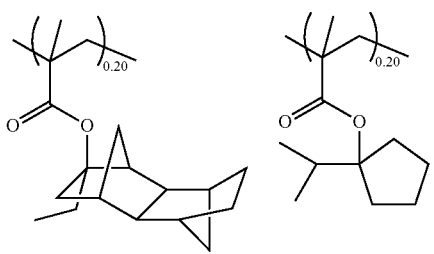
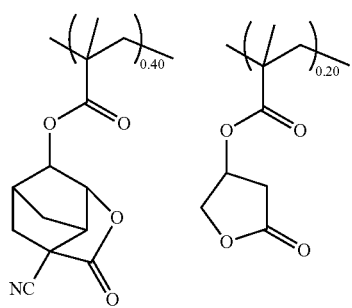
Resist Polymer 15
Mw=8,800, Mw/Mn=1.79
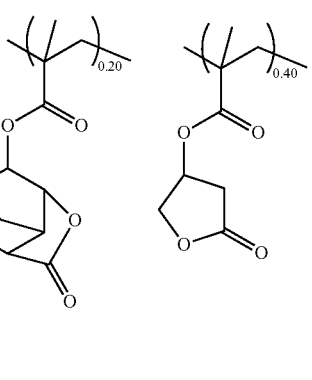
Comparative Resist Polymer 1
Mw=8,300, Mw/Mn=1.97
Comparative Polymer 1
Polymer 15
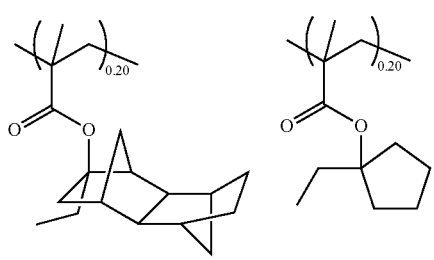
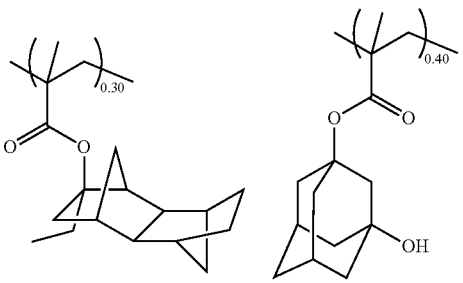

-continued

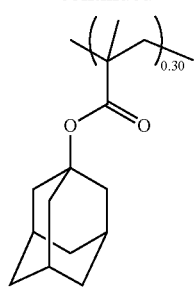

Comparative Resist Polymer 2
Mw=8,900, Mw/Mn=1.99

Comparative Polymer 2

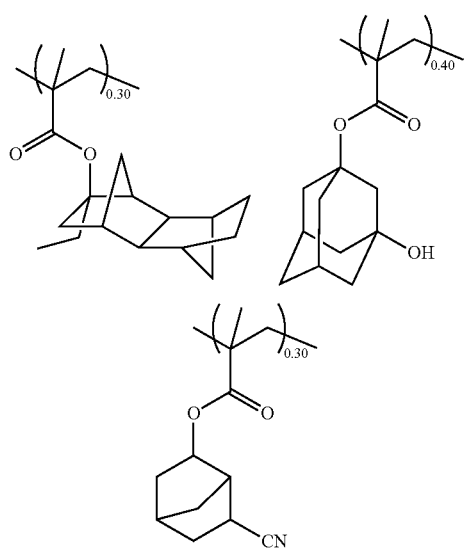

Preparation of Positive Resist Composition

A resist solution was prepared by dissolving polymers (Resist Polymer) and components in solvents in accordance with the formulation of Table 1. The solution contained 100 ppm of fluorochemical surfactant FC-4430 by 3M-Sumitomo Co., Ltd. The solution was filtered through a Teflon® filter with a pore size of 0.2 μm. The components in Table 1 are identified below.

Acid generators: PAG1 and PAG2 of the following structural formulae

PAG 1

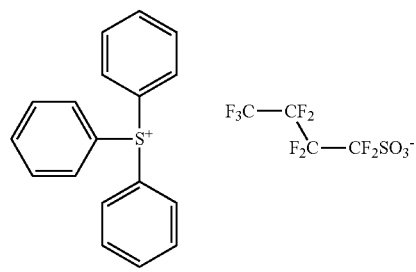

-continued

PAG 2

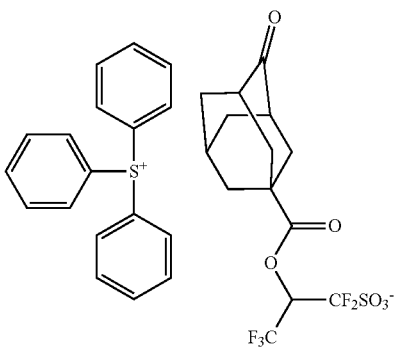

Water-repellent Polymer 1
Mw=9,100, Mw/Mn=1.83

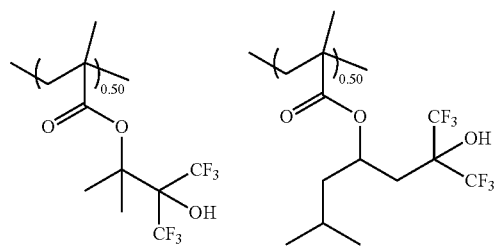

Water-repellent Polymer 2
Mw=7,300, Mw/Mn=1.54

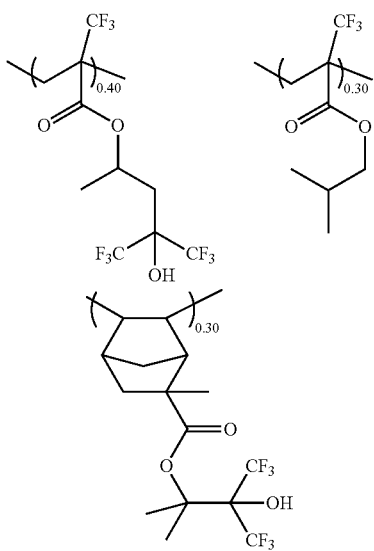

Basic compounds: Quenchers 1 to 5 of the following structural formulae

Quencher 1

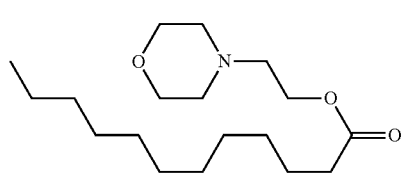

-continued

Quencher 2
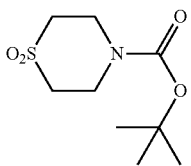

Quencher 3
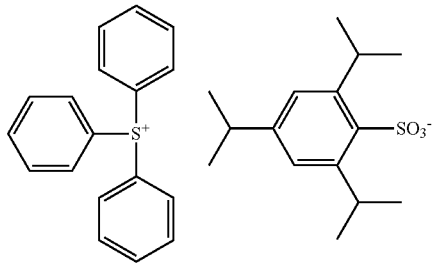

Quencher 4
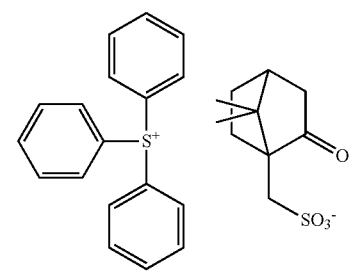

Quencher 5
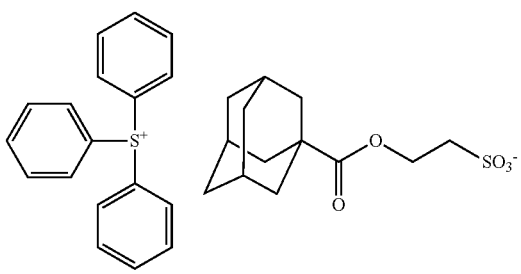

Organic Solvent:

PGMEA (propylene glycol monomethyl ether acetate)

CyH (cyclohexanone)

ArF Lithography Patterning Test 1

A resist solution having the formulation of Table 1 was spin coated on a substrate (silicon wafer) having an antireflective coating (Nissan Chemical Industry Co., Ltd.) of 80 nm thick, then baked on a hot plate at 100° C. for 60 seconds to form a resist film of 160 nm thick.

Using an ArF excimer laser scanner NSR-305B (Nikon Corp., NA 0.68, σ 0.73), the resist film was open-frame exposed in a dose which varied stepwise by 0.2 mJ/cm². The exposed resist film was baked (PEB) at 110° C. for 60 seconds and puddle developed for 60 seconds with a developer (organic solvent) as shown in Table 2. The wafer was rinsed at 500 rpm with a rinse liquid (organic solvent) as shown in Table 2, spin dried at 2,000 rpm, and baked at 100° C. for 60 seconds to evaporate off the rinse liquid, completing negative development.

Figure 15:
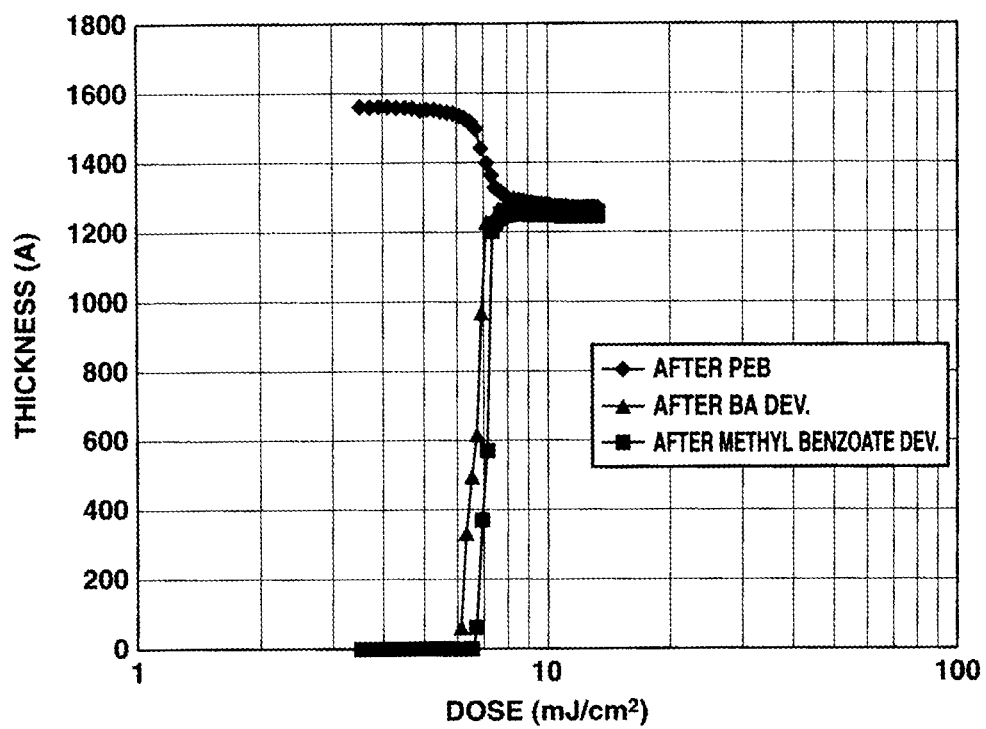
FIG. 15 is a diagram showing film thickness versus exposure dose in Example 1-1 and Comparative Example 1-1.

The film thickness after PEB and the film thickness after organic solvent development were measured. A contrast curve was determined by plotting the film thickness versus the exposure dose, with the results shown in FIG. 15. A gradient γ of the contrast curve and a difference between the film thicknesses in exposed region after PEB and after development were determined, with the results reported in Table 2.

TABLE 1

| | Polymer (pbw) | Acid generator (pbw) | Basic compound (pbw) | Organic solvent (pbw) |
|---|---|---|---|---|
| Resist 1-1 | Polymer 1 (100) | PAG 1 (6.5) | Quencher 1 (1.50) | PGMEA (800) CyH (400) |
| Comparative Resist 1-1 | Comparative Polymer 1 (100) | PAG 1 (6.5) | Quencher 1 (1.50) | PGMEA (800) CyH (400) |
| Comparative Resist 1-2 | Comparative Polymer 2 (100) | PAG 1 (6.5) | Quencher 1 (1.50) | PGMEA (800) CyH (400) |

TABLE 2

| | | | Developer | Rinse liquid | Film slimming in exposed region by development (nm) | γ |
|---|---|---|---|---|---|---|
| Example | 1-1 | Resist 1-1 | methyl benzoate | 4-methyl-2-pentanol | 1.0 | 20.5 |
| | 1-2 | Resist 1-1 | methyl benzoate/ butyl acetate 50/50 | 4-methyl-2-pentanol | 1.3 | 16.4 |
| | 1-3 | Resist 1-1 | methyl benzoate/ 2-heptanone 60/40 | 4-methyl-2-pentanol | 1.0 | 21.4 |
| | 1-4 | Resist 1-1 | phenyl acetate | 4-methyl-2-pentanol | 1.0 | 20.5 |
| | 1-5 | Resist 1-1 | benzyl acetate | 4-methyl-2-pentanol | 0.8 | 22.5 |
| | 1-6 | Resist 1-1 | methyl phenylacetate | 4-methyl-2-pentanol | 0.8 | 23.5 |
| Comparative Example | 1-1 | Resist 1-1 | butyl acetate | 4-methyl-2-pentanol | 1.8 | 12.6 |
| | 1-2 | Resist 1-1 | 3-heptanone | 4-methyl-2-pentanol | 1.0 | partially undissolved in unexposed region |
| | 1-3 | Resist 1-1 | 2-hexanone | 4-methyl-2-pentanol | 10 | 7.3 |
| | 1-4 | Resist 1-1 | 2-octanone | 4-methyl-2-pentanol | 1.0 | partially undissolved in unexposed region |

TABLE 2-continued

| | | Developer | Rinse liquid | Film slimming in exposed region by development (nm) | γ |
|---|---|---|---|---|---|
| 1-5 | Resist 1-1 | diisobutyl ketone | 4-methyl-2-pentanol | 1.0 | partially undissolved in unexposed region |
| 1-6 | Resist 1-1 | methyl ethyl ketone | 4-methyl-2-pentanol | 160 | 0 |
| 1-7 | Resist 1-1 | methyl isobutyl ketone | 4-methyl-2-pentanol | 3.8 | 6.6 |
| 1-8 | Resist 1-1 | cyclohexanone | 4-methyl-2-pentanol | 160 | 0 |
| 1-9 | Resist 1-1 | methylcyclohexanone | 4-methyl-2-pentanol | 160 | 0 |
| 1-10 | Resist 1-1 | butyl formate | 4-methyl-2-pentanol | 52 | 5.3 |
| 1-11 | Resist 1-1 | ethyl lactate | 4-methyl-2-pentanol | 160 | 0 |
| 1-12 | Resist 1-1 | butyl lactate | 4-methyl-2-pentanol | 30 | partially undissolved in unexposed region |
| 1-13 | Resist 1-1 | amyl acetate | 4-methyl-2-pentanol | 2.1 | partially undissolved in unexposed region |
| 1-14 | Resist 1-1 | dipropyl ether | 4-methyl-2-pentanol | 1.0 | undissolved in unexposed region |
| 1-15 | Resist 1-1 | 1-hexanol | 4-methyl-2-pentanol | 1.0 | undissolved in unexposed region |
| 1-16 | Comparative Resist 1-1 | methyl benzoate | 4-methyl-2-pentanol | 1.2 | undissolved in unexposed region |
| 1-17 | Comparative Resist 1-2 | methyl benzoate | 4-methyl-2-pentanol | 2.2 | 8.6 |

ArF Lithography Patterning Test 2

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, a resist solution prepared in accordance with the formulation shown in Table 3 was spin coated, and baked on a hot plate at 100° C. for 60 seconds to form a resist film of 100 nm thick.

Figure 16:
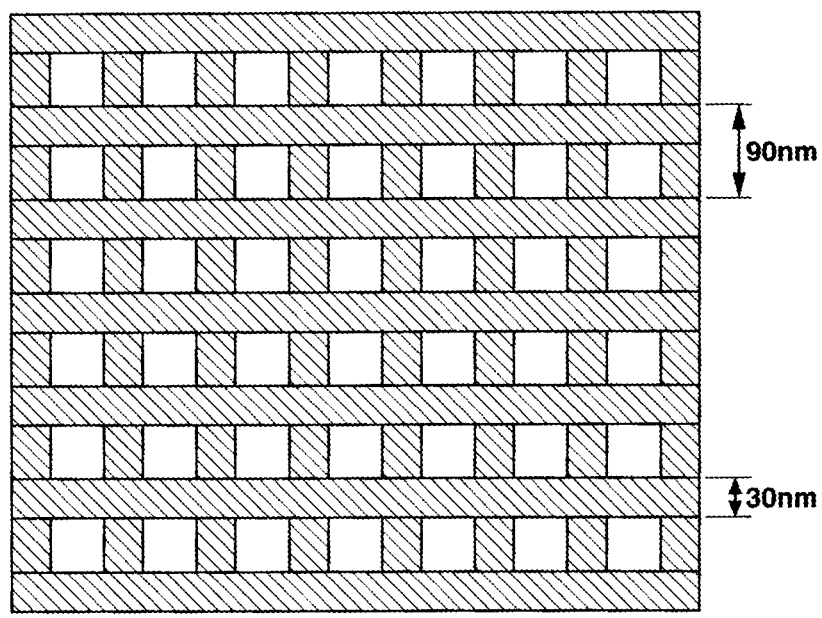
FIG. 16 illustrates a lattice-like mask used in ArF lithography patterning test 2.

Using an ArF excimer laser immersion lithography scanner NSR-610C (Nikon Corp., NA 1.30, σ 0.98/0.78, cross-pole opening 20 deg., azimuthally polarized illumination), exposure was performed in a varying dose through a 6% halftone phase shift mask having a lattice-like pattern with a pitch of 90 nm and a line width of 30 nm (on-wafer size) whose layout is shown in FIG. 16. After the exposure, the wafer was baked (PEB) at the temperature shown in Table 4 for 60 seconds and developed. Specifically, a developer as shown in Table 4 was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of 50 holes was measured, from which a size variation 36 was determined. The results are reported in Table 4.

TABLE 3

| | Polymer (pbw) | Acid generator (pbw) | Basic compound (pbw) | Additive (pbw) | Organic solvent (pbw) |
|---|---|---|---|---|---|
| Resist 2-1 | Polymer 1 (100) | PAG 2 (12.5) | Quencher 1 (1.50) | Water-repellent Polymer 1 (6) | PGMEA (2,000) CyH (500) |
| Resist 2-2 | Polymer 2 (100) | PAG 2 (12.5) | Quencher 1 (1.50) | Water-repellent Polymer 1 (6) | PGMEA (2,000) CyH (500) |
| Resist 2-3 | Polymer 3 (100) | PAG 2 (12.5) | Quencher 1 (1.50) | Water-repellent Polymer 1 (6) | PGMEA (2,000) CyH (500) |
| Resist 2-4 | Polymer 4 (100) | PAG 2 (12.5) | Quencher 1 (1.50) | Water-repellent Polymer 1 (6) | PGMEA (2,000) CyH (500) |
| Resist 2-5 | Polymer 5 (100) | PAG 2 (12.5) | Quencher 1 (1.50) | Water-repellent Polymer 1 (6) | PGMEA (2,000) CyH (500) |
| Resist 2-6 | Polymer 6 (100) | PAG 2 (12.5) | Quencher 1 (1.50) | Water-repellent Polymer 1 (6) | PGMEA (2,000) CyH (500) |
| Resist 2-7 | Polymer 7 (100) | PAG 2 (12.5) | Quencher 1 (1.50) | Water-repellent Polymer 1 (6) | PGMEA (2,000) CyH (500) |
| Resist 2-8 | Polymer 8 (100) | PAG 2 (12.5) | Quencher 1 (1.50) | Water-repellent Polymer 1 (6) | PGMEA (2,000) CyH (500) |
| Resist 2-9 | Polymer 9 (100) | — | Quencher 1 (1.50) | Water-repellent Polymer 1 (6) | PGMEA (2,000) CyH (500) |

TABLE 3-continued

|  | Polymer (pbw) | Acid generator (pbw) | Basic compound (pbw) | Additive (pbw) | Organic solvent (pbw) |
|---|---|---|---|---|---|
| Resist 2-10 | Polymer 10 (100) | PAG 2 (12.5) | Quencher 2 (1.20) | Water-repellent Polymer 2 (6) | PGMEA (2,000) CyH (500) |
| Resist 2-11 | Polymer 11 (100) | PAG 2 (12.5) | Quencher 2 (1.20) | Water-repellent Polymer 2 (6) | PGMEA (2,000) CyH (500) |
| Resist 2-12 | Polymer 1 (100) Polymer 11 (100) | PAG 2 (12.5) | Quencher 2 (1.20) | Water-repellent Polymer 2 (6) | PGMEA (2,000) CyH (500) |
| Resist 2-13 | Polymer 1 (90) Comparative Polymer 2 (10) | PAG 2 (12.5) | Quencher 2 (1.20) | Water-repellent Polymer 2 (6) | PGMEA (2,000) CyH (500) |
| Resist 2-14 | Polymer 2 (100) | PAG 2 (5.5) | Quencher 3 (5.50) | Water-repellent Polymer 1 (6) | PGMEA (2,000) CyH (500) |
| Resist 2-15 | Polymer 2 (100) | PAG 2 (5.5) | Quencher 4 (5.50) | Water-repellent Polymer 1 (6) | PGMEA (2,000) CyH (500) |
| Resist 2-16 | Polymer 9 (100) | — | Quencher 4 (5.50) | Water-repellent Polymer 1 (6) | PGMEA (2,000) CyH (500) |
| Resist 2-17 | Polymer 12 (100) | PAG 2 (4.5) | Quencher 5 (4.50) | Water-repellent Polymer 2 (6) | PGMEA (2,000) CyH (500) |
| Resist 2-18 | Polymer 13 (100) | PAG 2 (4.5) | Quencher 5 (4.50) | Water-repellent Polymer 2 (6) | PGMEA (2,000) CyH (500) |
| Resist 2-19 | Polymer 14 (100) | PAG 2 (4.5) | Quencher 5 (4.50) | Water-repellent Polymer 2 (6) | PGMEA (2,000) CyH (500) |
| Resist 2-20 | Polymer 15 (100) | PAG 2 (4.5) | Quencher 5 (4.50) | Water-repellent Polymer 2 (6) | PGMEA (2,000) CyH (500) |
| Resist 2-21 | Polymer 16 (100) | PAG 2 (4.5) | Quencher 5 (4.50) | Water-repellent Polymer 2 (6) | PGMEA (2,000) CyH (500) |
| Comparative Resist 2-1 | Comparative Polymer 1 (100) | PAG 2 (12.5) | Quencher 1 (1.50) | Water-repellent Polymer 2 (6) | PGMEA (2,000) CyH (500) |
| Comparative Resist 2-2 | Comparative Polymer 2 (100) | PAG 2 (12.5) | Quencher 1 (1.50) | Water-repellent Polymer 2 (6) | PGMEA (2,000) CyH (500) |

TABLE 4

|  |  | Resist | PEB temp. (°C.) | Developer | Dose (mJ/cm$^2$) | Hole size variation 3σ (nm) |
|---|---|---|---|---|---|---|
| Example | 2-1 | Resist 2-1 | 105 | methyl benzoate | 42 | 2.6 |
|  | 2-2 | Resist 2-2 | 100 | methyl benzoate | 44 | 2.5 |
|  | 2-3 | Resist 2-3 | 100 | methyl benzoate | 34 | 2.5 |
|  | 2-4 | Resist 2-4 | 100 | methyl benzoate | 40 | 2.4 |
|  | 2-5 | Resist 2-5 | 100 | methyl benzoate | 49 | 2.4 |
|  | 2-6 | Resist 2-6 | 100 | methyl benzoate | 38 | 2.6 |
|  | 2-7 | Resist 2-7 | 110 | methyl benzoate | 54 | 2.4 |
|  | 2-8 | Resist 2-8 | 100 | methyl benzoate | 40 | 3.0 |
|  | 2-9 | Resist 2-9 | 110 | methyl benzoate | 28 | 2.6 |
|  | 2-10 | Resist 2-10 | 100 | methyl benzoate | 36 | 2.5 |
|  | 2-11 | Resist 2-11 | 105 | methyl benzoate | 42 | 2.6 |
|  | 2-12 | Resist 2-12 | 100 | methyl benzoate | 28 | 2.6 |
|  | 2-13 | Resist 2-13 | 100 | methyl benzoate | 36 | 2.5 |
|  | 2-14 | Resist 2-2 | 100 | methyl benzoate/ ethyl lactate 90/10 | 47 | 2.0 |
|  | 2-15 | Resist 2-2 | 100 | methyl benzoate/ 2-hexanone 80/20 | 49 | 2.3 |
|  | 2-16 | Resist 2-2 | 100 | methyl benzoate/ isopropyl acetate 80/20 | 43 | 2.4 |
|  | 2-17 | Resist 2-2 | 100 | methyl benzoate/ butyl formate 80/20 | 44 | 2.4 |
|  | 2-18 | Resist 2-2 | 100 | methyl benzoate/ propyl lactate 70/30 | 46 | 2.5 |
|  | 2-19 | Resist 2-2 | 100 | methyl benzoate/ butyl acetate 50/50 | 45 | 2.0 |
|  | 2-20 | Resist 2-2 | 100 | methyl benzoate/ ethyl lactate 95/5 | 46 | 2.2 |

TABLE 4-continued

|  |  | Resist | PEB temp. (° C.) | Developer | Dose (mJ/cm²) | Hole size variation 3σ (nm) |
|---|---|---|---|---|---|---|
|  | 2-21 | Resist 2-2 | 100 | phenyl acetate | 46 | 2.7 |
|  | 2-22 | Resist 2-2 | 100 | benzyl acetate | 43 | 2.5 |
|  | 2-23 | Resist 2-2 | 100 | methyl phenylacetate | 42 | 2.6 |
|  | 2-24 | Resist 2-2 | 100 | methyl benzoate/ 2-heptanone 60/40 | 43 | 2.1 |
|  | 2-25 | Resist 2-2 | 100 | methyl benzoate/ phenyl acetate 50/50 | 45 | 2.6 |
|  | 2-26 | Resist 2-14 | 100 | methyl benzoate | 62 | 2.3 |
|  | 2-27 | Resist 2-15 | 100 | methyl benzoate | 66 | 2.2 |
|  | 2-28 | Resist 2-16 | 110 | methyl benzoate | 53 | 2.2 |
|  | 2-29 | Resist 2-1 | 105 | benzyl formate | 42 | 2.8 |
|  | 2-30 | Resist 2-1 | 105 | phenylethyl formate | 44 | 2.6 |
|  | 2-31 | Resist 2-17 | 95 | methyl benzoate | 68 | 2.2 |
|  | 2-32 | Resist 2-18 | 95 | methyl benzoate | 69 | 2.2 |
|  | 2-33 | Resist 2-19 | 95 | methyl benzoate | 69 | 2.2 |
|  | 2-34 | Resist 2-20 | 95 | methyl benzoate | 72 | 2.4 |
|  | 2-35 | Resist 2-21 | 90 | methyl benzoate | 75 | 2.6 |
|  | 2-36 | Resist 2-1 | 105 | methyl 3-phenylpropionate/ benzyl formate 50/50 | 42 | 2.8 |
| Comparative Example | 2-1 | Resist 2-1 | 100 | butyl acetate | 41 | 3.8 |
|  | 2-2 | Comparative Resist 2-1 | 110 | methyl benzoate | Holes unresolved | — |
|  | 2-3 | Comparative Resist 2-2 | 105 | methyl benzoate | 55 | 6.2 |

ArF Lithography Patterning Test 3

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition having the formulation in Table 3 (Resist 2-1, 2-2, or Comparative Resist 2-2) was spin coated, then baked on a hot plate at 100° C. for 60 seconds to form a resist film of 100 nm thick.

Figure 17:
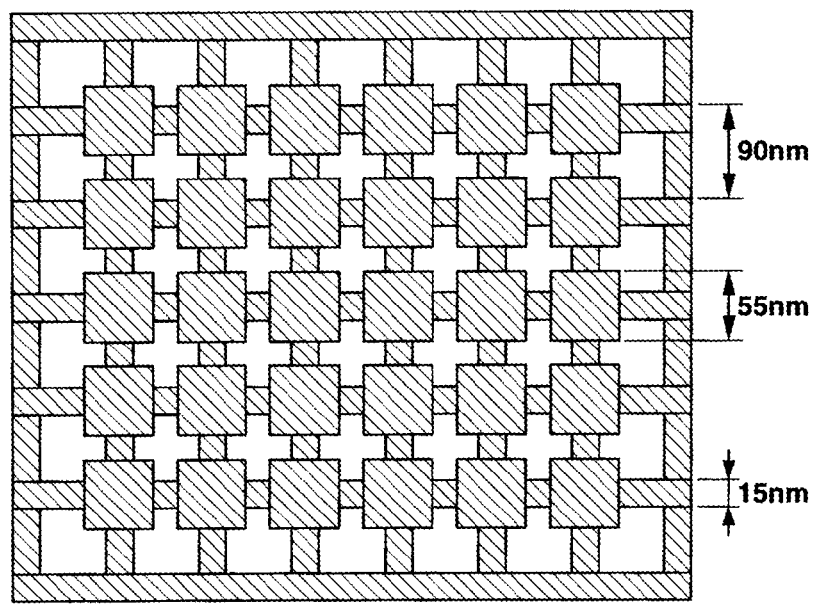
FIG. 17 illustrates a lattice-like mask pattern having dots disposed thereon, used in ArF lithography patterning test 3.

Using an ArF excimer laser immersion lithography scanner NSR-610C (Nikon Corp., NA 1.30, σ 0.98/0.78, cross-pole opening 20 deg., azimuthally polarized illumination), exposure was performed through a 6% halftone phase shift mask having a lattice-like pattern with a pitch of 90 nm and a line width of 15 nm (on-wafer size) having dots disposed at intersections, whose layout is shown in FIG. 17, while the dose and focus were varied. After the exposure, the wafer was baked (PEB) at 100° C. for 60 seconds and developed. Specifically, methyl benzoate (in Examples 3-1, 3-2 and Comparative Example 3-2) or butyl acetate (in Comparative Example 3-1) was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of holes was measured, from which a focus margin affording a size of 40 nm±5 nm was determined as DOF. The size of 50 holes within a shot of the same dose and the same focus was measured, from which a size variation 3σ was determined. The results are reported in Table 5.

TABLE 5

| Resist | PEB temp. (° C.) | Dose (mJ/cm²) | DOF (nm) | Hole size variation 3σ (nm) |
|---|---|---|---|---|
| Example 3-1 | Resist 2-1 | 100 | 46 | 120 | 2.1 |
| Example 3-2 | Resist 2-2 | 100 | 48 | 130 | 2.1 |
| Comparative Example 3-1 | Resist 2-1 | 100 | 48 | 120 | 3.3 |
| Comparative Example 3-2 | Comparative Resist 2-2 | 100 | 42 | 40 | 4.6 |

ArF Lithography Patterning Test 4

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition shown in Table 3 (Resist 2-1, 2-2, or Comparative Resist 2-2) was spin coated, then baked on a hot plate at 100° C. for 60 seconds to form a resist film of 100 nm thick.

Figure 18:
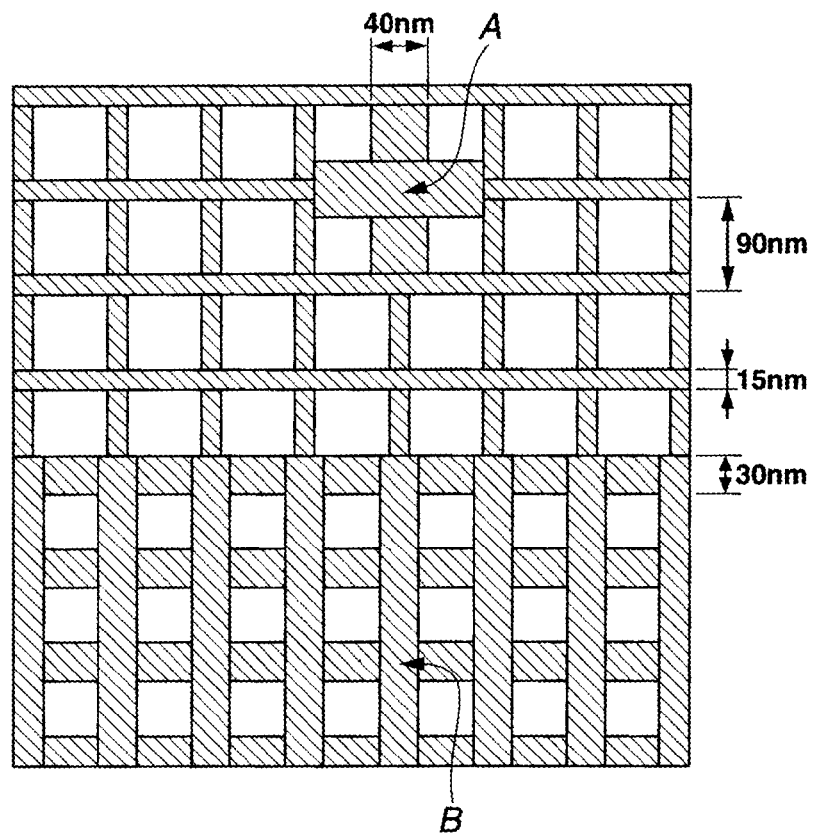
FIG. 18 illustrates a lattice-like mask pattern having thick gratings disposed thereon, used in ArF lithography patterning test 4.

Using an ArF excimer laser immersion lithography scanner NSR-610C (Nikon Corp., NA 1.30, σ 0.98/0.78, cross-pole opening 20 deg., azimuthally polarized illumination), exposure was performed through a 6% halftone phase shift mask bearing a lattice-like pattern with a pitch of 90 nm and a line width of 15 nm (on-wafer size) having thick gratings disposed on normal gratings, whose layout is shown in FIG. 18, while the dose was varied. After the exposure, the wafer was baked (PEB) at 100° C. for 60 seconds and developed. Specifically, methyl benzoate (in Examples 4-1, 4-2 and Comparative Example 4-2) or butyl acetate (in Comparative Example 4-1) was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of holes at positions A and B on the mask (FIG. 18) was measured. The results are reported in Table 6.

TABLE 6

| | Resist | PEB temp. (° C.) | Dose (mJ/cm$^2$) | Hole size at A (nm) | Hole size at B (nm) |
|---|---|---|---|---|---|
| Example 4-1 | Resist 2-1 | 100 | 45 | 40 | 43 |
| Example 4-2 | Resist 2-2 | 100 | 48 | 40 | 42 |
| Comparative Example 4-1 | Resist 2-1 | 100 | 48 | 40 | 49 |
| Comparative Example 4-2 | Comparative Resist 2-2 | 100 | 62 | 30 | 56 |

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2010-155682 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of applying a resist composition comprising a (meth)acrylate copolymer comprising both recurring units having an acid labile group-substituted carboxyl group and recurring units having a lactone ring, an acid generator, and an organic solvent onto a substrate, in a first heat treating step heat treating the composition to form a resist film, selectively exposing a region of the resist film to high-energy radiation to form an exposed region of the film and an unexposed region of the film, in a second heat treating step heat treating the resist film, and developing the exposed film with a developer consisting of 40 to less than 100% by weight of a first solvent selected from a first group consisting of methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, 2-phenylethyl acetate, and a combination of two or more of the solvents listed in the first group, and the balance of a second solvent selected from a second group consisting of 2-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, and a combination of two or more of the solvents listed in the second group, to form a pattern of negative tone wherein the exposed region of the film is not dissolved and the unexposed region of the film is dissolved.

2. The process of claim 1 wherein the step of exposing the resist film to high-energy radiation includes ArF immersion lithography of 193 nm wavelength or EUV lithography of 13.5 nm wavelength.

3. The process of claim 1 wherein the developing step is to form a trench pattern.

4. The process of claim 1 wherein the exposure step is carried out by ArF immersion lithography of 193 nm wavelength using a halftone phase shift mask bearing a lattice-like shifter pattern, whereby a pattern of holes is formed at the intersections between gratings of the lattice-like shifter pattern after the developing step.

5. The process of claim 4 wherein the halftone phase shift mask bearing a lattice-like shifter pattern has a transmittance of 3 to 15%.

6. The process of claim 4 wherein the phase shift mask used is a phase shift mask including a lattice-like first shifter having a line width equal to or less than a half pitch and a second shifter arrayed on the first shifter and consisting of lines whose on-wafer size is 2 to 30 nm thicker than the line width of the first shifter, whereby a pattern of holes is formed only where the thick shifter is arrayed.

7. The process of claim 4 wherein the phase shift mask used is a phase shift mask including a lattice-like first shifter having a line width equal to or less than a half pitch and a second shifter arrayed on the first shifter and consisting of dots whose on-wafer size is 2 to 100 nm thicker than the line width of the first shifter, whereby a pattern of holes is formed only where the thick dot pattern is arrayed.

8. The process of claim 1 wherein the developer comprises at least 60% by weight of the first solvent.

9. The process of claim 1 wherein the (meth)acrylate copolymer comprising both recurring units having an acid labile group-substituted carboxyl group and recurring units having a lactone ring is a copolymer comprising recurring units (a) and (b) as represented by the general formula (1):

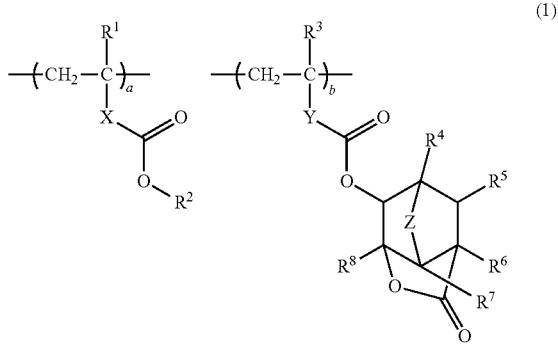

wherein $R^1$ and $R^3$ are hydrogen or methyl while they may be the same or different, $R^2$ is an acid labile group, X and Y are a single bond or —C(=O)—O—$R^9$— wherein $R^9$ is a straight, branched or cyclic $C_1$-$C_{10}$ alkylene group which may contain an ether, ester, lactone or hydroxyl group, or a naphthylene group, $R^4$, $R^6$, $R^7$, and $R^8$ are hydrogen, a straight, branched or cyclic $C_1$-$C_6$ alkyl group, trifluoromethyl group, or cyano group, $R^5$ is hydrogen, a straight, branched or cyclic $C_1$-$C_6$ alkyl group, carboxyl group, fluorine atom-substituted or unsubstituted $C_1$-$C_{12}$ alkoxycarbonyl group, or cyano group, Z is a methylene group, oxygen atom or sulfur atom, and the subscripts a and b are numbers in the range: 0<a<1.0, 0<b<1.0, and 0<a+b≤1.0.

10. The process of claim 9 wherein the copolymer comprising recurring units (a) and (b) further comprises recurring units (c) derived from monomers having adhesive groups selected from the group consisting of hydroxy, cyano, carbonyl, ester, ether groups, lactone rings other than recurring units (b), carboxyl groups, and carboxylic anhydride groups.

11. The process of claim 9 wherein the copolymer comprising recurring units (a) and (b) further comprises units selected from sulfonium salts (d1) to (d3) represented by the general formulae below:

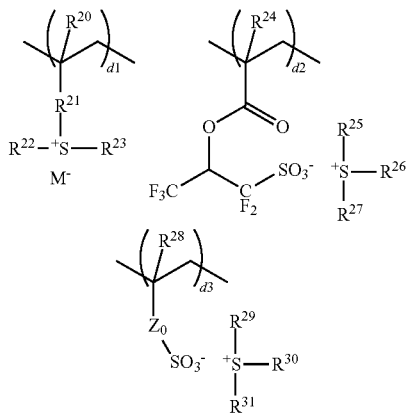

wherein $R^{20}$, $R^{24}$, and $R^{28}$ each are hydrogen or methyl, $R^{21}$ is a single bond, phenylene, —O—$R^{33}$—, or —C(=O)—Y—$R^{33}$— wherein Y is oxygen or NH, and $R^{33}$ is a straight, branched or cyclic $C_1$-$C_6$ alkylene group, alkenylene or phenylene group, which may contain a carbonyl (—CO—), ester (—COO—), ether (—O—) or hydroxyl radical, $R^{22}$, $R^{23}$, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group, $Z_0$ is a single bond, methylene, ethylene, phenylene, fluorophenylene, —O—$R^{32}$—, or —C(=O)—$Z_1$—$R^{32}$—, wherein $Z_1$ is oxygen or NH, and $R^{32}$ is a straight, branched or cyclic $C_1$-$C_6$ alkylene group, alkenylene or phenylene group, which may contain a carbonyl, ester, ether or hydroxyl radical, M⁻ is a non-nucleophilic counter ion, and the subscripts d1, d2 and d3 are numbers in the range: $0 \leq d1 < 0.2$, $0 \leq d2 < 0.2$, and $0 \leq d3 < 0.2$.

12. A pattern forming process comprising the steps of applying a resist composition comprising a (meth)acrylate copolymer comprising both recurring units having an acid labile group-substituted carboxyl group and recurring units having a lactone ring, an acid generator, and an organic solvent onto a substrate, in a first heat treating step heat treating the composition to form a resist film, selectively exposing a region of the resist film to high-energy radiation to form an exposed region of the film and an unexposed region of the film, in a second heat treating step heat treating the resist film, and developing the exposed film with a developer consisting of a solvent selected from the group consisting of methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, 2-phenylethyl acetate, and a combination of two or more of the solvents listed in the group, to form a pattern of negative tone wherein the exposed region of the film is not dissolved and the unexposed region of the film is dissolved.

* * * * *